United States Patent
O'Shaughnessy et al.

(10) Patent No.: US 11,672,091 B2
(45) Date of Patent: Jun. 6, 2023

(54) DISPLAY SCREEN STAND AND MOUNT SYSTEM

(71) Applicant: OHC IP Holdings, LLC, Eden Prairie, MN (US)

(72) Inventors: Michael L. O'Shaughnessy, Edina, MN (US); James A. Mitlyng, Eagan, MN (US); Aaron Murphy, Apple Valley, MN (US); Mike Wayman, Waconia, MN (US); Logan Oglesby, Savage, MN (US)

(73) Assignee: OHC IP Holdings, LLC, Edina, MN (US)

(*) Notice: Subject to any disclaimer, the term of this patent is extended or adjusted under 35 U.S.C. 154(b) by 0 days.

(21) Appl. No.: 17/673,406

(22) Filed: Feb. 16, 2022

(65) Prior Publication Data

US 2022/0174831 A1 Jun. 2, 2022

Related U.S. Application Data

(63) Continuation of application No. 17/028,848, filed on Sep. 22, 2020, now Pat. No. 11,272,628, which is a
(Continued)

(51) Int. Cl.
*H05K 5/02* (2006.01)
*H05K 5/00* (2006.01)

(52) U.S. Cl.
CPC ......... *H05K 5/0234* (2013.01); *H05K 5/0017* (2013.01); *H05K 5/0204* (2013.01)

(58) Field of Classification Search
CPC combination set(s) only.
See application file for complete search history.

(56) References Cited

U.S. PATENT DOCUMENTS 6,016,248 A 1/2000 Anzai et al.
6,301,101 B1 10/2001 Anzai et al.
(Continued)

FOREIGN PATENT DOCUMENTS

| CN | 104165264 | 11/2014 |
| CN | 105042291 | 11/2015 |
(Continued)

OTHER PUBLICATIONS

"Extended European Search Report," for European Patent Application No. 19887949.6 dated Jul. 8, 2022 (8 pages).
(Continued)

*Primary Examiner* — Lisa Lea-Edmonds
(74) *Attorney, Agent, or Firm* — Pauly, DeVries Smith & Deffner LLC

(57) ABSTRACT

Various embodiments provide a display screen system that includes a display screen, a first stand element, and a second stand element. The display screen can include a front display surface, a back surface, and a bottom surface. The first and second stand elements can each include a connection element disposed between a first end and a second end. The display screen stand system can be configured to be assembled in a table top configuration or a wall mount configuration. In the table top configuration, the first stand element and the second stand element are attached to the bottom of the display screen. In the wall mount configuration, the first stand element and the second stand element are configured to be coupled to the back of the display screen.

20 Claims, 51 Drawing Sheets

Related U.S. Application Data continuation of application No. 16/689,972, filed on Nov. 20, 2019, now Pat. No. 10,820,435.

(60) Provisional application No. 62/770,356, filed on Nov. 21, 2018.

(56) References Cited

U.S. PATENT DOCUMENTS

| | | | |
|---|---|---|---|
| 6,967,668 B2 | 11/2005 | Byoun et al. | |
| 7,236,354 B2 | 6/2007 | Hsu et al. | |
| 7,267,315 B2 | 9/2007 | Chen | |
| 7,489,500 B2 | 2/2009 | Liou et al. | |
| 7,495,897 B2 | 2/2009 | Yokawa | |
| 7,520,480 B2 | 4/2009 | Lee | |
| 7,660,113 B2 | 2/2010 | Kaneko | |
| 7,681,848 B2* | 3/2010 | Choi | F16M 11/38 248/188.8 |
| 7,731,138 B2 | 6/2010 | Wiesner et al. | |
| 7,733,645 B2 | 6/2010 | Hsu | |
| 7,872,703 B2 | 1/2011 | Maruta | |
| 8,120,897 B2 | 2/2012 | Vanduyn et al. | |
| 8,622,354 B2 | 1/2014 | Sakata | |
| 8,654,526 B2* | 2/2014 | Wu | F16M 11/10 361/679.55 |
| 9,072,379 B2 | 7/2015 | Cassidy et al. | |
| 9,148,614 B2 | 9/2015 | Szolyga et al. | |
| 9,161,474 B2* | 10/2015 | Hirasawa | H05K 7/14 |
| 9,578,762 B2 | 2/2017 | Cassidy et al. | |
| 10,154,227 B2 | 12/2018 | Ikemoto et al. | |
| 10,820,435 B2 | 10/2020 | O'Shaughnessy et al. | |
| 11,272,628 B2 | 3/2022 | O'Shaughnessy et al. | |
| 2005/0157457 A1 | 7/2005 | Kim | |
| 2009/0114787 A1 | 5/2009 | Glassman | |
| 2009/0114792 A1 | 5/2009 | Ri et al. | |
| 2010/0133409 A1 | 6/2010 | Park et al. | |
| 2010/0281671 A1 | 11/2010 | De | |
| 2013/0155587 A1* | 6/2013 | Take | H05K 5/0204 361/679.01 |
| 2014/0239133 A1* | 8/2014 | Burns | F16M 11/04 248/121 |
| 2015/0097102 A1 | 4/2015 | Cassidy et al. | |
| 2015/0305178 A1 | 10/2015 | Cassidy et al. | |
| 2017/0155869 A1* | 6/2017 | Ikemoto | H05K 5/0234 |
| 2017/0265321 A1* | 9/2017 | Park | F16M 11/22 |
| 2017/0292691 A1* | 10/2017 | Coo | G02F 1/133308 |
| 2018/0184534 A1* | 6/2018 | Na | H05K 5/0017 |
| 2018/0270972 A1* | 9/2018 | Kang | H05K 5/0217 |
| 2019/0313541 A1* | 10/2019 | Yamada | H05K 5/0208 |
| 2020/0097043 A1* | 3/2020 | Kim | F16M 11/046 |
| 2020/0163241 A1 | 5/2020 | O'Shaughnessy et al. | |
| 2021/0076521 A1 | 3/2021 | O'Shaughnessy et al. | |

FOREIGN PATENT DOCUMENTS

| | | |
|---|---|---|
| CN | 105042291 | 3/2017 |
| CN | 216313266 | 4/2022 |
| EP | 3884660 | 9/2021 |
| JP | 2011002717 | 1/2011 |
| JP | 2018152689 | 9/2018 |
| JP | 2022508170 | 1/2022 |
| KR | 20040026263 | 3/2004 |
| KR | 100581854 | 5/2006 |
| WO | 2015035599 | 3/2015 |
| WO | 2020106994 | 5/2020 |

OTHER PUBLICATIONS

File History for U.S. Appl. No. 17/028,848 downloaded Mar. 15, 2022 (220 pages).

File History for U.S. Appl. No. 16/689,972 downloaded Mar. 15, 2022 (272 pages).

"First Office Action," for Chinese Patent Application No. 201990001164.2 dated Oct. 18, 2021 (2 pages), no English translation.

"International Preliminary Report on Patentability," for PCT Application No. PCT/US2019/062678 dated Jun. 3, 2021 (12 pages).

"International Search Report and Written Opinion," for PCT Application No. PCT/US2019/062678 dated Mar. 6, 2020 (15 pages).

"Sony LCT TV Setup Guide," for Bravia Model KDL-42W650A/32W650A, 2013 (46 pages).

* cited by examiner

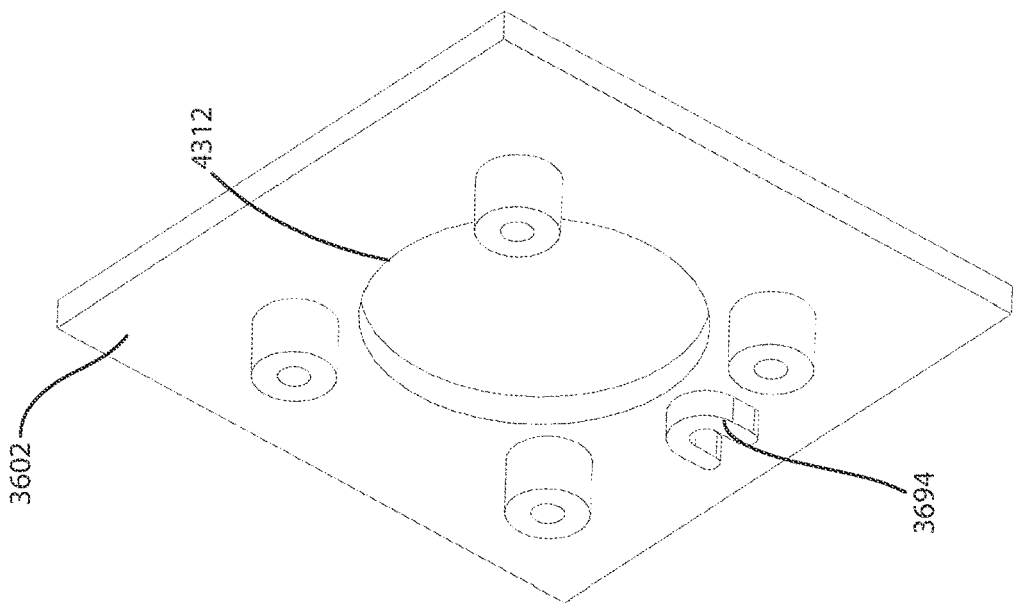
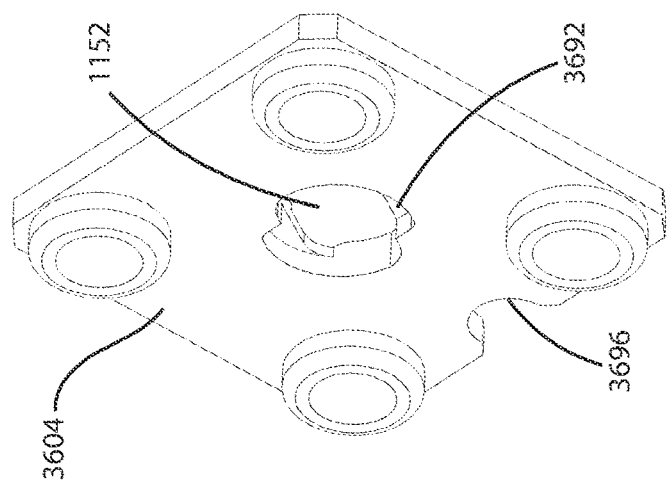
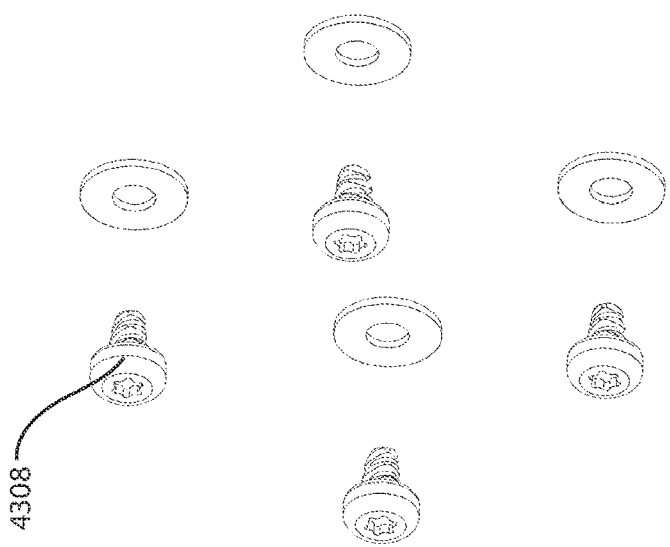
FIG. 43

//DISPLAY SCREEN STAND AND MOUNT SYSTEM

This application is a Continuation of U.S. patent application Ser. No. 17/028,848, filed Sep. 22, 2020, which is a Continuation of U.S. patent application Ser. No. 16/689,972, filed Nov. 20, 2019, which claims the benefit of U.S. Provisional Application No. 62/770,356 filed Nov. 21, 2018, the content of which is herein incorporated by reference in its entirety.

FIELD

Embodiments herein relate to a display screen system that can be configured in a tabletop configuration or a wall mount configuration.

BACKGROUND

Display screens, such as computer monitors and TVs are becoming more common in everyday life. Display screens are capable of being mounted in various configurations. However, safely mounting display screens can be difficult and time consuming. Further transitioning a display screen from a certain mounting configuration to a different mounting configuration can require different hardware adding to a user's frustration with mounting the display screen.

SUMMARY

In an embodiment, a display screen system is included having a display screen, a first stand element, and a second stand element. The display screen can include a front display surface, a back surface opposite from the front display surface, and a bottom surface extending between the front display surface and the back surface. The first stand element can include a first connection element disposed between a first end of the first stand element and a second end of the first stand element. The second stand element can include a second connection element disposed between a first end of the second stand element and a second end of the second stand element. The display screen stand system is configured to be assembled in a table top configuration or a wall mount configuration. In the table top configuration, the first stand element and the second stand element are configured to attach to the display screen such that the first and second ends of the first stand element and the first and second ends of the second stand element are disposed below the display screen to support the display screen on a surface. In the wall mount configuration, the first stand element and the second stand element are configured to be coupled to the display screen such that the first and second ends of the first stand element and the first and second ends of the second stand element are disposed behind the display screen.

In an embodiment, in the table top configuration, the first connection element and the second connection element are coupled to the bottom surface of the display screen.

In an embodiment, the bottom surface of the display screen defines a first recess and a second recess, in the table top configuration, the first connection element is at least partially disposed within the first recess and the second connection element is at least partially disposed within the second recess.

In an embodiment, in the wall mount configuration, the first connection element and the second connection element are coupled to the back surface of the display screen.

In an embodiment, the back surface of the display screen defines a third recess and a fourth recess, in the wall mount configuration, the first connection element is at least partially disposed within the third recess and the second connection element is at least partially disposed within the fourth recess.

In an embodiment, further can include a wall mount, the wall mount includes a first wall mount element and a second wall mount element. The first wall mount element includes a bottom receiving cup and a top receiving clamp, the bottom receiving cup configured to receive the second end of the first stand element and the top receiving clamp is configured to receive and hold retain the first end of the first stand element. The second wall mount element includes a bottom receiving cup and a top receiving clamp. The bottom receiving cup is configured to receive the second end of the second stand element and the top receiving clamp is configured to receive and hold retain the first end of the second stand element.

In an embodiment, the first connection element includes a first moveable locking projection that is moveable relative to the first and second ends of the first stand element, the first moveable locking projection of the first connection element is configured to be moved into a first locking recess defined within the first recess of the display screen to prevent rotation of the first stand element relative to the display screen, and the second connection element includes a first moveable locking projection that is moveable relative to the first and second ends of the second stand element, the first moveable locking projection of the second connection element is configured to be moved into a second locking recess defined within the second recess of the display screen to prevent rotation of the second stand element relative to the display screen.

In an embodiment, the first moveable locking projection of the first stand element is configured to translate relative to the first stand element, and the first moveable locking projection of the second stand element is configured to translate relative to the second stand element.

In an embodiment, the first connection element includes a second moveable locking projection that is opposite from the first moveable locking projection of the first connection element, the second moveable locking projection of the first connection element is moveable relative to the first stand element, the second moveable locking projection of the first connection element is configured to be moved into a second locking recess defined within the first recess to prevent rotation of the first stand element relative to the display screen, and the second connection element includes a second moveable locking projection that is opposite from the first moveable locking projection of the second connection element, the second moveable locking projection of the second connection element is moveable relative to the second stand element, the second moveable locking projection of the second connection element is configured to be moved into a second locking recess defined within the second recess to prevent rotation of the first stand element relative to the display screen.

In an embodiment, the first moveable locking projection and the second moveable locking projection of the first stand element are configured to translate relative to the first stand element, and the first moveable locking projection and the second moveable locking projection of the second stand element are configured to translate relative to the second stand element.

In an embodiment, a longitudinal axis of the first stand element and a longitudinal axis of the second stand element are substantially parallel in the table top configuration.

In an embodiment, a longitudinal axis of the first stand element and a longitudinal axis of the second stand element are substantially parallel in the wall mount configuration.

In an embodiment, the clamp of the first wall mount element is a spring loaded clamp, and the clamp of the second wall mount element is a spring loaded clamp.

In an embodiment, the clamp of the first wall mount element includes a pull release configured to release the spring loaded clamp, and the clamp of the second wall mount element includes a pull release configured to release the spring loaded clamp.

In an embodiment, a longitudinal axis of the first stand element and a longitudinal axis of the second stand element define a first plane in the table top configuration and define a second plane in the wall mount configuration, the first plane is perpendicular to the second plane.

In an embodiment, a longitudinal axis of the first stand element and a longitudinal axis of the second stand element define a first plane in the table top configuration and define a second plane in the wall mount configuration, the first plane is not perpendicular to the second plane.

In an embodiment, a method of mounting a display screen is included. The method can include coupling a first stand element to the display screen by rotating a first connection element of the first stand element within a first recess on a back portion of the display screen, and coupling a second stand element to the display screen by rotating a second connection element of the second stand element within a second recess on the back portion of the display screen. The method can further include inserting a first end of the first stand element into a cup of a first wall mount element, inserting a first end of the second stand element into a cup of a second wall mount element, retaining a second end of the first stand element with a clamp of the first wall mount element, and retaining a second end of the second stand element with a clamp of the second wall mount element.

In an embodiment, the method can further include: releasing the second end of the first stand element from the clamp of the first wall mount and releasing the second end of the second stand element from the clamp of the second wall mount.

In an embodiment, the method can further include uncoupling the first stand element and the second stand element from the display screen.

In an embodiment, the method can further include: coupling the first stand element to the display screen by rotating the first connection element of the first stand element within a third recess on a bottom portion of the display screen, and coupling the second stand element to the display screen by rotating the second connection element of the second stand element within a fourth recess on the bottom portion of the display screen.

In an embodiment, a display screen stand system, is included. The display screen stand system can include a first stand element, a second stand element, a first adapter, and a second adapter. The first stand element can include a first connection element disposed between a first end of the first stand element and a second end of the first stand element. The second stand element can include a second connection element disposed between a first end of the second stand element and a second end of the second stand element. The first adapter configured to receive a portion of the first connection element to couple the first adapter to the first stand element. The second adapter configured to receive a portion of the second connection element to couple the second adapter to the second stand element. The display screen stand system is configured to be assembled in a table top configuration or a wall mount configuration. In the table top configuration, the first stand element is configured to be coupled to the first adapter and the second stand element is configured to be coupled to the second adapter, the first adapter and the second adapter are configured to attach to a display screen so that the first and second ends of the first stand element and the first and second ends of the second stand element are disposed below a display screen to support the display screen on a surface. In the wall mount configuration, the first stand element is configured to be coupled to the first adapter and the second stand element is configured to be coupled to the second adapter, the first adapter and the second adapter are configured to attach to the display screen such that the first and second ends of the first stand element and the first and second ends of the second stand element are disposed behind the display screen.

In an embodiment, in the table top configuration, the first adapter and the second adapter are coupled to a bottom portion of the display screen.

In an embodiment, in the wall mount configuration, the first adapter and the second adapter are coupled to a back portion of the display screen.

In an embodiment, the system can further include a wall mount bracket. In the wall mount configuration, the wall mount bracket is coupled to a back portion of the display screen, and the first adapter and the second adapter are coupled to the wall mount bracket.

In an embodiment, the system can further include a wall mount. The wall mount includes a first wall mount element and a second wall mount element. The first wall mount element includes a bottom receiving cup and a top receiving clamp. The bottom receiving cup configured to receive the second end of the first stand element and the top receiving clamp is configured to receive and hold retain the first end of the first stand element. The second wall mount element includes a bottom receiving cup and a top receiving clamp. The bottom receiving cup configured to receive the second end of the second stand element and the top receiving clamp is configured to receive and hold retain the first end of the second stand element.

In an embodiment, the first adapter includes an adapter housing and a first moveable locking projection that is moveable relative to the adapter housing, the first moveable locking projection is configured to be moved into a first recess defined by the first connection element to prevent rotation of the first stand element relative to the first adapter, and the second adapter includes an adapter housing and a first moveable locking projection that is moveable relative to the adapter housing, the first moveable locking projection is configured to be moved into a first recess defined by the second connection element to prevent rotation of the second stand element relative to the second adapter.

In an embodiment, the first moveable locking projection of the first adapter is configured to rotate relative to the adapter housing of the first adapter, and the first moveable locking projection of the second adapter is configured to rotate relative to the adapter housing of the second adapter.

In an embodiment, the first moveable locking projection of the first adapter is configured to translate relative to the adapter housing of the first adapter, and the first moveable locking projection of the second adapter is configured to translate relative to the adapter housing of the second adapter.

In an embodiment, the first adapter includes a second moveable locking projection that is opposite from the first moveable locking projection, the second moveable locking projection is moveable relative to the adapter housing, the second moveable locking projection is configured to be moved into a second recess defined by the first connection element to prevent rotation of the first stand element relative to the first adapter, and the second adapter includes a second moveable locking projection that is opposite from the first moveable locking projection, the second moveable locking projection is moveable relative to the adapter housing, the second moveable locking projection is configured to be moved into a second recess defined by the second connection element to prevent rotation of the second stand element relative to the second adapter.

In an embodiment, the first moveable locking projection and the second moveable locking projection of the first adapter are configured to rotate relative to the adapter housing of the first adapter, and the first moveable locking projection and the second moveable locking projection of the second adapter are configured to rotate relative to the adapter housing of the second adapter.

In an embodiment, the first moveable locking projection and the second moveable locking projection of the first adapter are configured to translate relative to the adapter housing of the first adapter, and the first moveable locking projection and the second moveable locking projection of the second adapter are configured to translate relative to the adapter housing of the second adapter.

In an embodiment, the first stand element includes a first moveable locking projection that is moveable relative to the rest of the first stand element, the first moveable locking projection is configured to be moved into a first recess defined by the first adapter to prevent rotation of the first stand element relative to the first adapter, and the second stand element includes a first moveable locking projection that is moveable relative to the rest of the second stand element, the first moveable locking projection is configured to be moved into a first recess defined by the second adapter to prevent rotation of the second stand element relative to the second adapter.

In an embodiment, the first moveable locking projection of the first stand element is configured to rotate relative to the first stand element, and the first moveable locking projection of the second stand element is configured to rotate relative to the second stand element.

In an embodiment, the first moveable locking projection of the first stand element is configured to translate relative to the first stand element, and the first moveable locking projection of the second stand element is configured to translate relative to the second stand element.

In an embodiment, the first stand element includes a second moveable locking projection that is opposite from the first moveable locking projection, the second moveable locking projection is moveable relative to the rest of the first stand element, the second moveable locking projection is configured to be moved into a second recess defined by the first adapter to prevent rotation of the first stand element relative to the first adapter, and the second stand element includes a second moveable locking projection that is opposite from the first moveable locking projection, the second moveable locking projection is moveable relative to the second stand element, the second moveable locking projection is configured to be moved into a second recess defined by the second adapter to prevent rotation of the second stand element relative to the second adapter.

In an embodiment, the first moveable locking projection and the second moveable locking projection of the first stand element are configured to rotate relative to the rest of the stand element, and the first moveable locking projection and the second moveable locking projection of the second stand element are configured to rotate relative to the rest of the second stand element.

In an embodiment, the first moveable locking projection and the second moveable locking projection of the first stand element are configured to translate relative to the rest of the first stand element, and the first moveable locking projection and the second moveable locking projection of the second stand element are configured to translate relative to the rest of the second stand element.

In an embodiment, a longitudinal axis of the first stand element and a longitudinal axis of the second stand element are substantially parallel in the table top configuration.

In an embodiment, a longitudinal axis of the first stand element and a longitudinal axis of the second stand element are substantially parallel in the wall mount configuration.

In an embodiment, a longitudinal axis the first stand element and a longitudinal axis of the second stand element define a first plane in the table top configuration and define a second plane in the wall mount configuration, the first plane is perpendicular to the second plane.

In an embodiment, the clamp of the first wall mount element is a spring loaded clamp, and the clamp of the second wall mount element is a spring loaded clamp.

In an embodiment, the clamp of the first wall mount element includes a pull release configured to release the spring loaded clamp, and the clamp of the second wall mount element includes a pull release configured to release the spring loaded clamp.

In an embodiment, a method of mounting a display screen is provided. The method can include coupling a first stand element to a first adapter by rotating a first connection element of the first stand element within a portion of the first adapter, coupling a second stand element to second adapter by rotating a second connection element of the second stand element within a portion of the second adapter, and coupling the first adapter and the second adapter to the display screen in a first configuration.

In an embodiment, the first adapter and second adapter are coupled to a back surface of the display screen in the first configuration, further can include: inserting a first end of the first stand element into a cup of a first wall mount element, inserting a first end of the second stand element into a cup of a second wall mount element, retaining a second end of the first stand element with a clamp of the first wall mount element, and retaining a second end of the second stand element with a clamp of the second wall mount element.

In an embodiment, the method can further include releasing the second end of the first stand element from the clamp of the first wall mount, and releasing the second end of the second stand element from the clamp of the second wall mount.

In an embodiment, the method can further include uncoupling the first adapter and the second adapter from the display screen, and coupling the first adapter and the second adapter to the display screen in a second configuration.

In an embodiment, a display screen stand system is provided. The display screen system having a first stand element and a second stand element. The first stand element can include a first connection element disposed between a first end of the first stand element and a second end of the first stand element. The second stand element can include a second connection element disposed between a first end of the second stand element and a second end of the second stand element. The first connection element and the second connection element each include a rotatable compression fit element, the display screen stand system is configured to be assembled in a table top configuration or a wall mount configuration. In the table top configuration, the first stand element and the second stand element are configured to attach to a display screen so that the first and second ends of the first stand element and the first and second ends of the second stand element are disposed below a display screen to support the display screen on a surface. In the wall mount configuration, the first stand element and the second stand element are configured to attach to the display screen such that the first and second ends of the first stand element and the first and second ends of the second stand element are disposed behind the display screen.

In an embodiment, the rotatable compression fit elements of the first stand element and the second stand element are each configured to rotate at least 60 degrees.

In an embodiment, the rotatable compression fit elements of the first stand element and the second stand element each include at least two ramp arms.

In an embodiment, a longitudinal axis of the first stand element and a longitudinal axis of the second stand element are substantially parallel in the table top configuration.

In an embodiment, a longitudinal axis of the first stand element and a longitudinal axis of the second stand element are not parallel in the wall mount configuration.

In an embodiment, a longitudinal axis the first stand element and a longitudinal axis of the second stand element define a first plane in the table top configuration and define a second plane in the wall mount configuration, the first plane is perpendicular to the second plane.

In an embodiment, the system can further include a first wall mount element and a second wall mount element, the first wall mount element and the second wall mount element each include a cup and a clamp, the cup of the first wall mount element is configured to receive the first end of the first stand element and the clamp of the first wall mount element is configured to receive the second end of the first stand element, the cup of the second wall mount element is configured to receive the first end of the second stand element and the clamp of the second wall mount element is configured to receive the second end of the second stand element.

In an embodiment, the clamp of the first wall mount is a spring loaded clamp, and the clamp of the second wall mount is a spring loaded clamp.

In an embodiment, the clamp of the first wall mount includes a pull release, and the clamp of the second wall mount includes a pull release.

In an embodiment, a display screen stand system is provided. The display screen system can include a display screen, a first stand element and a second stand element. The display screen can include a front display surface, a back surface opposite from the front display surface, a bottom surface between the back surface and the front display surface. The first stand element can include a first end and a second end, and the second stand element can include a first end and a second end. The display screen, a first stand element, and a second stand element are configured to be assembled in a table top configuration or in a wall mount configuration. In the table top configuration, the first stand element and the second stand element are configured to attach to a display screen so that the first and second ends of the first stand element and the first and second ends of the second stand element are disposed below a display screen to support the display screen on a surface. In the wall mount configuration, the first stand element and the second stand element are configured to attach to the display screen such that the first and second ends of the first stand element and the first and second ends of the second stand element are disposed behind the display screen. The first stand element and the second stand element are configured to be coupled to the display screen with a first rotatable compression fit element and a second rotatable compression fit element.

In an embodiment, the first stand element and the second stand element are coupled to the bottom surface of the display screen in the table top configuration.

In an embodiment, the first stand element and the second stand element are coupled to the back surface of the display screen in the wall mount configuration.

In an embodiment, the first compression fit element is configured to couple the first stand element to the display screen with a rotation of at least 60 degrees, the second compression fit element is configured to couple the second stand element to the display screen with a rotation of at least 60 degrees.

In an embodiment, the first rotatable compression fit element includes at least two ramped surfaces on the first stand element and the second rotatable compression fit element includes at least two ramped surfaces on the second stand element.

In an embodiment, the first rotatable compression fit element includes at least two boss structures on the display screen and the second rotatable compression fit element includes at least two boss structures on the display screen.

In an embodiment, a method of mounting a display screen is provided. The method can include coupling a first stand element and a second stand element to a display screen with a rotatable compression fit element in a first configuration.

In an embodiment, the first stand element and second stand element are attached to a back surface of the display screen in the first configuration, the method can further include: inserting a first end of the first stand element into a cup of a first wall mount element, inserting a first end of the second stand element into a cup of a second wall mount element, retaining a second end of the first stand element with a clamp of the first wall mount element, and retaining a second end of the second stand element with a clamp of the second wall mount element.

In an embodiment, the method can further include releasing the second end of the first stand element from the clamp of the first wall mount, and releasing the second end of the second stand element from the clamp of the second wall mount.

In an embodiment, the method can further include uncoupling the first stand element and the second stand element from the display screen, and coupling the first stand element and the second stand element to the display screen in a second configuration.

In an embodiment, in the first configuration, the first stand element and second stand element are attached to the display screen so that a first end and a second end of the first stand element are disposed below the display screen and so that a first end and a second end of the second stand element are disposed below the display screen, further can include standing the display screen in an upright configuration such that the first stand element and the second stand element are configured to support the display screen on a surface.

This summary is an overview of some of the teachings of the present application and is not intended to be an exclusive or exhaustive treatment of the present subject matter. Further details are found in the detailed description and appended claims. Other aspects will be apparent to persons skilled in the art upon reading and understanding the following detailed description and viewing the drawings that form a part thereof, each of which is not to be taken in a limiting sense. The scope herein is defined by the appended claims and their legal equivalents.

BRIEF DESCRIPTION OF THE FIGURES

Aspects may be more completely understood in connection with the following figures (FIGS.), in which:

FIG. 43 is an exploded view of an adapter in accordance with various embodiments herein.

While embodiments are susceptible to various modifications and alternative forms, specifics thereof have been shown by way of example and drawings, and will be described in detail. It should be understood, however, that the scope herein is not limited to the particular aspects described. On the contrary, the intention is to cover modifications, equivalents, and alternatives falling within the spirit and scope herein.

DETAILED DESCRIPTION

Described herein are various system and methods for mounting display screens. The systems described herein can be assembled to mount a display screen in different configurations in some cases without the use of tools. The systems described herein can provide a user with a less frustrating mounting experience. In various embodiments, the display screen systems described herein can be configured in a wall mount configuration or a table top configuration depending on the user's desired configuration. The display screen systems can also provide an easy transition between the wall mount configuration and the table top configuration.

As described herein a table top configuration can refer to a configuration where the display screen and the stand system sit or rest on surface. In various embodiments, the table top configuration is intended to allow the display screen to be vertical or perpendicular to the ground or a surface in which the display screen is placed on. In various embodiments, the display screen stand system in the table top configuration can be intended to be placed on the ground, a table, a shelf, a desk, or another substantially horizontal surface. In some embodiments, the substantially horizontal surface can be planar.

As described herein a wall mount configuration can refer to a configuration where the display screen and the stand system are configured to be coupled to or mounted on a wall or other vertical surface. In various embodiments, the wall mount configuration is intended to allow the display screen to be vertical or parallel to a surface in which the display screen is coupled to. In various embodiments, the display screen stand system in the wall mount configuration can be intended to be mounted on a wall or a vertical stand.

In various embodiments, the system can include two stand elements. It should be understood that in some embodiments, the two stand elements can be identical, and in other embodiments, the stand elements can be mirrored versions of each other. It should be further understood that description included herein referring to the first stand element can also be attributed to the second stand element. This should further be understood for other like elements, such as locking projections, locking recesses, adapters, wall mount elements and the like.

Figure 1:
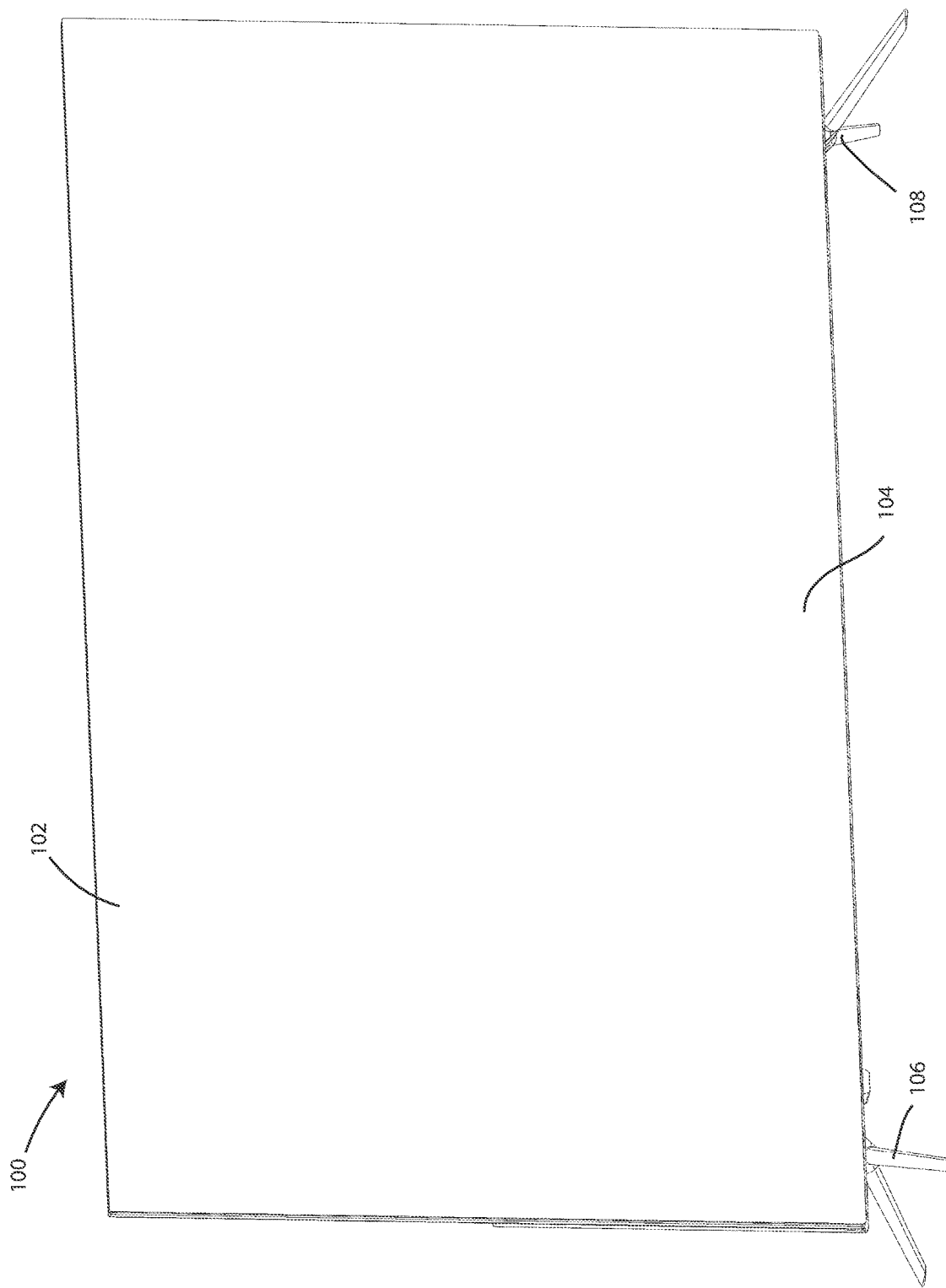
FIG. 1 is a perspective view of a display screen in a table top configuration in accordance with various embodiments herein.

Referring now to FIG. 1, a perspective view of a display screen 102 in a table top configuration is shown in accordance with various embodiments herein. FIG. 1 shows a display screen system 100. The display screen system 100 can include a display screen 102, such as a television screen or a computer screen. The display screen 102 can include a front display surface 104.

The display screen system 100 can include a first stand element 106 and a second stand element 108. In various embodiments, the display screen 102 stand system is configured to be assembled in a table top configuration or a wall mount configuration. In a table top configuration, at least a portion of the first stand element 106 and the second stand element 108 can be disposed below the bottom of the display screen 102, such that the first stand element 106 and the second stand element 108 support the display screen 102 in an upright position on a surface.

In various embodiments, the first stand element 106 and the second stand element 108 are configured to attach to the display screen 102. The first stand element 106 and the second stand element 108 can be attached at different locations on the display screen 102 depending on which configuration the system is in. In a table top configuration, the first stand element 106 and the second stand element 108 can be attached to the display screen 102, such as a bottom surface of the display screen 102, such that the first and second ends of the first stand element 106 and the first and second ends of the second stand element 108 are disposed below the display screen 102 to support the display screen 102 on a surface.

In a wall mount configuration, the first stand element 106 and the second stand element 108 can be attached to the display screen 102, such as a back surface of the display screen 102, such that the first and second ends of the first stand element 106 and the first and second ends of the second stand element 108 are disposed behind the display screen 102.

Figure 2:
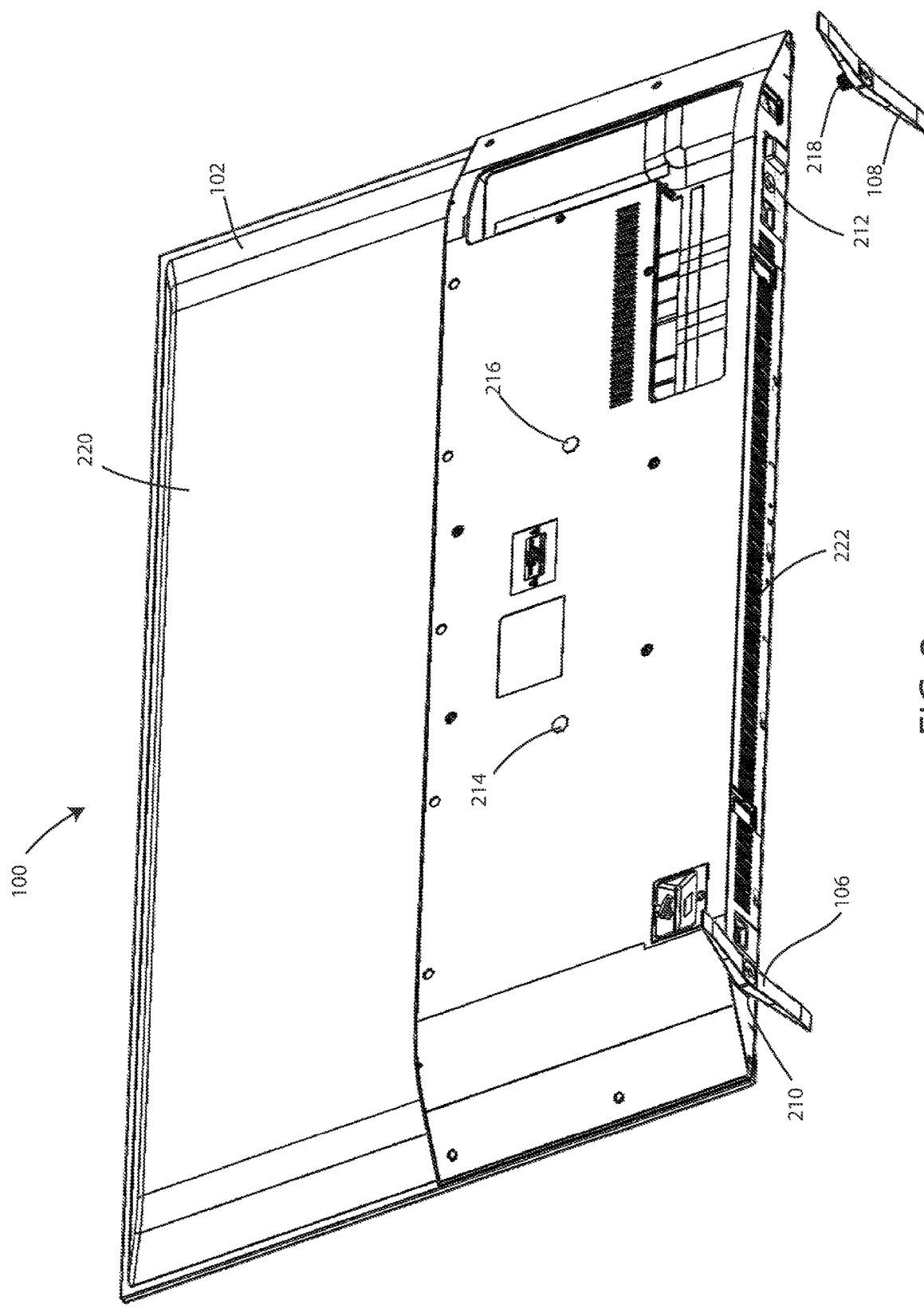
FIG. 2 is a perspective view of a display screen with two stand elements in accordance with various embodiments herein.

Referring now to FIG. 2, a perspective view of the display screen 102 with two stand elements 106, 108 is shown in accordance with various embodiments herein. FIG. 2 shows a display screen system 100. The display screen system 100 includes a display screen 102. The display screen system 100 also includes a first stand element 106 and a second stand element 108. The display screen 102 includes a back surface 220 opposite from the front display surface 104. The display screen 102 also includes a bottom surface 222. In various embodiments, the bottom surface 222 extends between the front display surface 104 and the back surface 220.

In various embodiments, the bottom surface 222 of the display screen 102 defines a first recess 210 and a second recess 212. In various embodiments, the back surface 220 of the display screen 102 defines a third recess 214 and a fourth recess 216.

The first stand element 106 includes a connection element 218. In various embodiments, the first connection element 218 can be disposed between a first end (described further below) of the first stand element 106 and a second end (described further below) of the first stand element 106. Similarly, the second stand element 108 can include a connection element 218 disposed between a first end and a second end.

In various embodiments, the first stand element 106 and the second stand element 108 can be coupled to the bottom surface 222 of the display screen 102, such as by having the respective connection elements 218 disposed in the first recess 210 and the second recess 212. In various embodiments, when the first and second stand elements 106, 108 are coupled to the bottom surface 222 of the display screen 102, the display screen system is in the table top configuration, such as shown in FIG. 1. In various embodiments, when the display screen system 100 is in the table top configuration, the first connection element 218 can be at least partially disposed within the first recess 210 and the second connection element 218 is at least partially disposed within the second recess 212. In various embodiments, a longitudinal axis (described further below) of the first stand element 106 and a longitudinal axis (described further below) of the second stand element 108 are parallel or substantially parallel, such as within 5° of parallel, in the table top configuration.

Figure 14:
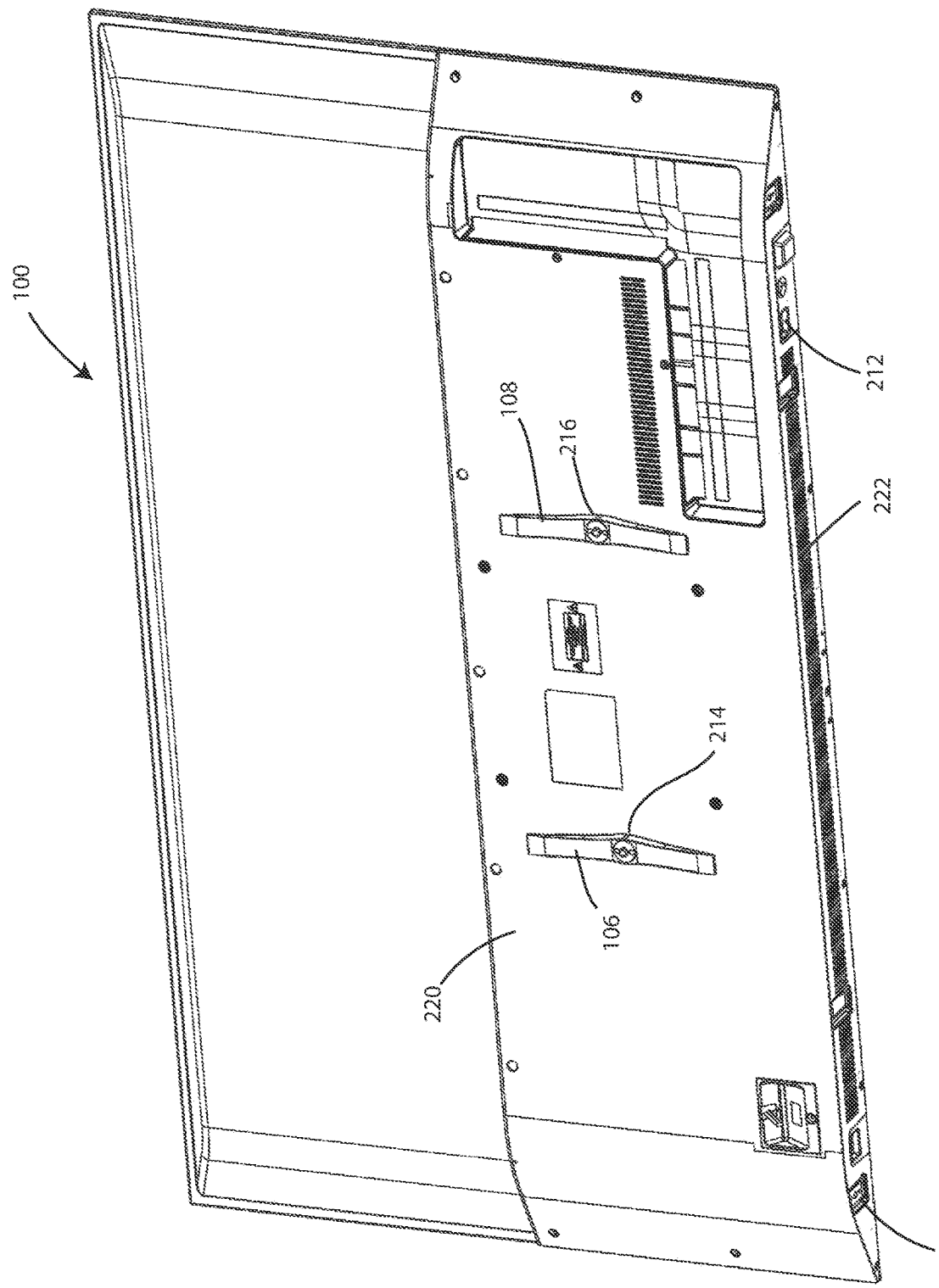
FIG. 14 is a perspective view of a display screen in a wall mount configuration in accordance with various embodiments herein.

In various embodiments, in the wall mount configuration, the first stand element 106 and the second stand element 108 can be coupled to the back surface 220 of the display screen 102. In various embodiments, the connection element 218 of the first stand element 106 can be at least partially disposed within the third recess 214 and the connection element 218 of the second stand element 108 can be at least partially disposed within the fourth recess 216. In various embodiments, the longitudinal axis of the first stand element 106 and the longitudinal axis of the second stand element 108 are substantially parallel, such as within 5° of parallel, in the wall mount configuration, such as shown in FIG. 14.

In various embodiments, the longitudinal axis of the first stand element 106 and the longitudinal axis of the second stand element 108 define a first plane in the table top configuration and define a second plane in the wall mount configuration, the first plane is perpendicular to the second plane.

Figure 3:
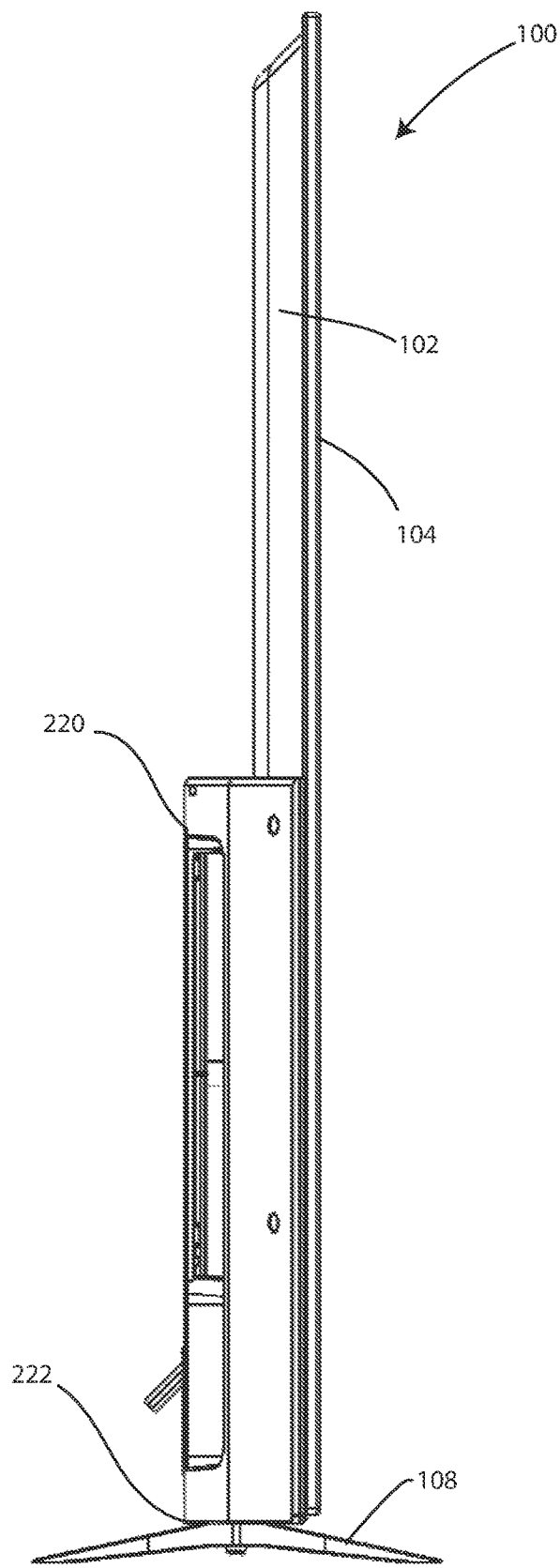
FIG. 3 is a side view of a display screen in a table top configuration in accordance with various embodiments herein.

Referring now to FIG. 3, a side view of a display screen 102 in a table top configuration is shown in accordance with various embodiments herein. FIG. 3 shows a display screen system 100. The display screen system 100 includes a display screen 102. The display screen system 100 also includes a second stand element 108. The display screen 102 includes a front display surface 104. The display screen 102 also includes a bottom surface 222.

Figure 4:
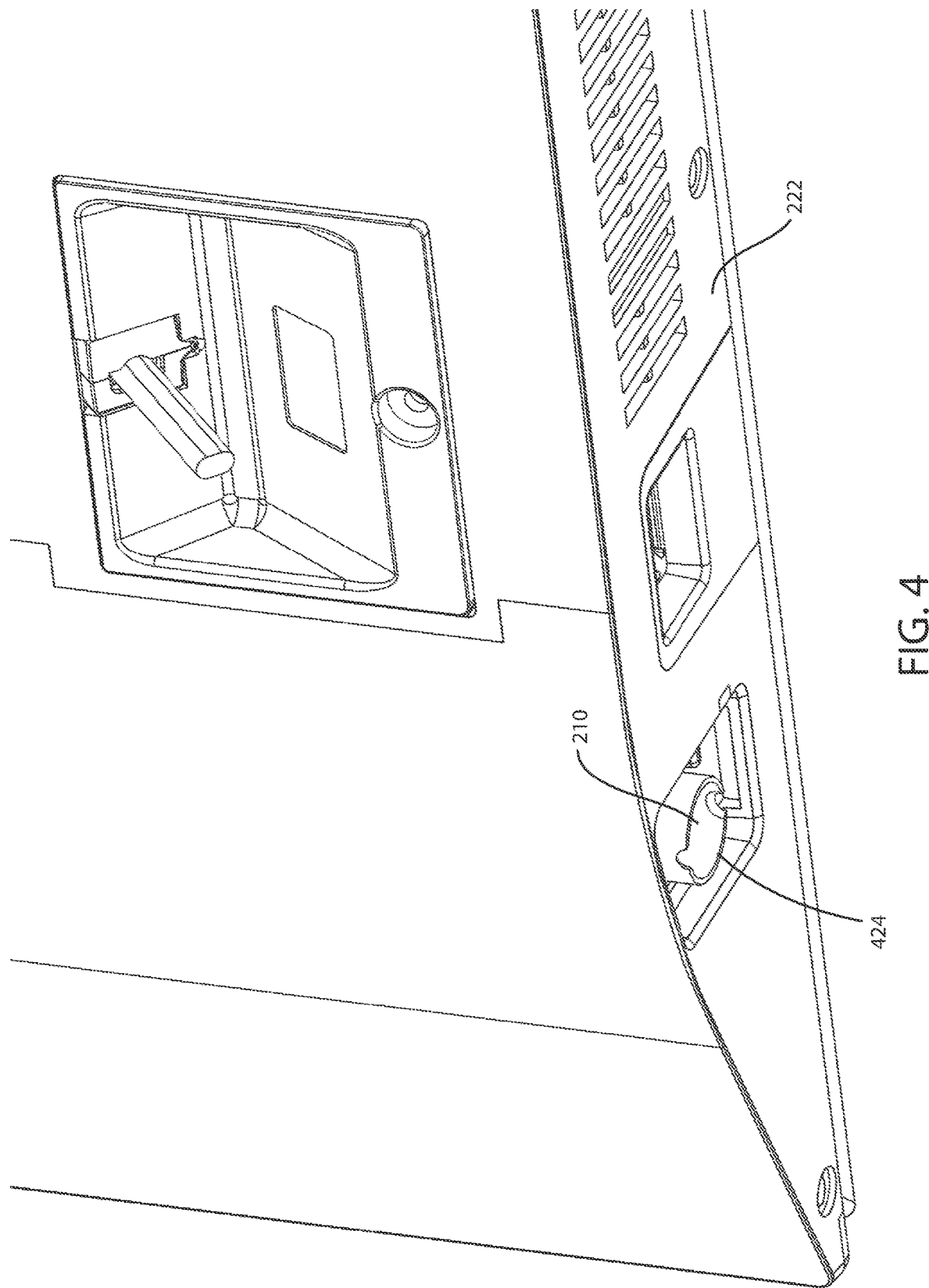
FIG. 4 is a perspective view of a portion of a display screen in accordance with various embodiments herein.
Figure 5:
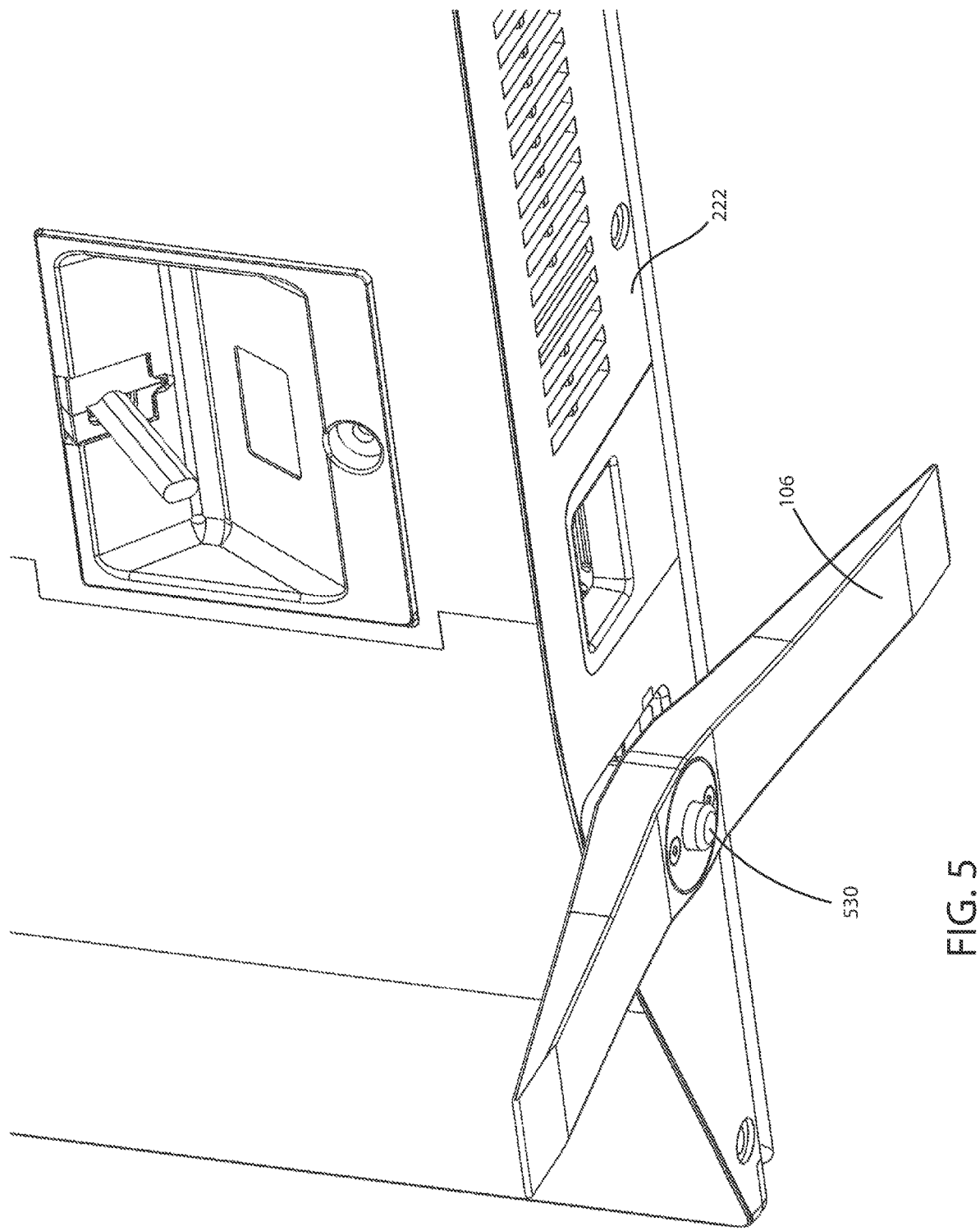
FIG. 5 is a perspective view of a portion of a display screen in a table top configuration in accordance with various embodiments herein.

Referring now to FIGS. 4 and 5, perspective views of a portion of a display screen 102 are shown in accordance with various embodiments herein. FIG. 4 shows a portion of a display screen 102 with the first recess 210 unoccupied (without a stand element). FIG. 5 shows the portion of the display screen 102 shown in FIG. 4 with the connection element 218 of the first stand element 106 disposed in the first recess 210 thereby coupling the first stand element 106 to the display screen 102. It should be understood that a second stand element 108 can be coupled to the second recess 212 in a similar manner.

The bottom surface 222 includes a first recess 210. The display screen system 100 can further include a receiving bracket 424. In some embodiments, the receiving bracket 424 can be integral with the display screen 102, such as the display screen housing. In some embodiments, the receiving bracket 424 can be located, at least partially, within the display screen 102. It should be understood that each of the recesses 210, 212, 214, 216 can include a receiving bracket 424 to receive a connection element 218 from a stand element 106, 108.

The receiving bracket 424 includes a first locking recess 1126 and a second locking recess 1228. The first locking recess 1126 and the second locking recess 1228 can be configurated to receive a locking projection from the connection element 218 and thereby lock the stand element 106 with the display screen 102. The stand element 106 can be locked to the display screen 102, such that the stand element 106 cannot rotate relative to the display screen 102 or cannot translate in or out of the recess 210.

The stand element 106 can include an unlocking mechanism 530 (shown in FIG. 5). The unlocking mechanism 530 can be configured to move the locking projection out of the locking recesses 1126, 1228, such as to unlock the stand element 106 from the display screen 102. When the stand element 106 is unlocked from the display screen 102, the stand element 106 can rotate and/or translate relative to the display screen 102.

Figure 6:
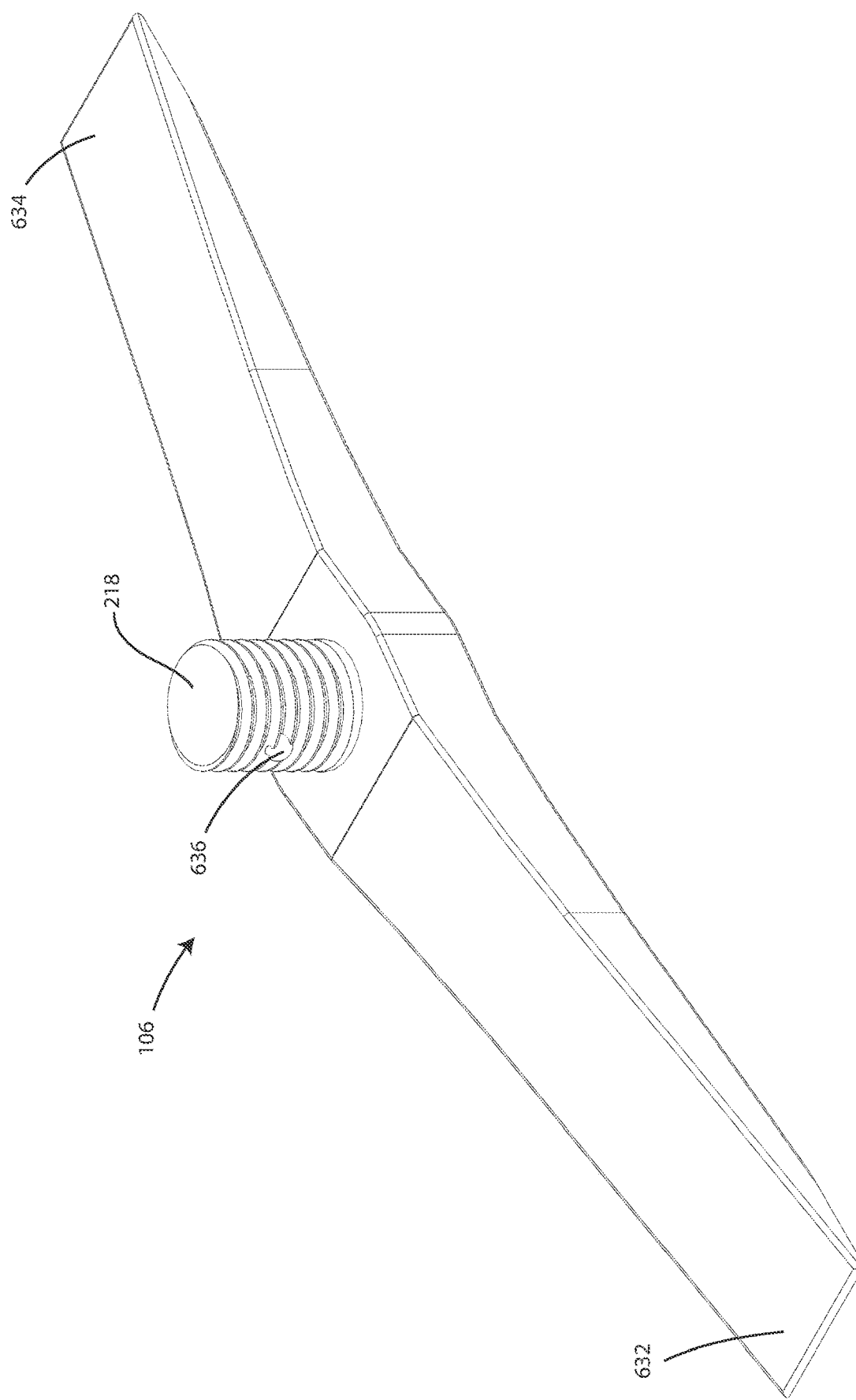
FIG. 6 is a perspective view of a stand element in accordance with various embodiments herein.
Figure 7:
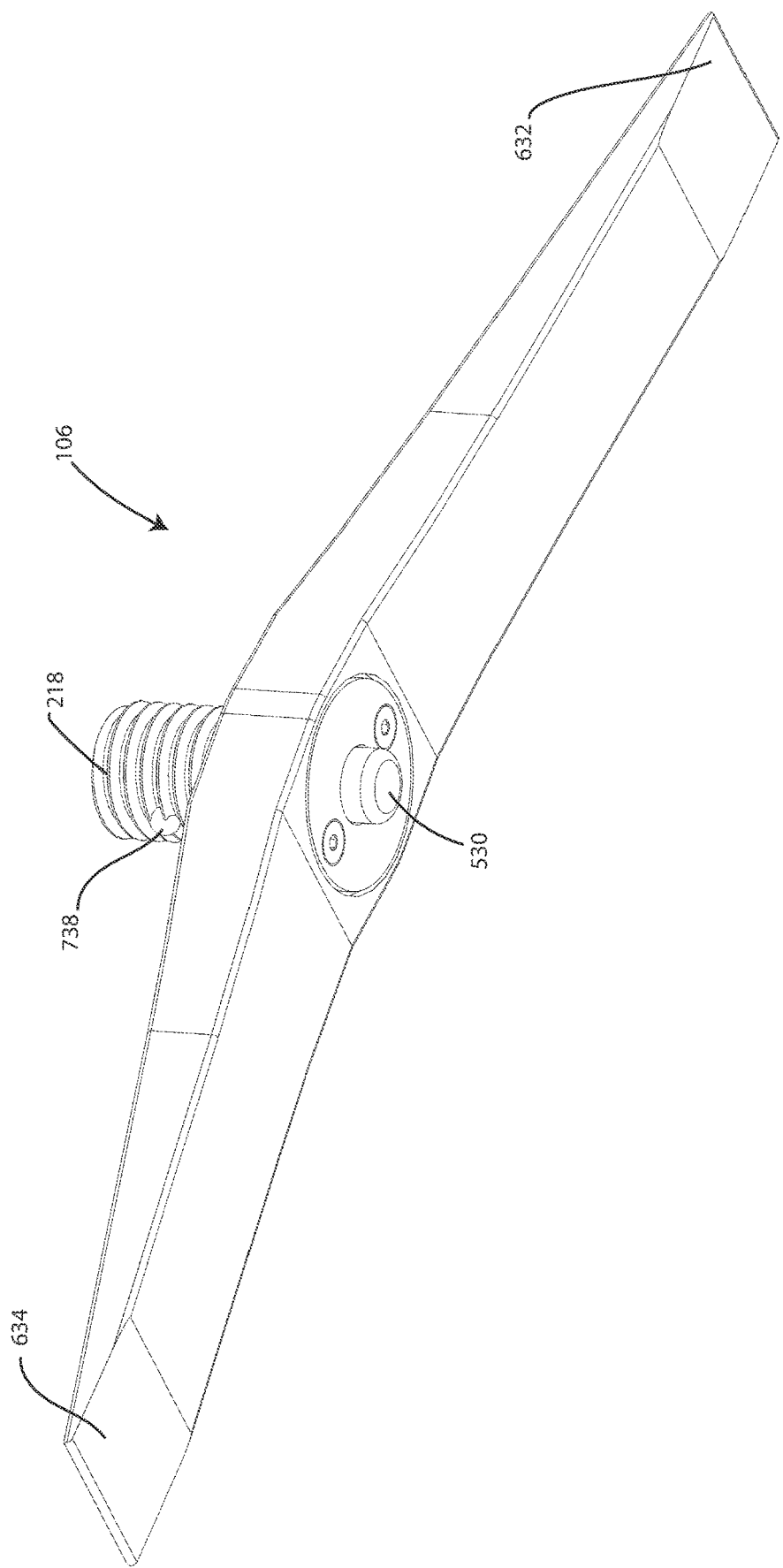
FIG. 7 is a perspective view of a stand element in accordance with various embodiments herein.
Figure 9:
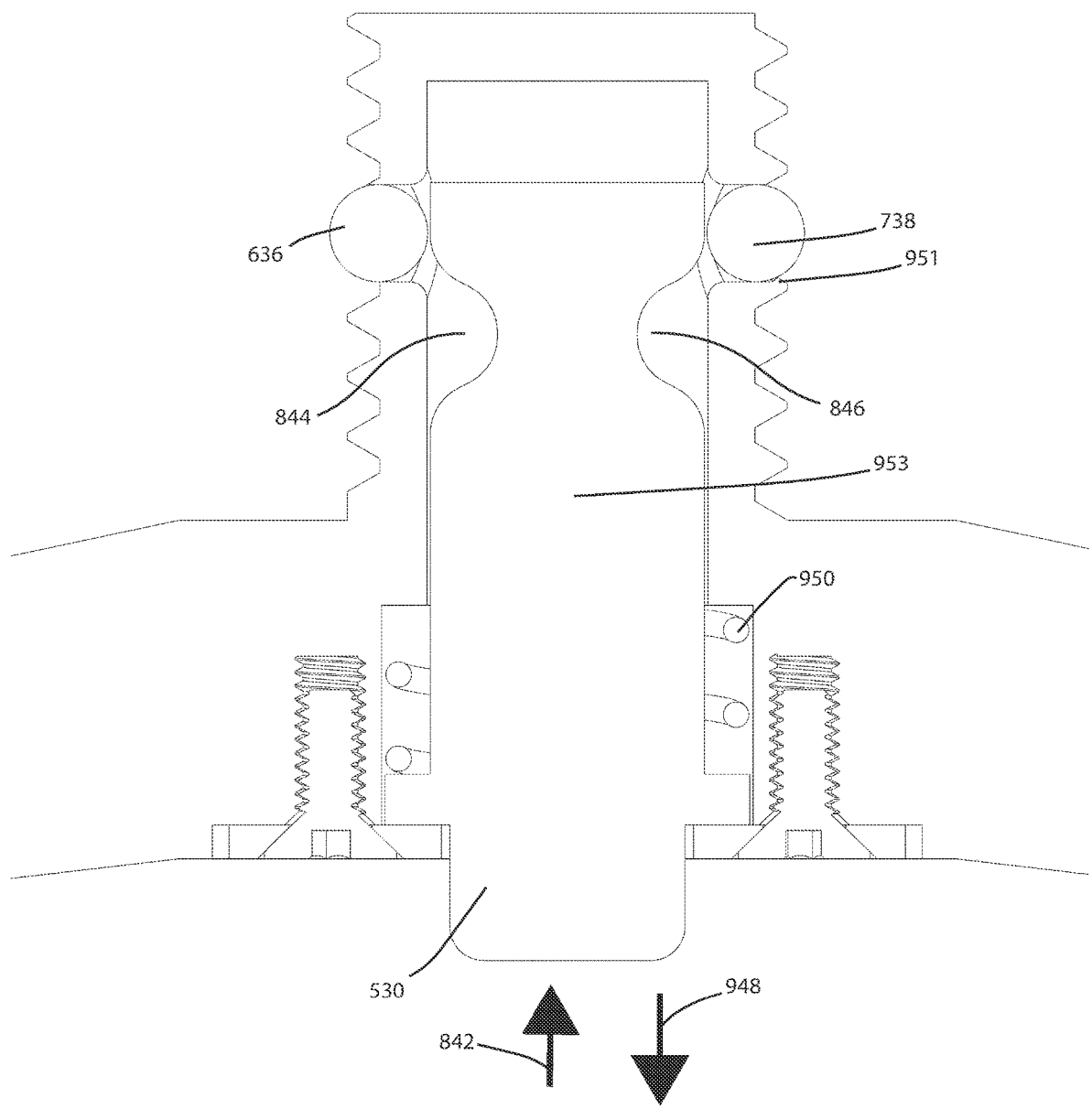
FIG. 9 is a partial cross-sectional view of the stand element shown in FIG. 8 in a locked position in accordance with various embodiments herein.
Figure 10:
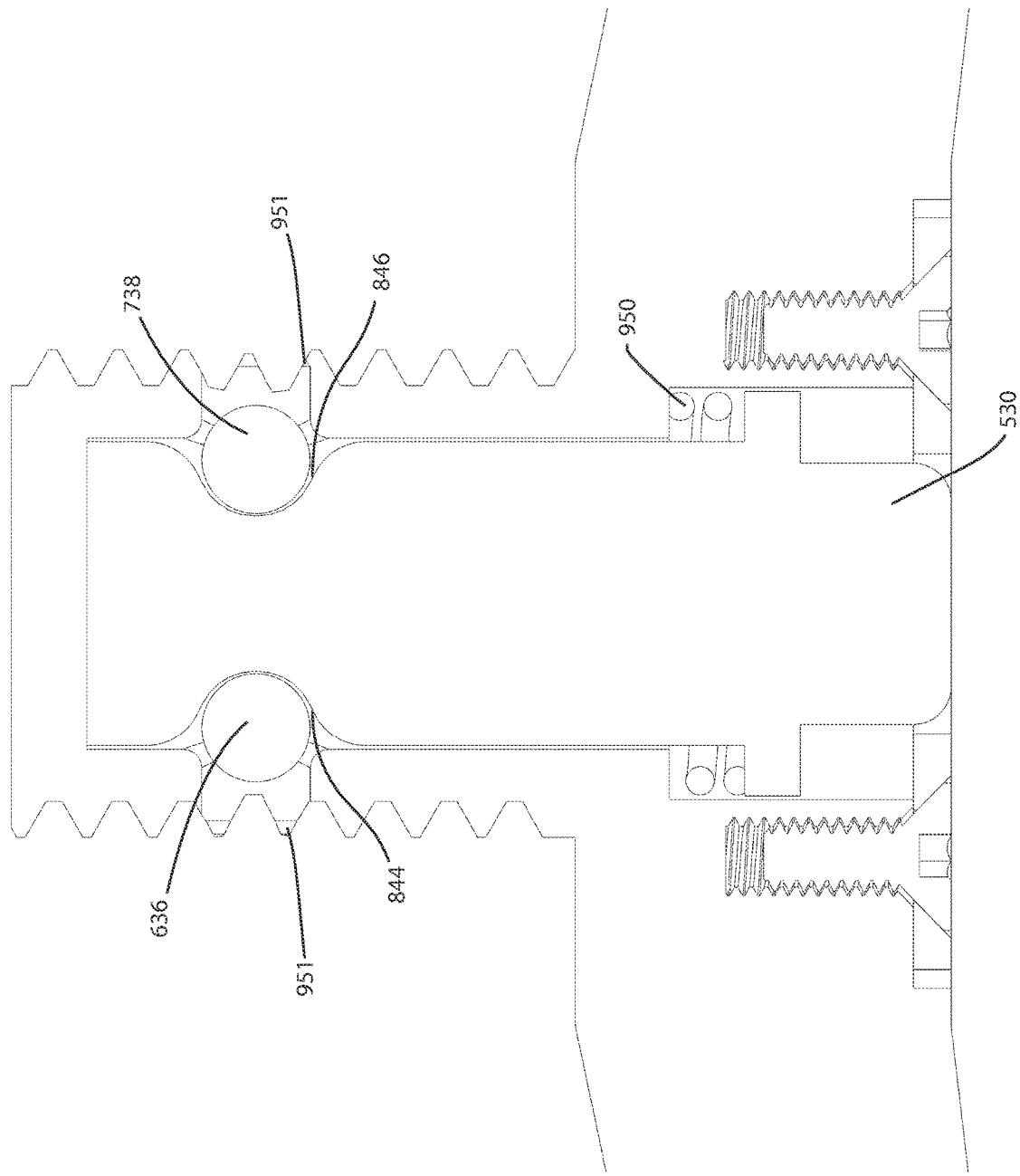
FIG. 10 is a partial cross-sectional view of the stand element shown in FIG. 8 in an unlocked position accordance with various embodiments herein.

Referring now to FIGS. 6 and 7, two different perspective views of a stand element 106 is shown in accordance with various embodiments herein. The first stand element 106 includes a first connection element 218. The first stand element 106 also includes a first end 632. The first stand element 106 also includes a second end 634. In various embodiments, the first stand element 106 can be symmetric, such that the first end 632 and the second end 634 can be the same. In other embodiments, the first end 632 and the second end 634 can be different, such as having a different shape or size. The connection element 218 includes a first moveable locking projection 636. In some embodiments, the connection element 218 can include a second moveable locking projection 738. The locking projections 636, 738 can be moveable, such that they can move between a locked position (shown in FIG. 9) and an unlocked position (shown in FIG. 10). In some embodiments, the locking projections 636, 738 can include a ball bearing, such as shown in FIGS. 9 and 10. In some embodiments, the locking projections 636, 738 can include a pin.

In various embodiments, the moveable locking projections 636, 738 are moveable relative to the first and second ends 632, 634 of the first stand element 106 or another portion of the first stand element 106. The first moveable locking projection 636 can be configured to be moved into and out of the first locking recess 1126 defined within a recess 210, 212, 214, 216 of the display screen 102 to prevent rotation of the stand element 106 relative to the display screen 102. Similarly, the second moveable locking projection 738 can be configured to be moved into and out of the second locking recess 1228 defined within a recess 210, 212, 214, 216.

In various embodiments, the locking projections 636, 738 of a stand element 106 are configured to translate, such as to move laterally or linearly, relative to the stand element 106 between the locked position and the unlocked position. In various embodiments, the locking projections 636, 738 of a stand element 106 are configured to rotate relative to the stand element 106 between the locked position and the unlocked position.

Figure 8:
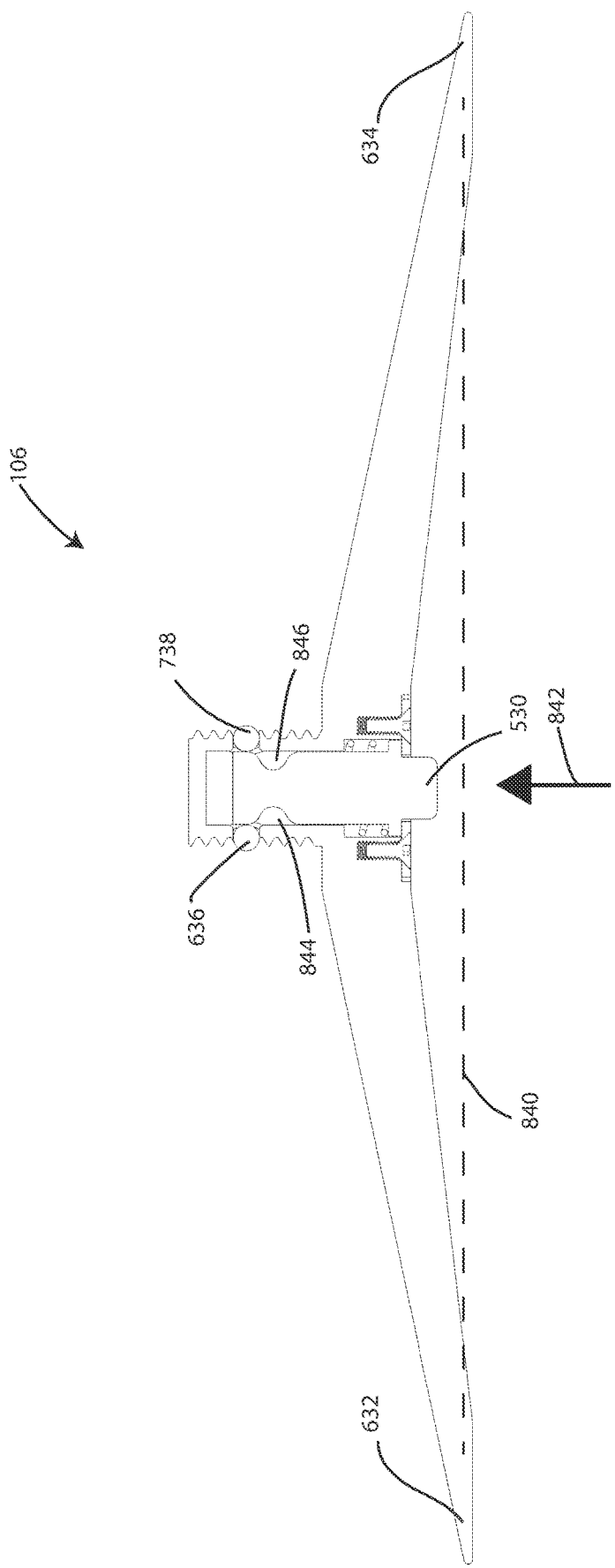
FIG. 8 is a cross-sectional view of a stand element in accordance with various embodiments herein.

Referring now to FIG. 8, a cross-sectional view of a stand element is shown in accordance with various embodiments herein. The first stand element 106 includes a first end 632 and a second end 634. The first stand element 106 also includes a longitudinal axis 840 extending between the first end 632 and the second end 634.

In some embodiments, the first stand element 106 can include a first unlocking recess 844 and a second unlocking recess 846. The first unlocking recess 844 and the second unlocking recess 846 can be configured to receive the locking projections 636, 738 when the stand element 106 is unlocked, such as by moving the unlocking mechanism 530 in the direction of arrow 842. In some embodiments, the locking projections 636, 738 can be biased inward or towards the unlocked positions, such that when the unlocking mechanism 530 is moved in the direction of arrow 842, the locking projections 636, 738 move into the unlocking recesses 844, 846 when the unlocking recesses 844, 846 are aligned with the locking projections 636, 738.

Referring now to FIG. 9, a partial cross-sectional view of the stand element shown in FIG. 8 in a locked position is shown in accordance with various embodiments herein. An unlocking mechanism 530 can include a plunger 953. An unlocking mechanism 530 can include a biasing member, such as a spring 950. The unlocking mechanism 530 can be biased in the direction of arrow 948. A user can move the unlocking mechanism 530 in the direction of arrow 842 by overcoming the biasing force of the spring 950, such as to align the unlocking recesses 844, 846 with the locking projections 636, 738. In some embodiments, the portions of the unlocking mechanism 530 that define the unlocking recesses 844, 846 can be sloped or curved to move the locking projections 636, 738 into the locked position as unlocking mechanism 530 is returned to its at rest or locked position (shown in FIG. 9).

In various embodiments, the connection element 218 can include one or more chamfered edges 951, such as to retain the projections 636, 738 in the connection element 218. The chamfered edges 951 can extend around each of the projections 636, 738.

Referring now to FIG. 10, a partial cross-sectional view of the stand element shown in FIG. 8 in an unlocked position accordance with various embodiments herein. Shown in FIG. 10, the unlocking mechanism 530 has been moved to the unlocked position aligning the locking projections 636, 738 with the unlocking recesses 844, 846. In the unlocked position, the locking projections 636, 738 are withdrawn from the locking recesses 1126, 1228 and the stand element 106, 108 is able to rotate and/or translate relative to the display screen 102.

Figure 11:
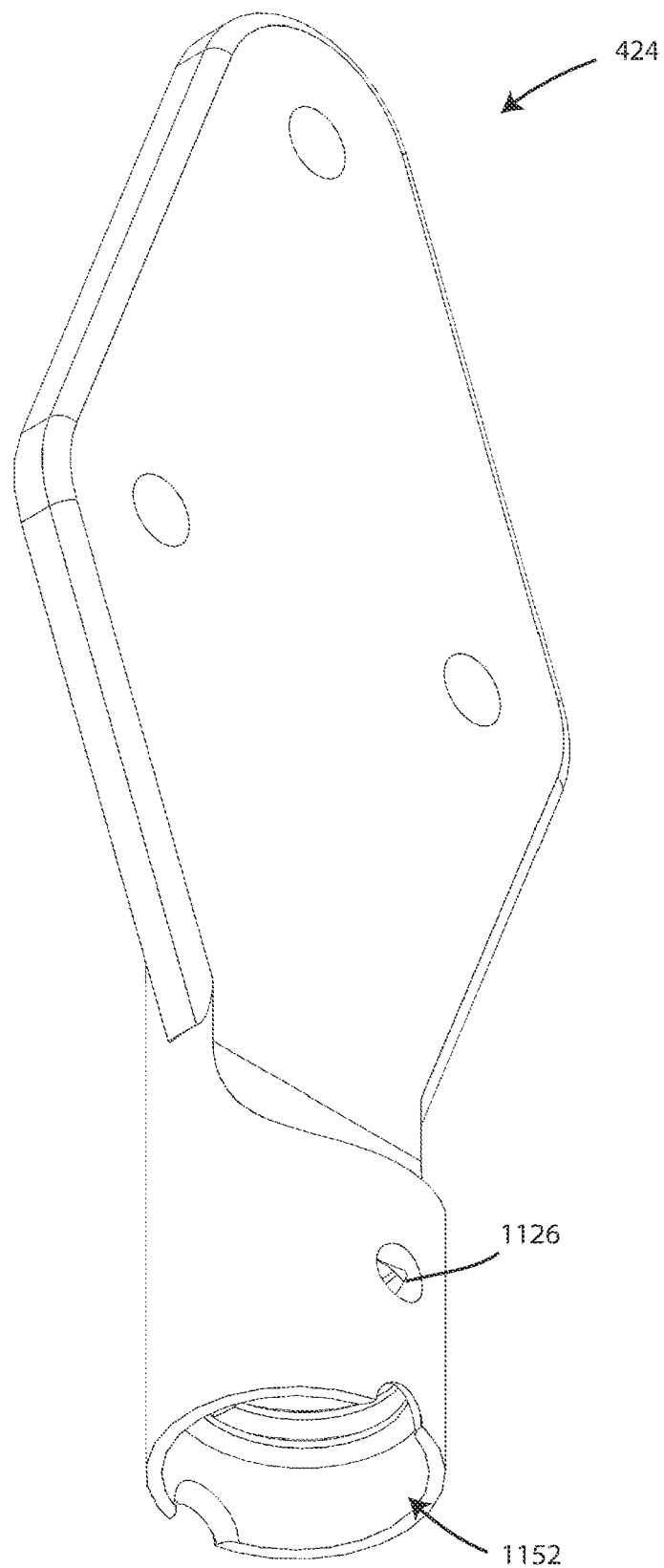
FIG. 11 is a perspective view of a receiving bracket in accordance with various embodiments herein.

Referring now to FIG. 11, a perspective view of a receiving bracket 424 is shown in accordance with various embodiments herein. A display screen system 100 can include one or more receiving brackets 424, such as one in each recess 210, 212, 214, 216. The receiving bracket 424 can define a connection element recess 1152 configured to receive at least a portion of the connection element 218. In various embodiments, the inner portion of the recesses 210, 212, 214, 216, such as the inner portion of the receiving bracket 424 that defines the connection element recess 1152, can be threaded. Similarly, the connection element 218 can be threaded, such that the connection element 218 can mate with the recess 210, 212, 214, 216.

Figure 12:
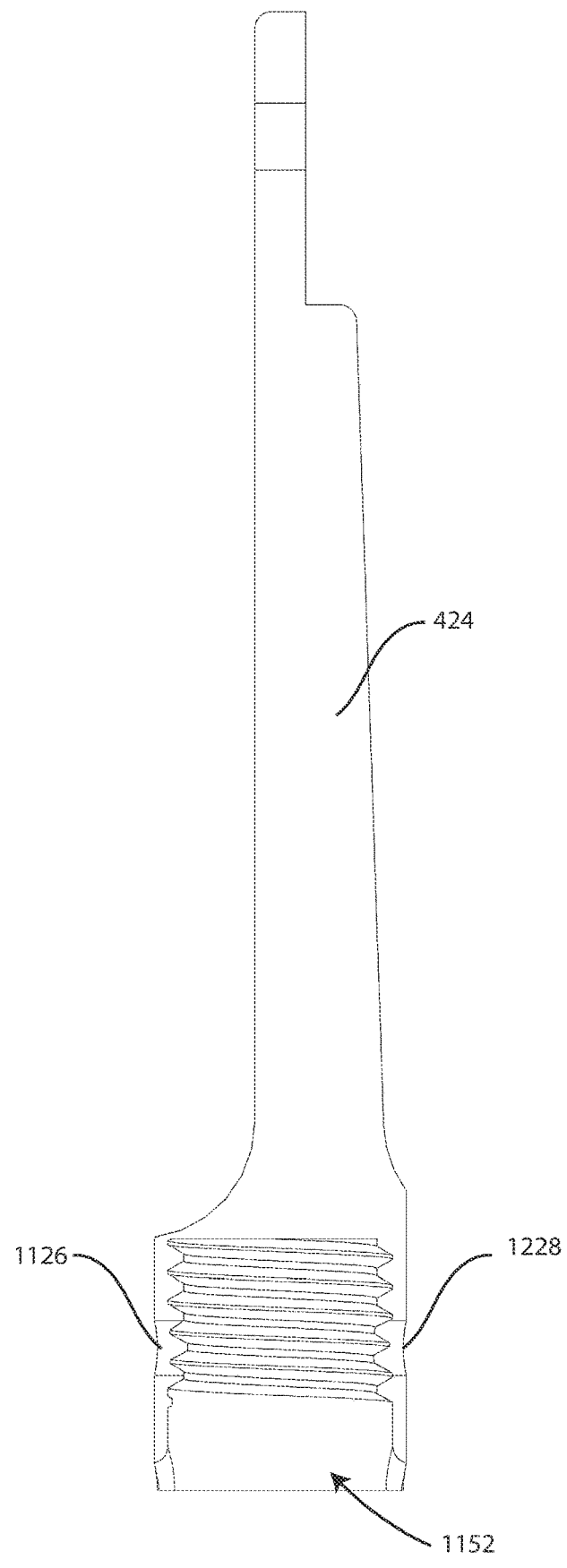
FIG. 12 is a side view of the receiving bracket shown in FIG. 11 in accordance with various embodiments herein.

Referring now to FIG. 12, a cross-sectional side view of the receiving bracket 424 shown in FIG. 11 is shown in accordance with various embodiments herein. The receiving bracket 424 includes a connection element recess 1152. The receiving bracket 424 can define the locking recesses 1126, 1228 that are configured to receive locking projections 636, 738 in the locked positions.

Figure 13:
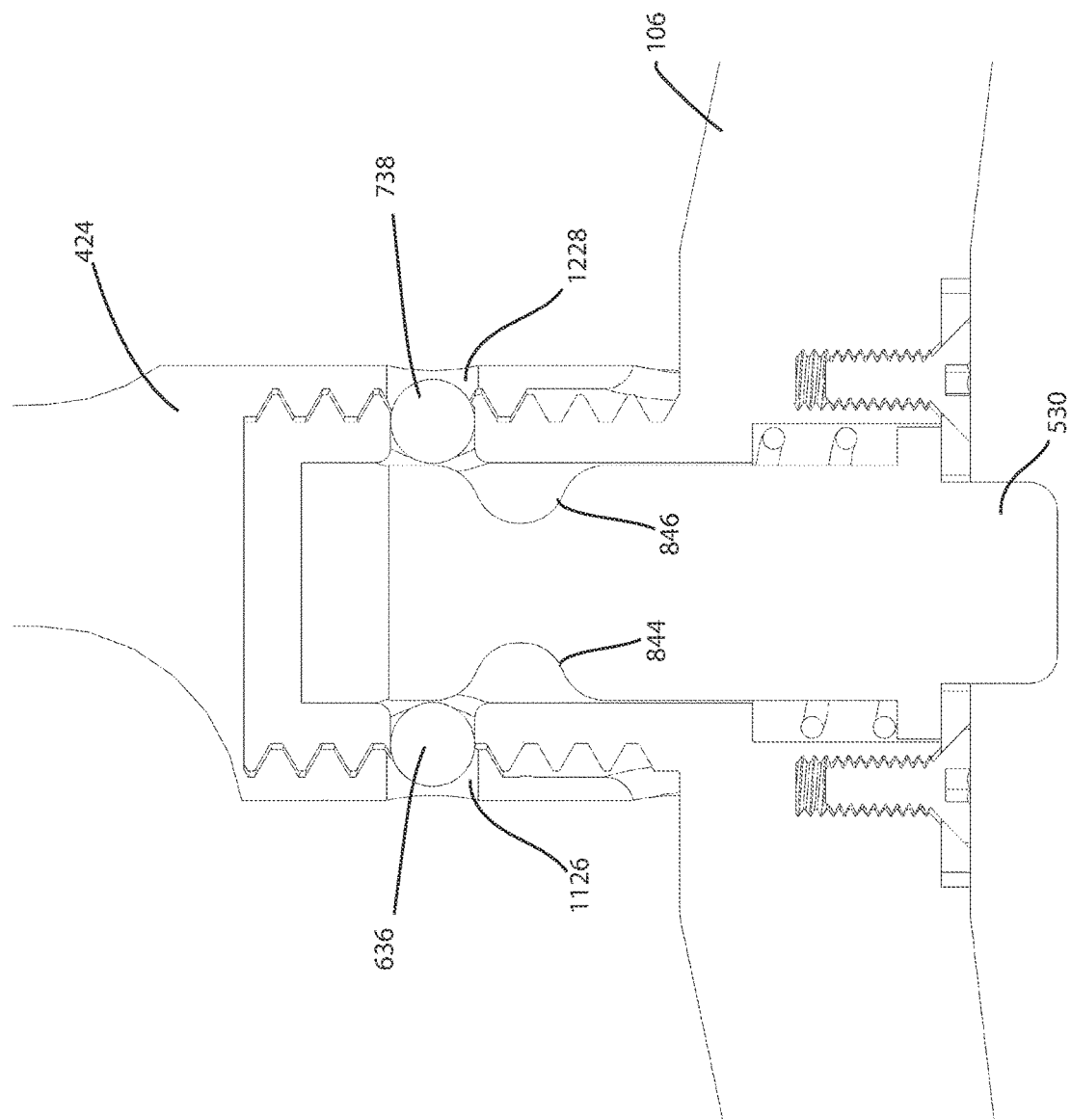
FIG. 13 is a cross-sectional view of a connection between a receiving bracket and a stand element in accordance with various embodiments herein.

Referring now to FIG. 13, a cross-sectional view of a connection between a receiving bracket 424 and a stand element 106 in the locked state is shown in accordance with various embodiments herein. FIG. 13 shows the locking projections 636, 738 within the locking recesses 1126, 1228 to prevent the stand element 106 from rotating or translating relative to the receiving bracket 424. As discussed above, to unlock and remove the stand element 106 from the receiving bracket 424, the unlocking mechanism can be pressed or moved to align the locking projections 636, 738 with the unlocking recesses 844, 846. With the locking projections 636, 738 within the unlocking recesses 844, 846, the stand element 106 can be rotated and/or translated relative to the receiving bracket, such as to remove the connection element 218 from the recess.

Referring now to FIG. 14, a perspective view of a display screen 102 in a wall mount configuration is shown in accordance with various embodiments herein. FIG. 14 shows a display screen system 100. The display screen system 100 includes a first stand element 106 and a second stand element 108. The back surface 220 defines a third recess 214 and a fourth recess 216. In various embodiments, in the wall mount configuration, the connection elements 218 of the stand elements 106, 108 are disposed within the recesses 214, 216, such as to couple the stand elements 106, 108 to the back surface 220 of the display screen 102. In various embodiments, the longitudinal axis 840 of the first stand element 106 and the longitudinal axis 840 of the second stand element 108 are substantially parallel in the wall mount configuration.

Figure 15:
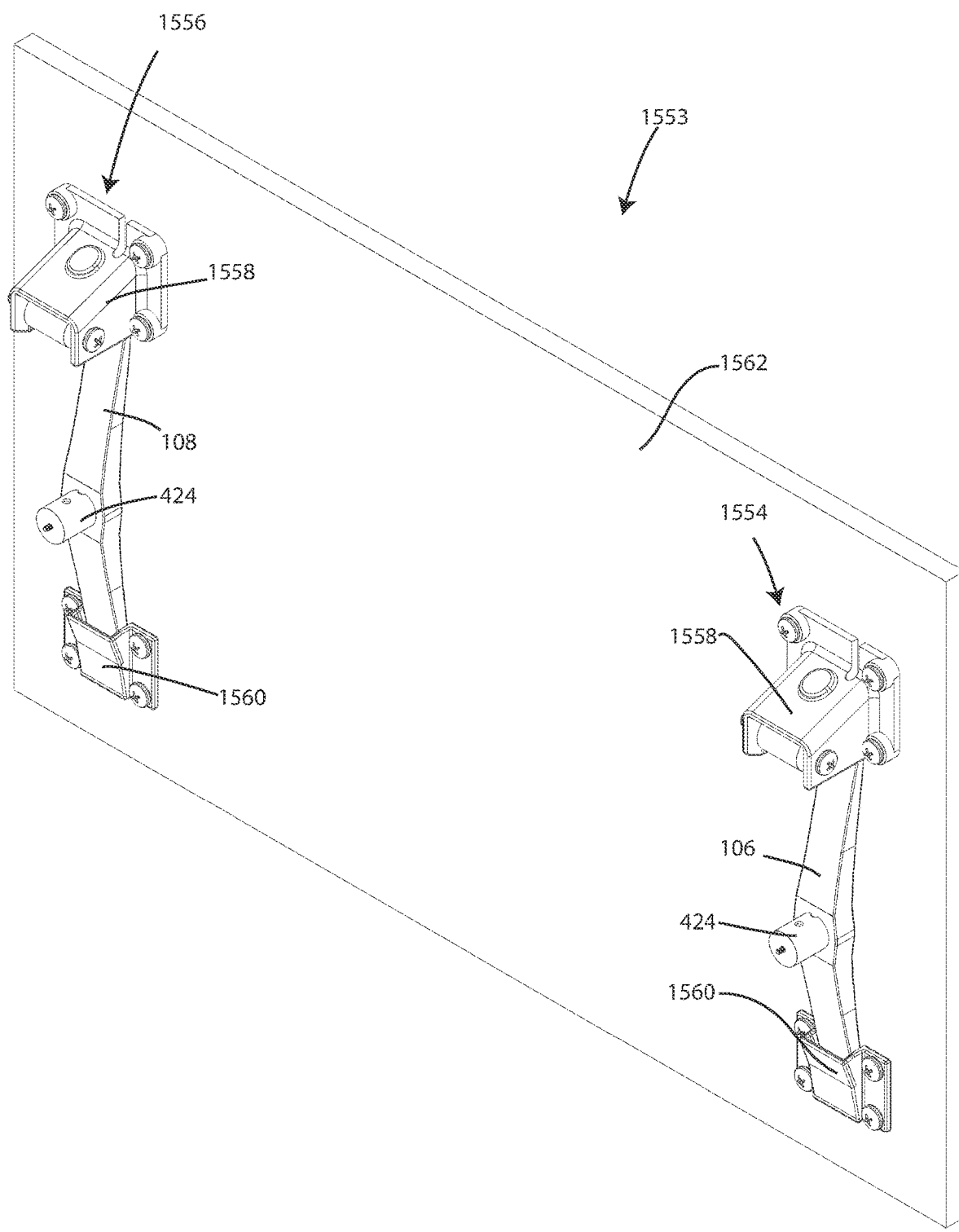
FIG. 15 is a perspective view of a wall mount configuration without the display screen in accordance with various embodiments herein.
Figure 16:
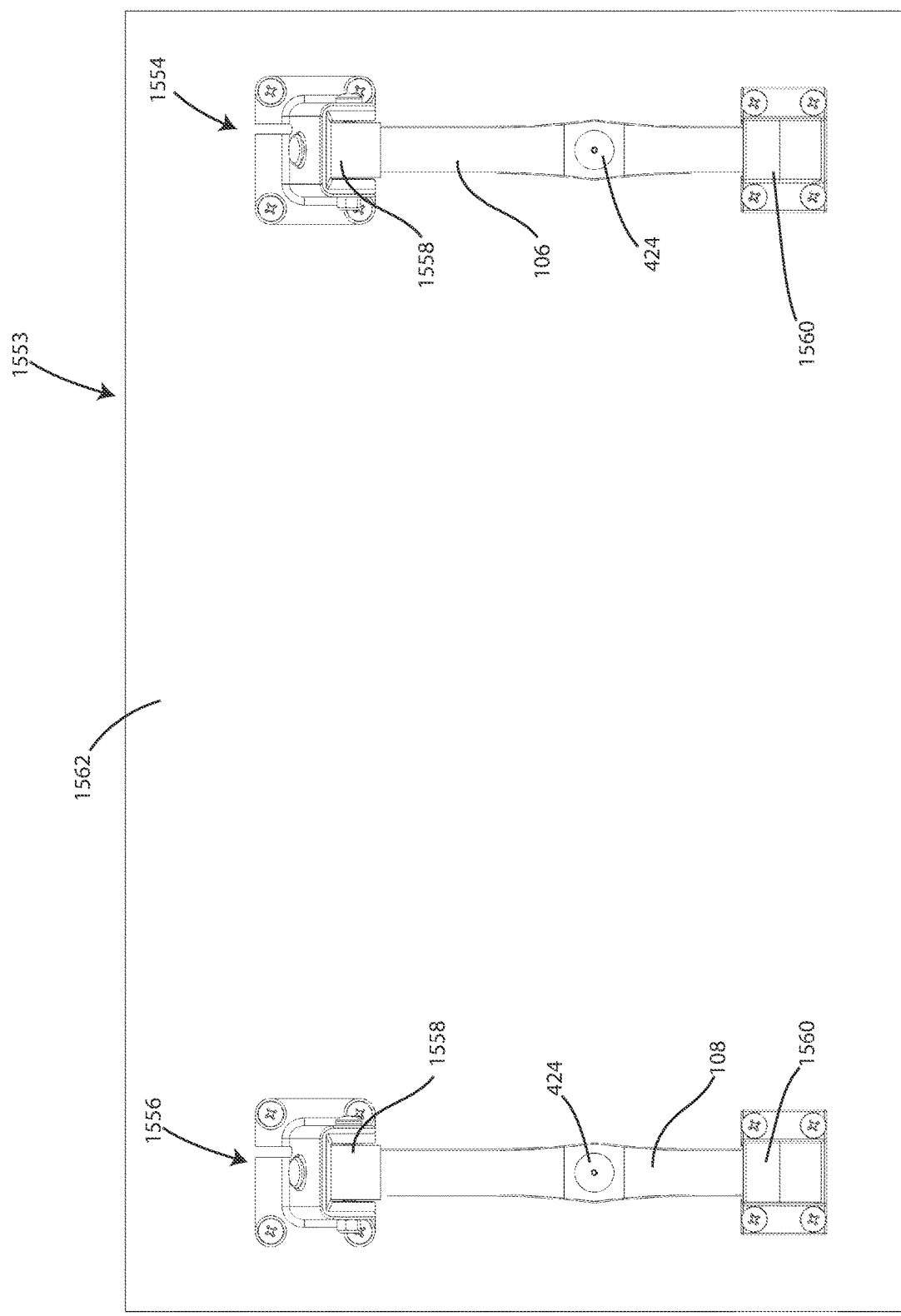
FIG. 16 is a front view of the wall mount configuration shown in FIG. 15 in accordance with various embodiments herein.
Figure 17:
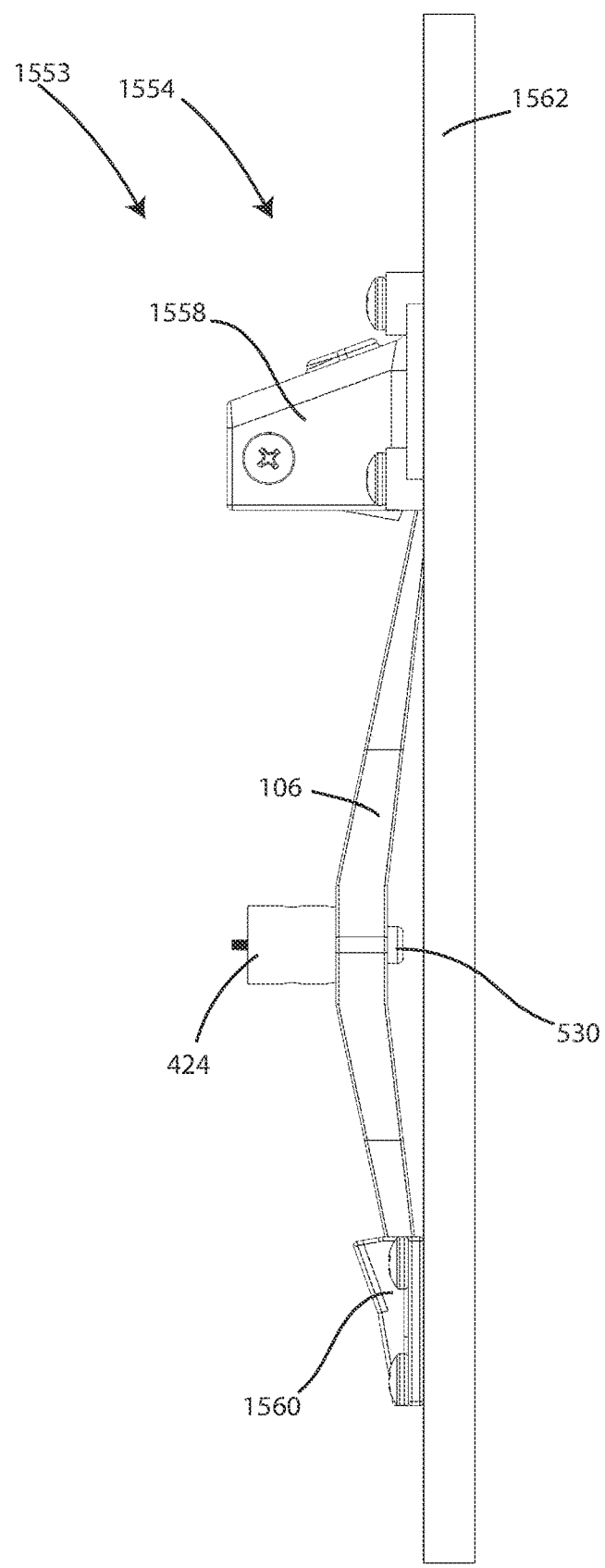
FIG. 17 is a side view of the wall mount configuration shown in FIG. 15 in accordance with various embodiments herein.

Referring now to FIG. 15, a perspective view of the wall mount configuration (without the display screen 102 for clarity) is shown in accordance with various embodiments herein. FIG. 16 shows a front view of the wall mount configuration in accordance with various embodiments herein. FIG. 17 shows a side view of the wall mount configuration in accordance with various embodiments herein. A display screen system 100 includes a display screen (not shown in these views), a first stand element 106, and a second stand element 108. The display screen system 100 can also include a receiving bracket 424 for each stand element 106, 108.

The display screen system 100 can include a wall mount 1553. The wall mount 1553 includes a first wall mount element 1554 and a second wall mount element 1556. The first wall mount element 1554 includes a top receiving clamp 1558 and a bottom receiving cup 1560. Similarly, the second wall mount element 1556 includes a top receiving clamp 1558 and a bottom receiving cup 1560.

In various embodiments, the bottom receiving cup 1560 configured to receive the second end 634 of a stand element and the top receiving clamp 1558 is configured to receive and hold/retain the first end 632 of the stand element. FIG. 15 shows a wall or surface 1562 which the first and second wall mount elements 1554, 1556 can be coupled to.

In various embodiments, to couple the display screen 102 to the wall or surface 1562, the second end 634 of each of the stand elements 106, 108 can be inserted into one of the bottom receiving cups 1560. The bottom receiving cups 1560 can be configured to support the display screen 102, such as with the second ends 634 of the stand elements 106, 108 disposed within the bottom receiving cups 1560 and without the first ends 632 of the stand elements 106, 108 being retained in the top receiving clamps 1558. With the second ends 634 disposed in the bottom receiving cups 1560, the display screen 102 can be angled away from the wall, such that the top surface of the display screen 102 is further way from the wall than the bottom surface of the display screen 102. The display screen 102 can then be rotated relative to the wall or surface 1562 to move the first ends 632 of the stand elements 106, 108 into the top receiving clamps 1558. In some embodiments, the top receiving clamps 1558 can be spring-loaded clamps. The clamps can retain or hold the first ends 632 of the stand elements 106, 108, such as to prevent the display screen 102 from moving away from the wall or surface 1562. In various embodiments, the clamp of the first wall mount element 1554 can include a pull release configured to release the clamp, and the clamp of the second wall mount element 1556 can include a pull release configured to release the clamp.

Figure 18:
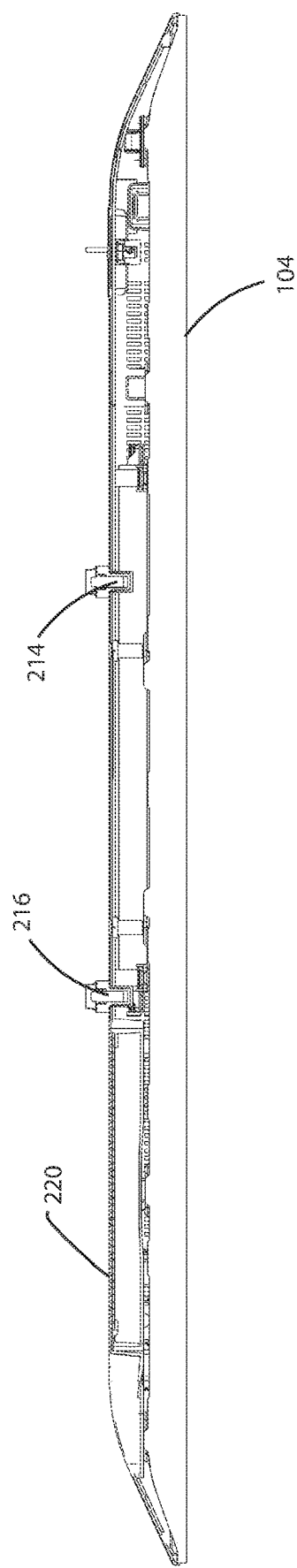
FIG. 18 is a cross-sectional view of a display screen in accordance with various embodiments herein.
Figure 19:
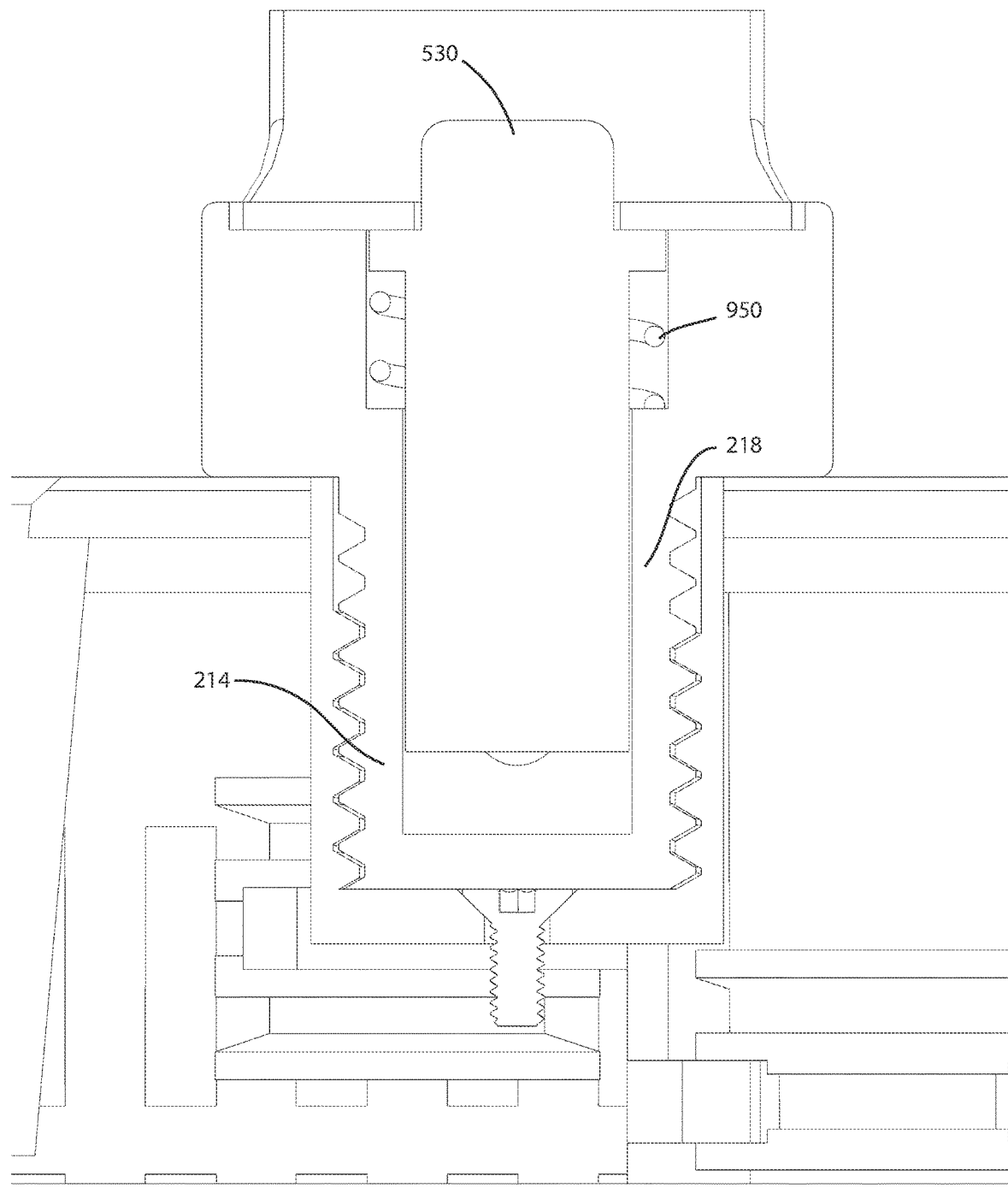
FIG. 19 is a partial cross-sectional view of the display screen shown in FIG. 18 in accordance with various embodiments herein.

Referring now to FIGS. 18 and 19, a cross-sectional view of a display screen 102 is shown in FIG. 18 and a close up is shown in FIG. 19 in accordance with various embodiments herein. A back surface 220 includes a third recess 214 and a fourth recess 216 configured to receive a connection element 218 from a stand element 106, 108.

Figure 20:
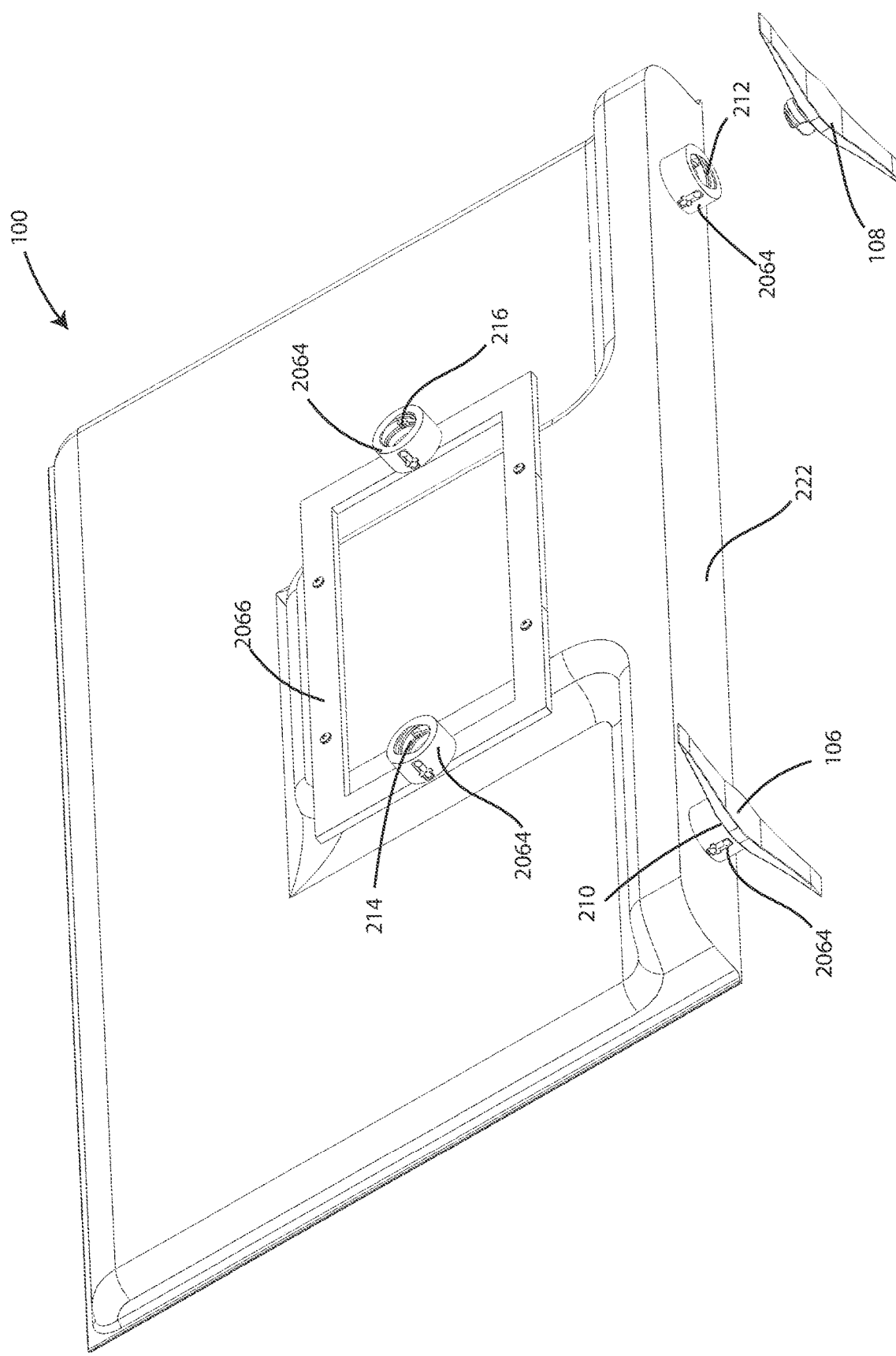
FIG. 20 is a perspective view of a display screen with two stand elements in accordance with various embodiments herein.

Referring now to FIG. 20, a perspective view of a display screen 102 with two stand elements 106, 108 is shown in accordance with various embodiments herein. FIG. 20 shows a display screen system 100. The display screen system 100 includes a first stand element 106 and a second stand element 108. The display screen system 100 also includes an adapter 2064. In some embodiments, the display screen system 100 can include a plurality of adapters. In some embodiments, the display screen system 100 can include two adapters 2064, such as one for each stand element, or four adapters, such as one for each recess. In some embodiments, the display screen system 100 can further include a wall mount bracket 2066.

An adapter 2064 can be configured to provide a linkage or connection between the display screen 102 and a stand element 106, 108. In various embodiments, an adapter 2064 can be coupled to the display screen 102 and provide a location for a stand element 106, 108 to be coupled to the display screen 102. In some embodiments, a stand element 106, 108 can be coupled to an adapter 2064 without the use of any tools. In various embodiments, an adapter 2064 can be coupled to the display screen 102 using a connector, such as a screw or bolt. In some embodiments, an adapter 2064 can be coupled to the display screen 102 by inserting a portion of the adapter 2064 into a recess defined by the display screen 102.

In some embodiments, an adapter 2064 can be coupled to a bracket, and the bracket can be coupled to the display screen 102, such as by utilizing apertures that exist in the display screen 102. In various embodiments, a wall mount bracket 2066 can be coupled to the back surface 220 of the display screen 102, such as by utilizing the VESA (video electronics standard association) mount screw apertures in the display screen 102. One or more adapters 2064 can be coupled to the wall mount bracket 2066, such as shown in FIG. 20.

In various embodiments, the adapters 2064 can define the recesses 210, 212, 214, 216 for receiving the connection element 218 of a stand element 106, 108 thereby coupling the stand element 106, 108 to the adapter 2064 and display screen 102. In some embodiments, the display screen system 100 can include four adapters 2064, such as shown in FIG. 20. Each of the four adapters 2064 can be located in a desired location for coupling a stand element 106, 108 to the display screen. Each of the four adapters 2064 can define one of the four recesses 210, 212, 214, 216.

In other embodiments, the display screen system 100 can include two adapters 2064. The two adapters 2064 can be coupled to a bottom surface 222 to configure the display screen system 100 in a table top configuration, or each of the two adapters 2064 can be coupled to the back surface 220 to configure the display screen system 100 in a wall mount configuration. The adapters 2064 can be moved between the bottom surface 222 and the back surface 220 depending on the desired configuration.

In various embodiments, a longitudinal axis 840 the first stand element 106 and a longitudinal axis 840 of the second stand element 108 define a first plane in the table top configuration and define a second plane in the wall mount 1553 configuration, the first plane is perpendicular to the second plane, such that the configuration of the stand elements 106, 108 in relation to the display screen 102 are rotated 90° between the two configurations.

In various embodiments, in the table top configuration, the first stand element 106 and the second stand element 108 are configured to attach to a display screen 102 so that the first and second ends of the first stand element 106 and the first and second ends of the second stand element 108 are disposed below a display screen 102 to support the display screen 102 on a surface. In various embodiments, in the wall mount configuration, the first stand element 106 and the second stand element 108 are configured to attach to the display screen 102 such that the first and second ends of the first stand element 106 and the first and second ends of the second stand element 108 are disposed behind the display screen 102.

Figure 21:
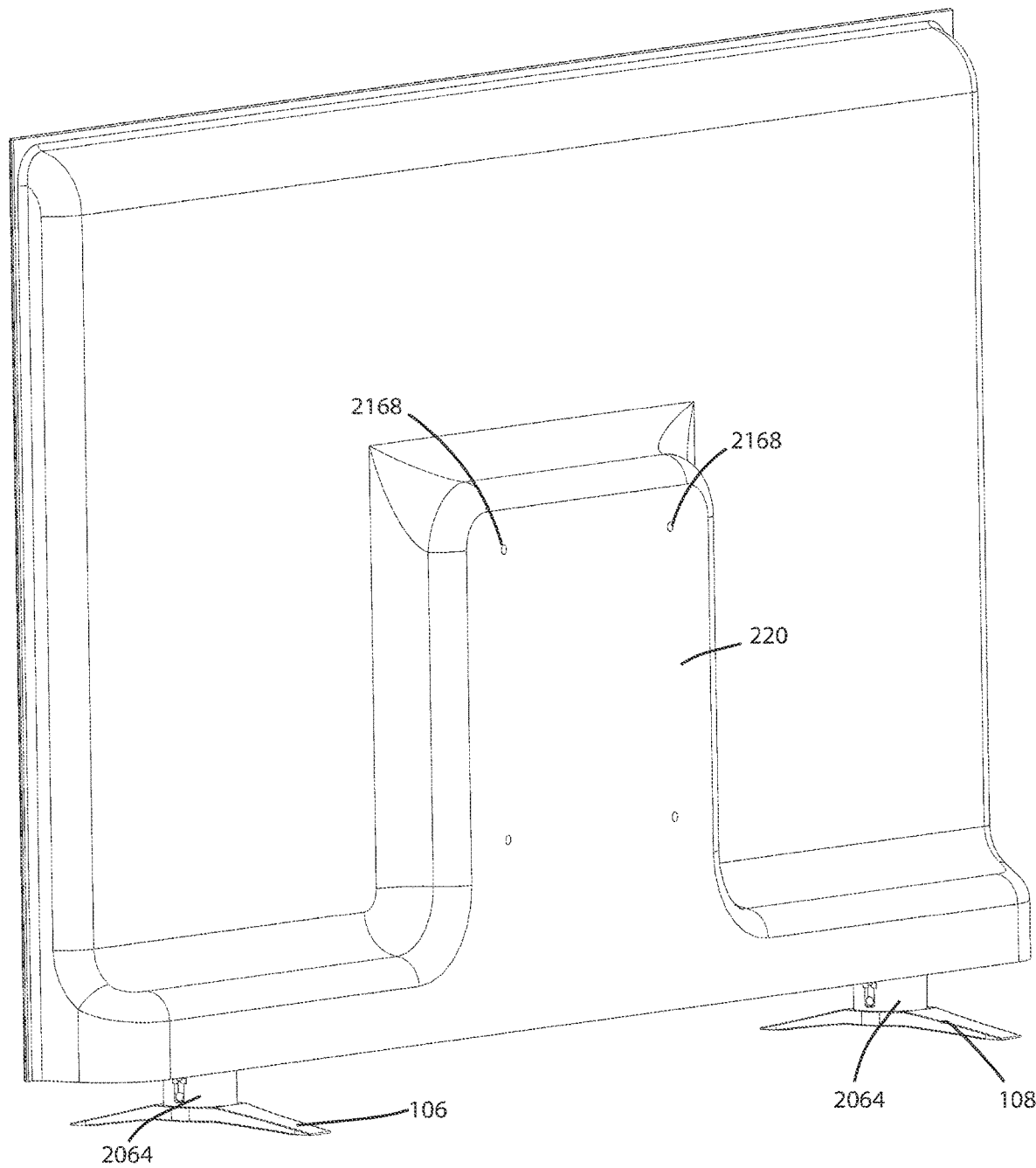
FIG. 21 is a perspective view of a display screen in a table top configuration in accordance with various embodiments herein.

Referring now to FIG. 21, a perspective view of a display screen 102 in a table top configuration is shown in accordance with various embodiments herein. In various embodiments, the back surface 220 of the display screen 102 can define a plurality of VESA mount apertures 2168. The VESA mount apertures 2168 can be used to couple the wall mount bracket 2066 to the display screen 102 to assemble the display screen system 100 in a wall mount configuration.

The display screen system 100 can include a first stand element 106, a second stand element 108, and two adapters 2064. In various embodiments, in the table top configuration, the two adapters 2064, 2064 are coupled to a bottom surface 222 of the display screen 102. In various embodiments, a longitudinal axis 840 of the first stand element 106 and a longitudinal axis 840 of the second stand element 108 are substantially parallel in the table top configuration.

Figure 22:
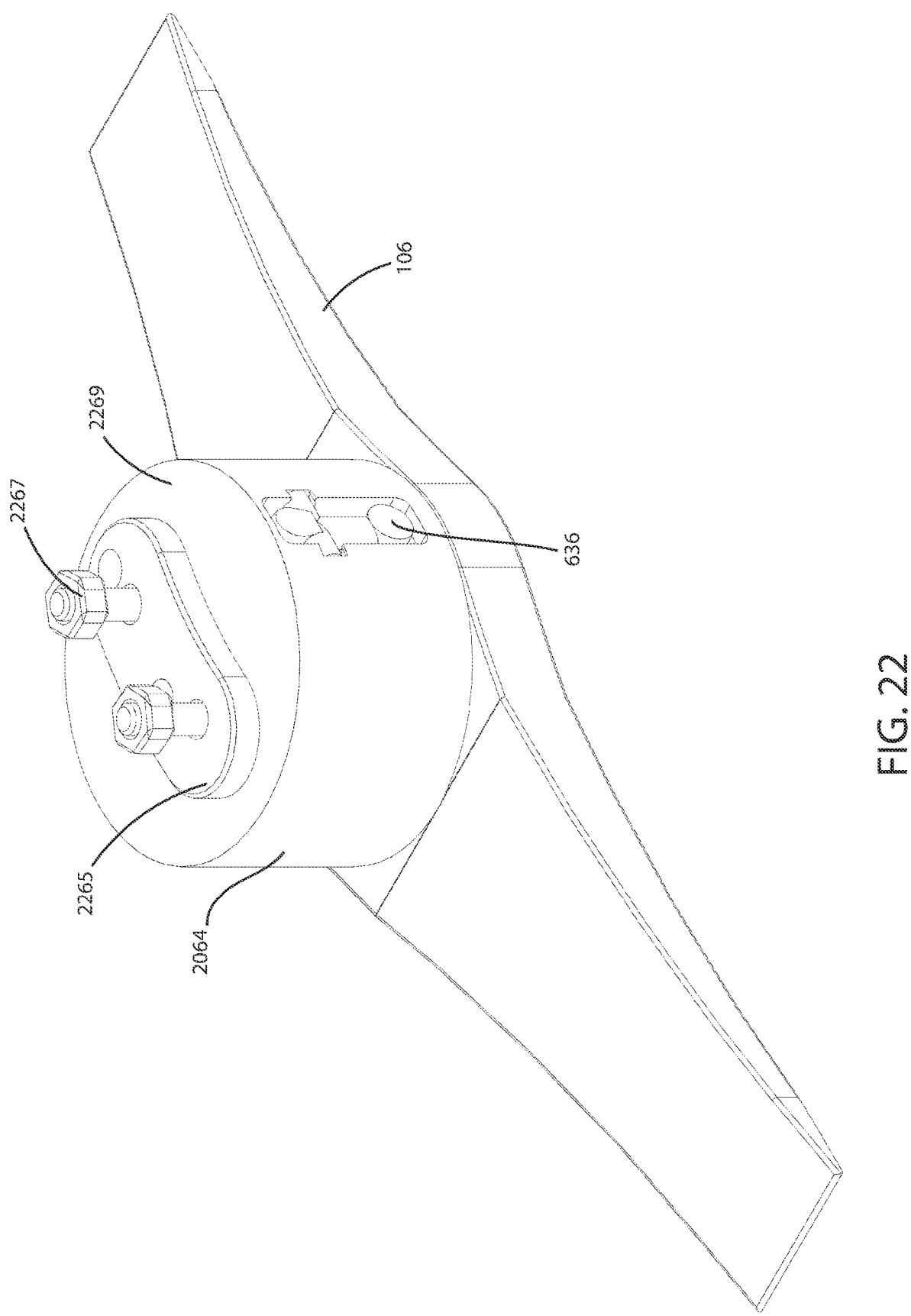
FIG. 22 is a perspective view of a stand element coupled to an adapter in accordance with various embodiments herein.
Figure 23:
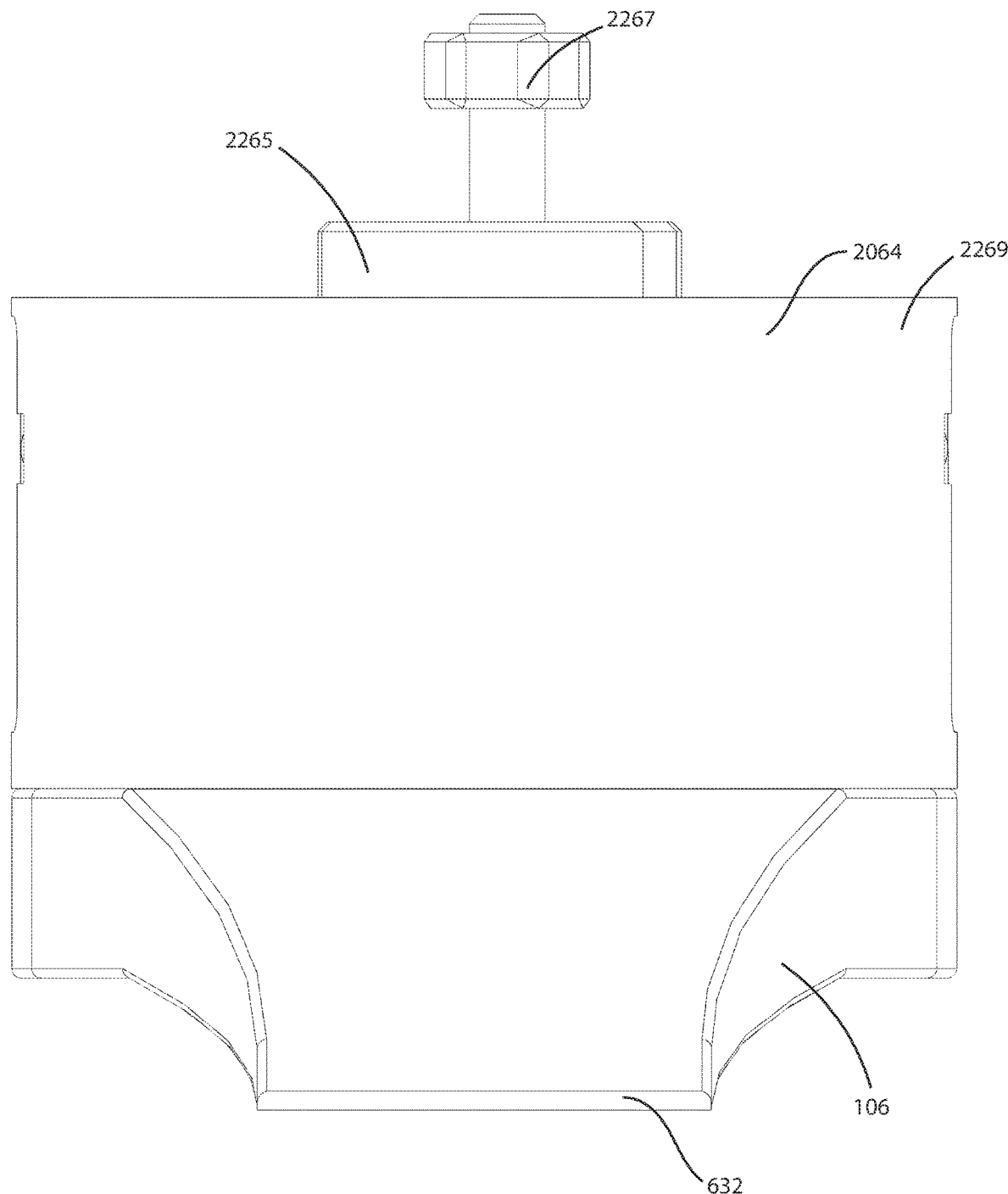
FIG. 23 is a side view of the stand element coupled to the adapter shown in FIG. 22 in accordance with various embodiments herein.

Referring now to FIGS. 22 and 23, FIG. 22 shows a perspective view of a stand element 106 coupled to an adapter 2064 and FIG. 23 shows an end view of the stand element 106 coupled to the adapter 2064 in accordance with various embodiments herein. In various embodiments, a stand element 106 can include a connection element 218 (not shown in this view). In some embodiments, the connection element 218 can be disposed within a recess 210 of an adapter 2064 to couple the stand element 106 to the adapter 2064.

In various embodiments, the adapter 2064 can include an adapter projection 2265 and one or more adapter coupling elements 2267. The adapter projection 2265 and the adapter coupling elements 2267 can couple the adapter 2064 to the display screen 102, either directly or indirectly, such as via the wall mount bracket 2066.

The adapter 2064 can include a first moveable locking projection 636. The first moveable locking projection 636 can be configured to move relative to the adapter housing 2269. In some embodiments, the locking projection 636 can rotate relative to the adapter housing 2269. In some embodiments, the locking projection 636 can translate relative to the adapter housing 2269. The locking projection 636 can be configured to move between a locked position and an unlocked position. In the locked position, the locking projection 636 can be disposed, at least partially, within a recess defined by the connection element 218 of the stand element 106. In the locked position, the stand element 106 can be secured to the adapter 2064, such that the stand element 106 cannot rotate, translate, or otherwise move relative to the adapter 2064.

It should be understood that in various embodiments, the arrangement of the locking projections and the locking recesses shown in the figures can be reversed. For example, in some embodiments of the display screen system 100, the stand elements 106, 108 can include the locking projections 636, 738, and the adapter 2064 or display screen 102 can define the locking recesses 1126, 1228, such as described in FIGS. 2-19. Similarly, the opposite can be true as well, in some embodiments, the stand element 106, 108 can define the locking recesses 1126, 1228, and the adapter 2064 or display screen 102 can include the locking projections 636, 738, such as shown in FIGS. 20-34.

Figure 24:
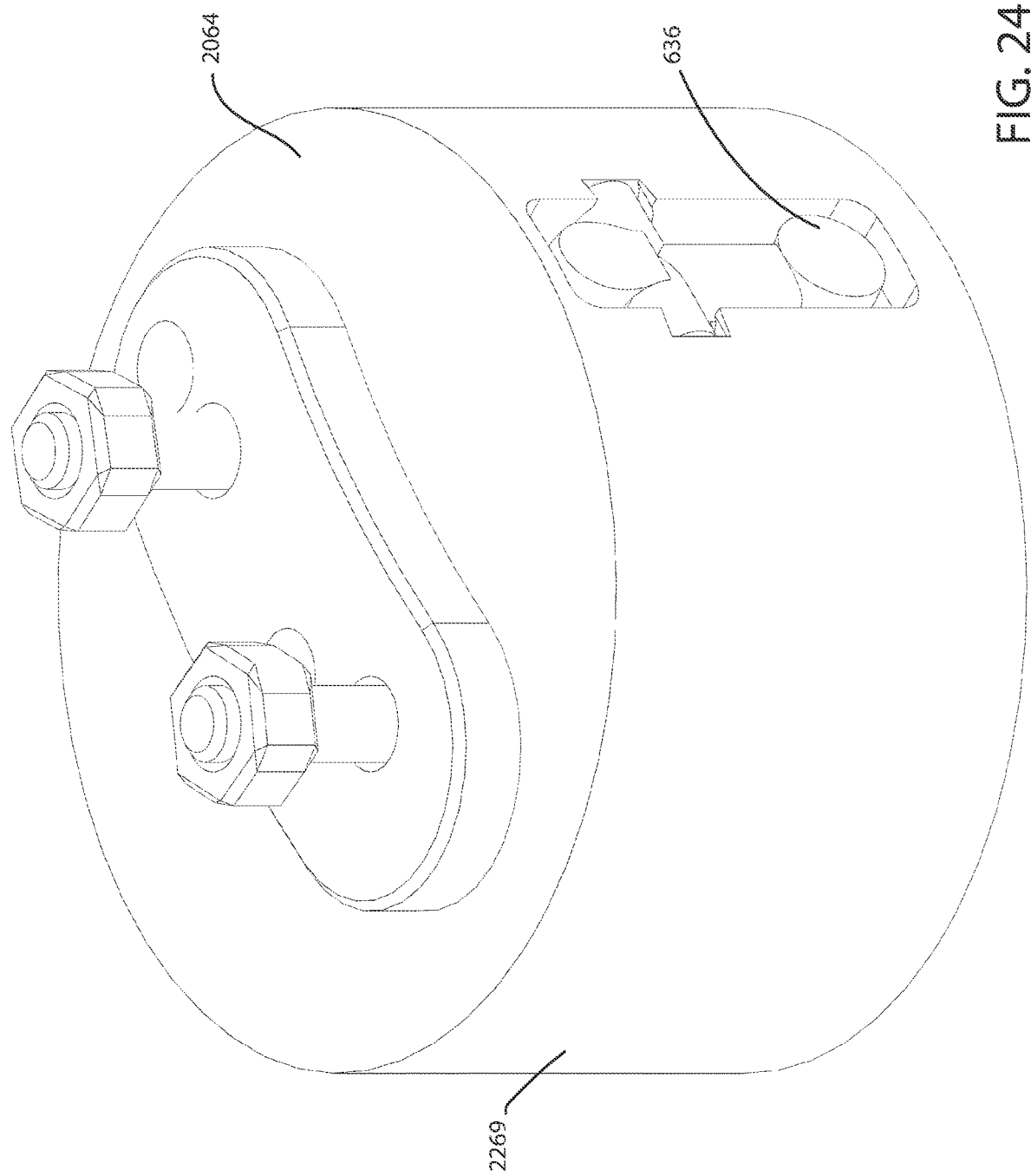
FIG. 24 is a perspective view of an adapter in accordance with various embodiments herein.

Referring now to FIG. 24, a perspective view of an adapter 2064 is shown in accordance with various embodiments herein. The adapter 2064 can include a first moveable locking projection 636. In some embodiments, the adapter 2064 can include a second moveable locking projection 738 (show in FIG. 25). The locking projections 636, 738 can be moveable relative to the adapter housing 2269.

The locking projections 636, 738 can be configured to move between a locked position and an unlocked position. In the locked position, the locking projections 636, 738 can be disposed, at least partially, within a locking recess 1126, 1228 defined by the stand element 106, 108, such as defined by a connection element 218 of a stand element 106, 108, to prevent rotation of the stand element 106, 108 relative to the adapter 2064.

Figure 25:
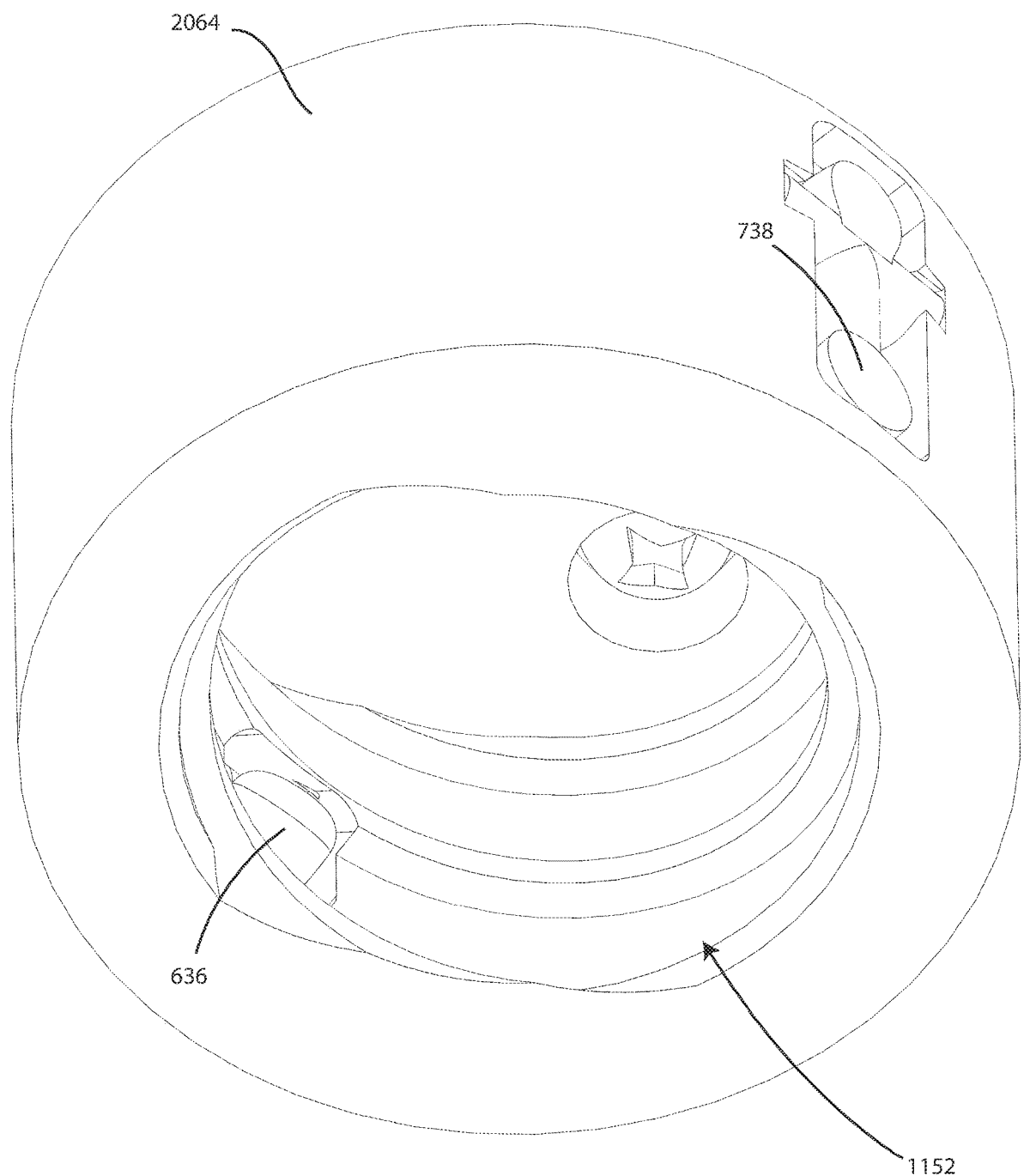
FIG. 25 is a bottom perspective view of the adapter shown in FIG. 24 in accordance with various embodiments herein.

Referring now to FIG. 25, a bottom perspective view of the adapter 2064 shown in FIG. 24 is shown in accordance with various embodiments herein. In various embodiments, the adapter 2064 can include a first moveable locking projection 636 and a second moveable locking projection 738. In some embodiments, the first moveable locking projection 636 can be located opposite from the second moveable locking projection 738. In various embodiments, in the locked position, the first moveable locking projection 636 can be configured to be at least partially disposed within a first locking recess 1126 and the second moveable locking projection 738 can be configured to be at least partially disposed within a second locking recess 1228.

The adapter housing 2269 can define a connection element recess 1152 configured to receive the connection element 218 from a stand element 106, 108. In various embodiments, the adapter housing 2269 can include threads on the portion that defines the connection element recess 1152. The threads can be configured to mate with a threaded connection element 218 of a stand element 106, 108. The threaded connection can couple the stand element 106, 108 with the adapter 2064. The moveable locking projections 636, 738 can lock the stand element 106, 108 with the adapter 2064.

Figure 26:
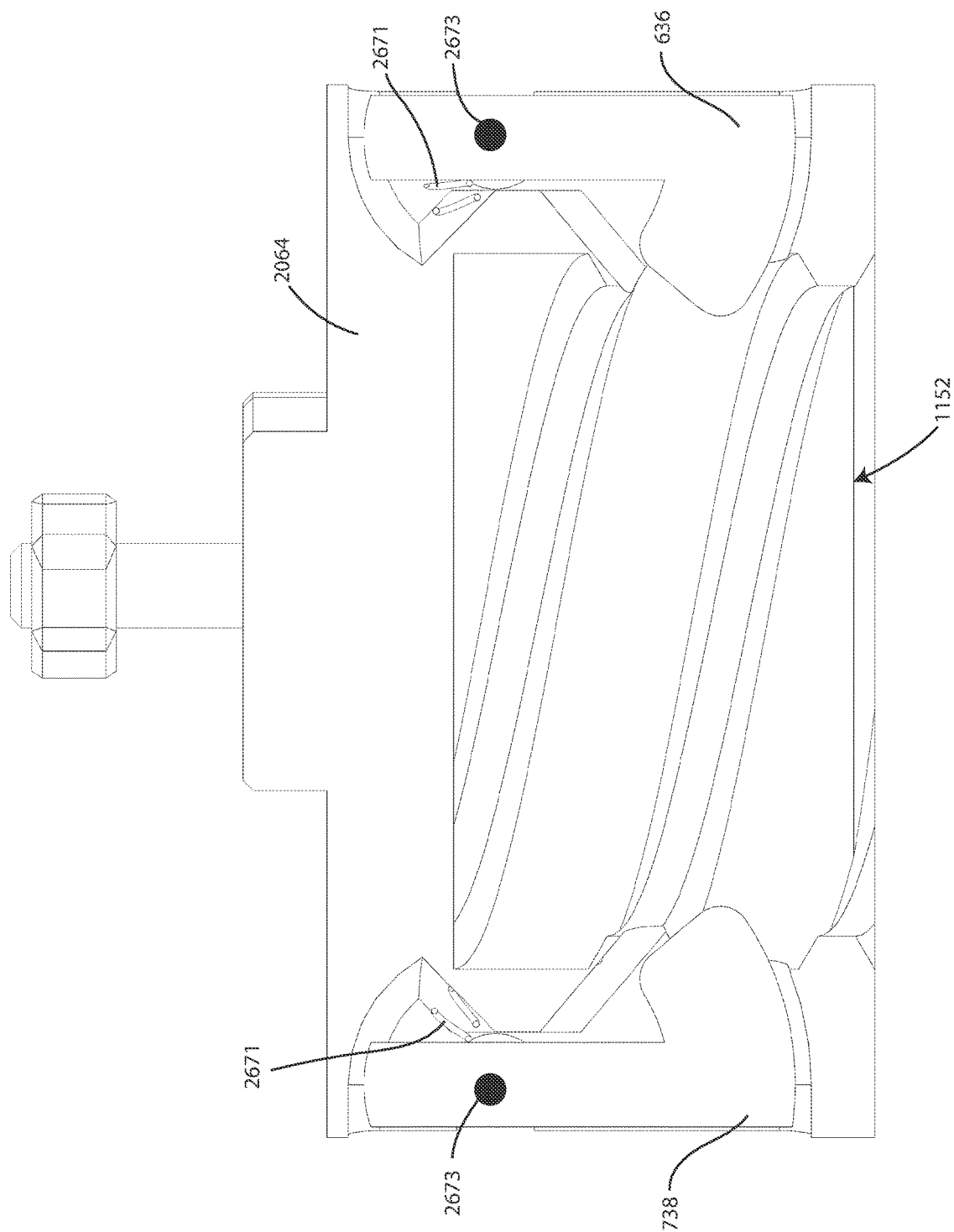
FIG. 26 is a cross-sectional view of the adapter shown in FIG. 24 in accordance with various embodiments herein.

Referring now to FIG. 26, a cross-sectional view of the adapter 2064 shown in FIG. 24 is shown in accordance with various embodiments herein. The first moveable locking projection 636 and second moveable locking projection 738 are shown in the locked position. In the locked position, at least a portion of the locking projection 636, 738 extends into the recess 1152, such that the locking projection 636, 738 can extend into a locking recess 1126, 1228 of the stand element 106, 108.

In various embodiments, the first moveable locking projection 636 and second moveable locking projection 738 are biased into the locked position, such as by springs 2671. The first moveable locking projection 636 and second moveable locking projection 738 can pivot or rotate around an axis 2673. To move the first moveable locking projection 636 and second moveable locking projection 738 into the unlocked position a portion of the first moveable locking projection 636 and second moveable locking projection 738 above the axis 2673 can be pressed inwards to overcome the spring force from spring 2671 and withdraw the first moveable locking projection 636 and second moveable locking projection 738 from the recess 1152. Upon releasing the top portion of the first moveable locking projection 636 and second moveable locking projection 738, the first moveable locking projection 636 and second moveable locking projection 738 can return to the locked position as a result of the spring 2671.

Figure 27:
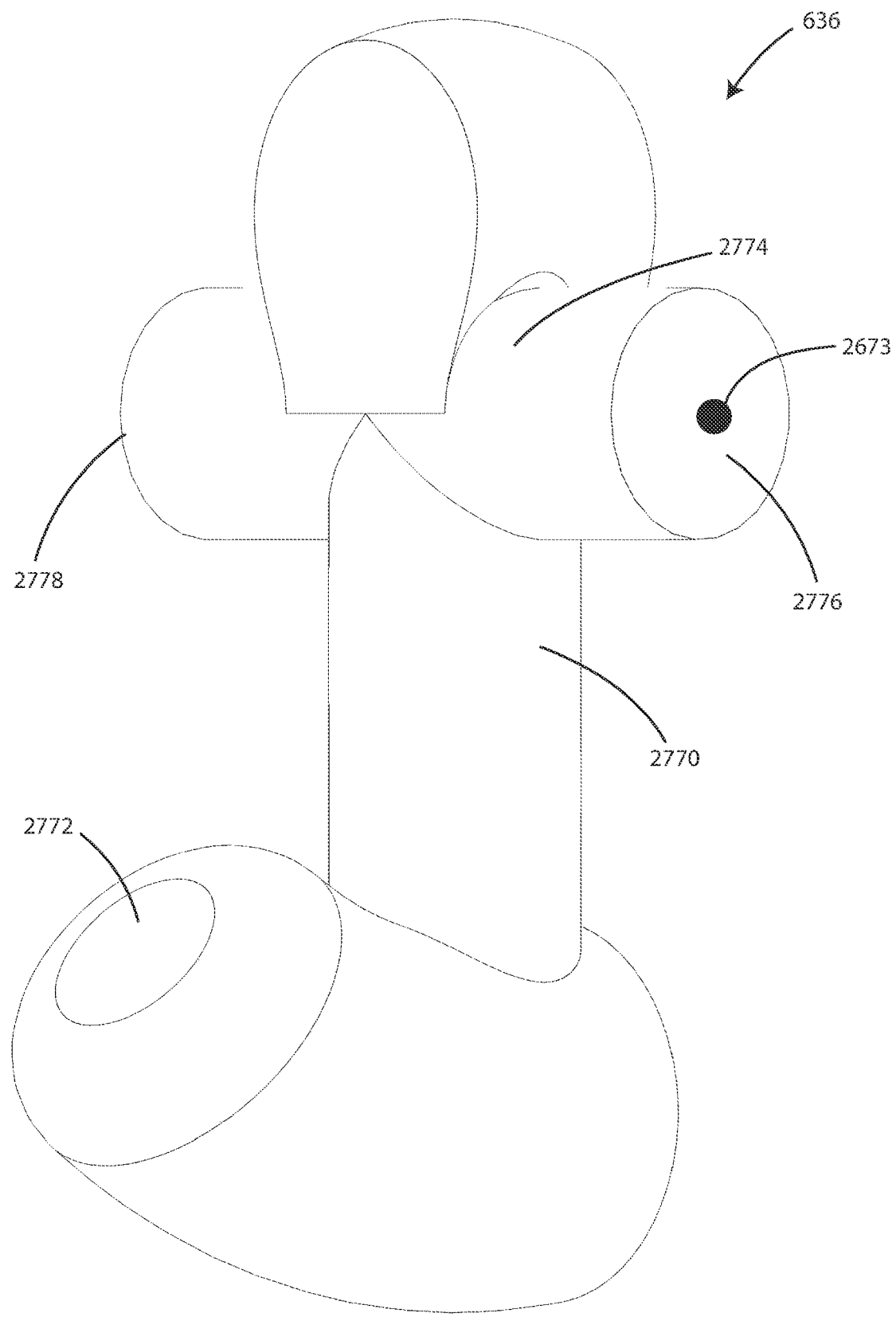
FIG. 27 is a perspective view of a locking projection in accordance with various embodiments herein.

Referring now to FIG. 27, a perspective view of a locking projection 636 is shown in accordance with various embodiments herein. It should be understood that the locking projection 636 shown in FIG. 27 can also represent a locking projection 738.

The locking projection 636 can include a vertical body 2770. The locking projection 636 can also include a pin 2772. In the locked position, the pin 2772 can be disposed within the recess 1126, 1228 defined by the stand element 106, 108. The locking projection 636 can also include a cross-member 2774. The cross-member 2774 can include a first arm 2776 and a second arm 2778, which can provide the pivot point or the axis 2673 of rotation for the locking projection 636.

Figure 28:
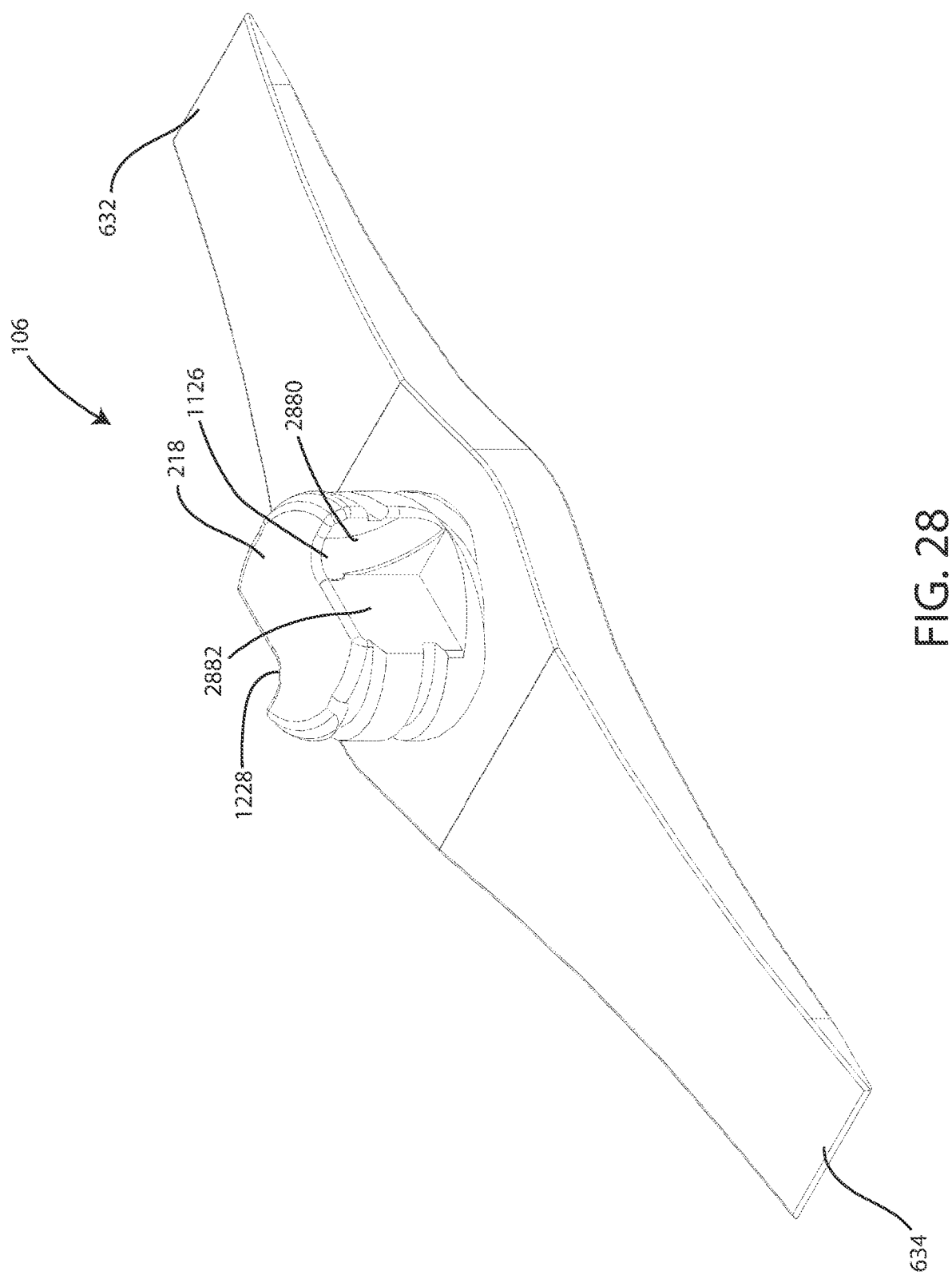
FIG. 28 is a perspective view of a stand element in accordance with various embodiments herein.

Referring now to FIG. 28, a perspective view of a stand element 106 is shown in accordance with various embodiments herein. It should be understood that the stand element 106 shown in FIG. 28 can also represent the stand element 108. A display screen system 100 includes a stand element 106. The stand element 106 includes a connection element 218. The stand element 106 includes a first end 632 and a second end 634. The connection element 218 can be disposed between the first end 632 and the second end 634.

The connection element 218 can be configured to mate with an adapter 2064 to couple the stand element 106 with the adapter 2064. The connection element 218 can define a first locking recess 1126 and a second locking recess 1228. The locking recesses 1126, 1228 can be configured to receive a portion of the locking projections 636, 738 in the locked position. The locking recesses 1126, 1228 can be defined by a stop surface 2880 and a release surface 2882. The stop surface 2880 can contact the portion of the locking projection 636, 738 that extends into the locking recess 1126, 1228 to prevent rotation of the stand element 106, 108 relative to the adapter 2064. The release surface 2882 can be positioned to provide space between the connection element 218 and the locking projection 636, 738 in the unlocked position to allow the stand element 106, 108 to rotate relative to the adapter 2064.

Figure 29:
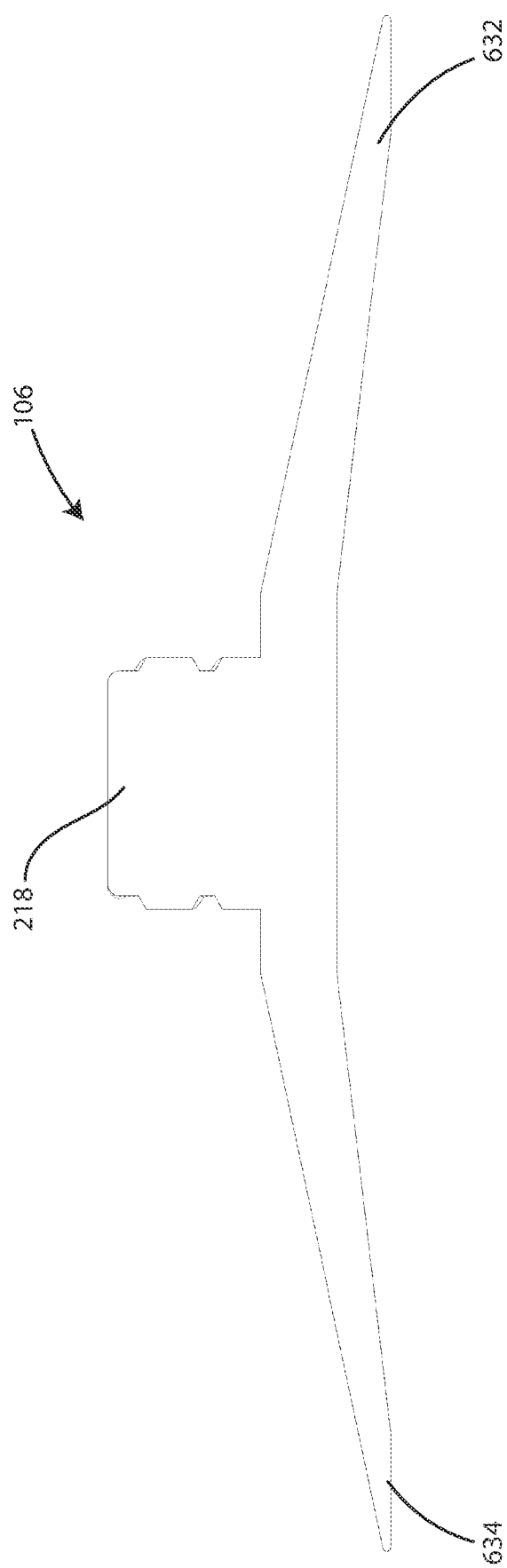
FIG. 29 is a cross-sectional view of the stand element shown in FIG. 28 in accordance with various embodiments herein.

Referring now to FIG. 29, a cross-sectional view of the stand element 106 shown in FIG. 28 is shown in accordance with various embodiments herein. The stand element 106 can include a connection element 218 disposed between the first end 632 and the second end 634.

Figure 30:
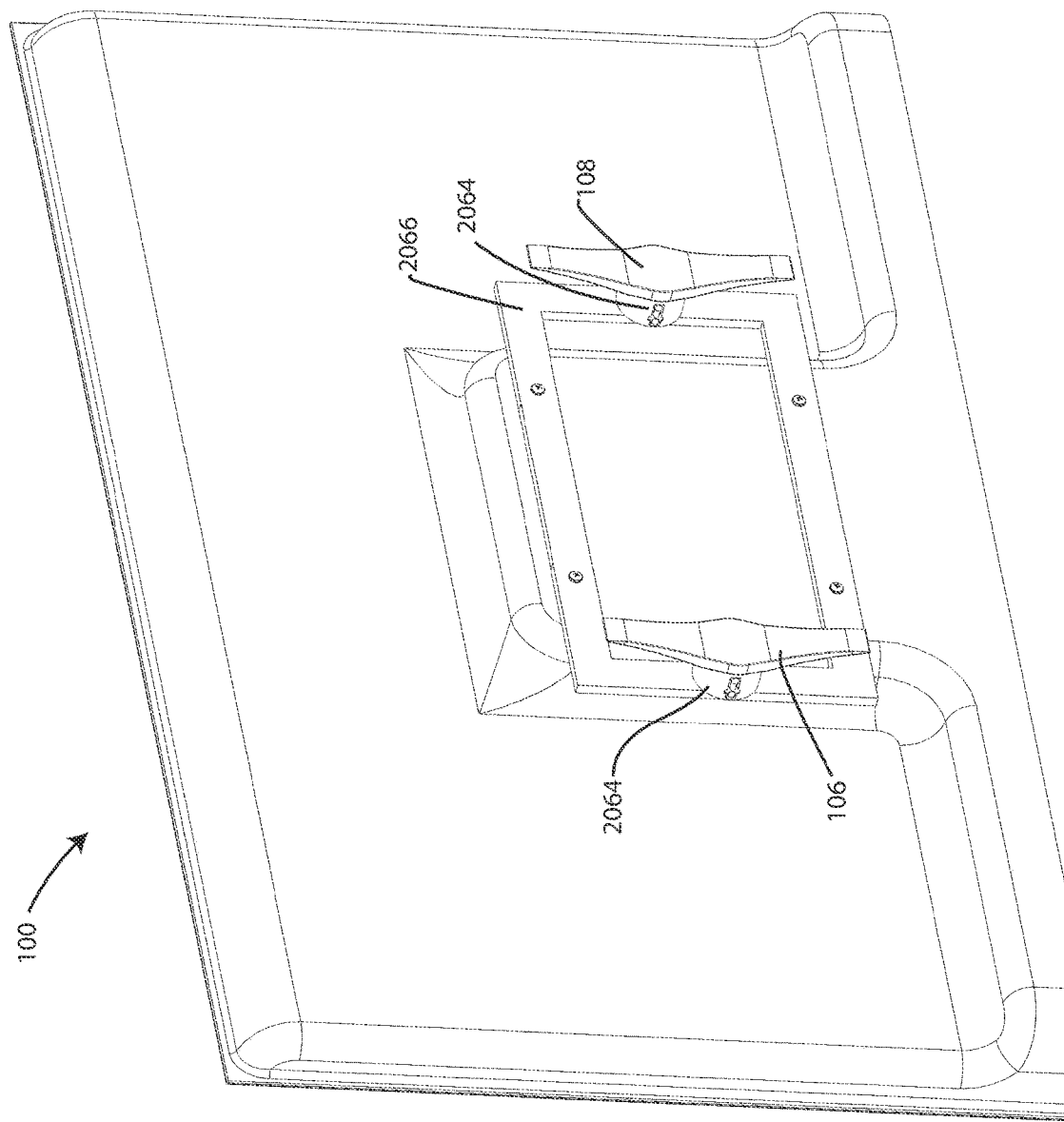
FIG. 30 is a perspective view of a display screen in a wall mount configuration in accordance with various embodiments herein.

Referring now to FIG. 30, a perspective view of a display screen 102 in a wall mount configuration is shown in accordance with various embodiments herein. FIG. 30 shows a display screen system 100 with the stand elements 106, 108 coupled to the display screen 102 in the wall mount configuration. As will be discussed in FIGS. 32-34, the stand elements 106, 108 can be retained or held by wall mount elements 1554, 1556 to mount the display screen 102 on a wall or vertical stand.

In the wall mount configuration, the first stand element 106 and the second stand element 108 can be coupled to the back surface 220 of the display screen 102. In some embodiments, the first stand element 106 and the second stand element 108 can be coupled to adapters 2064. The adapters 2064 can be coupled to the wall mount bracket 2066. The wall mount bracket 2066 can be coupled to the back surface 220 of the display screen 102, such as with connectors in the VESA mount apertures 2168 defined by the back surface 220. Utilizing the VESA mount apertures 2168 can prevent the need for creating new holes in the display screen. The wall mount bracket 2066 can connect to the VESA mount apertures 2168 and provide desired mounting locations for the adapters 2064.

Figure 31:
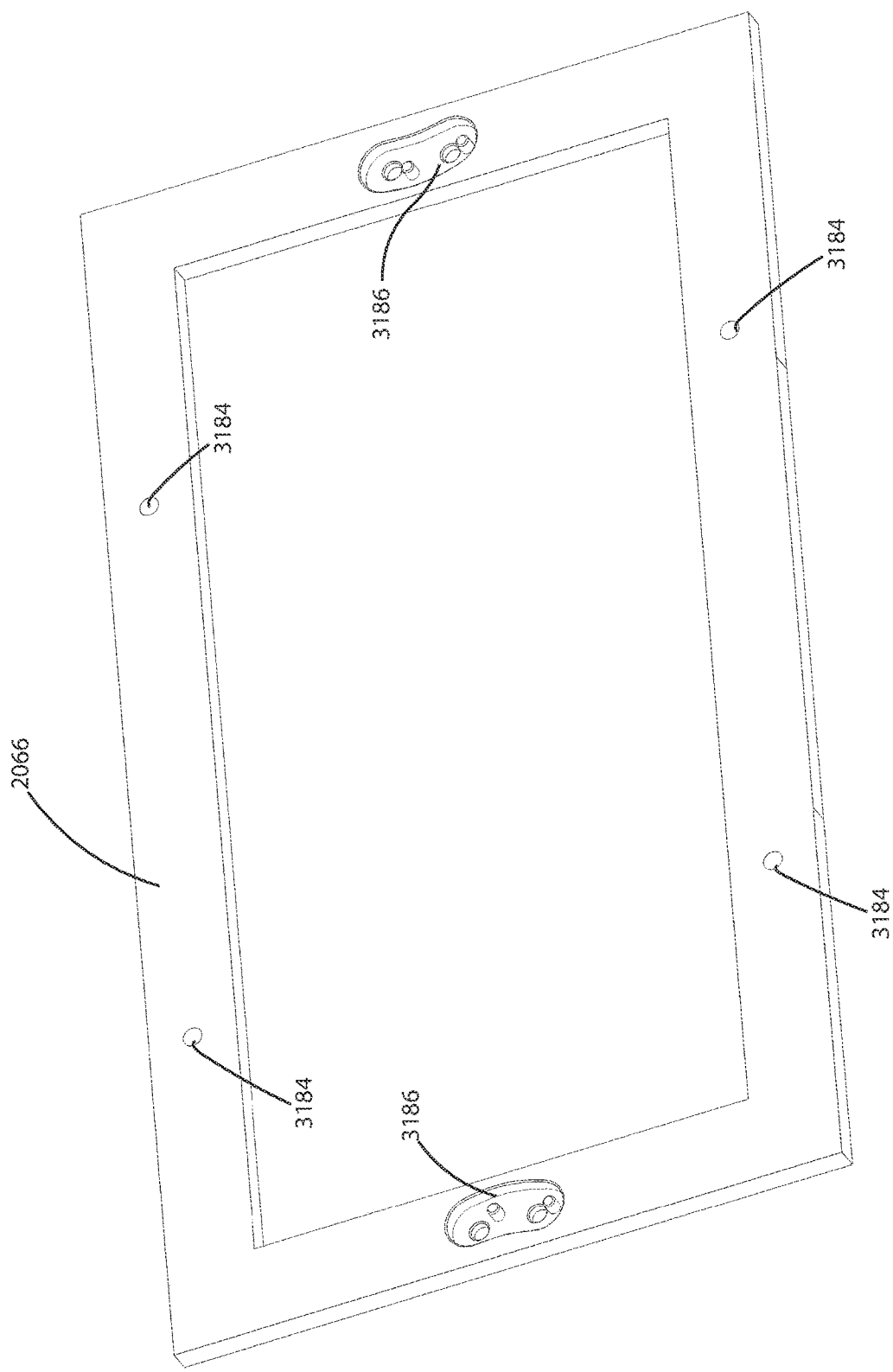
FIG. 31 is a perspective view of a wall mount bracket in accordance with various embodiments herein.

Referring now to FIG. 31, a perspective view of a wall mount bracket 2066 is shown in accordance with various embodiments herein. A wall mount 1553 can include a wall mount bracket 2066. The wall mount bracket 2066 can define one or more VESA mount connection apertures 3184. The wall mount bracket 2066 also define one or more adapter recesses 3186 configured to mate with an adapter projection 2265 to couple an adapter with the wall mount bracket 2066.

Figure 32:
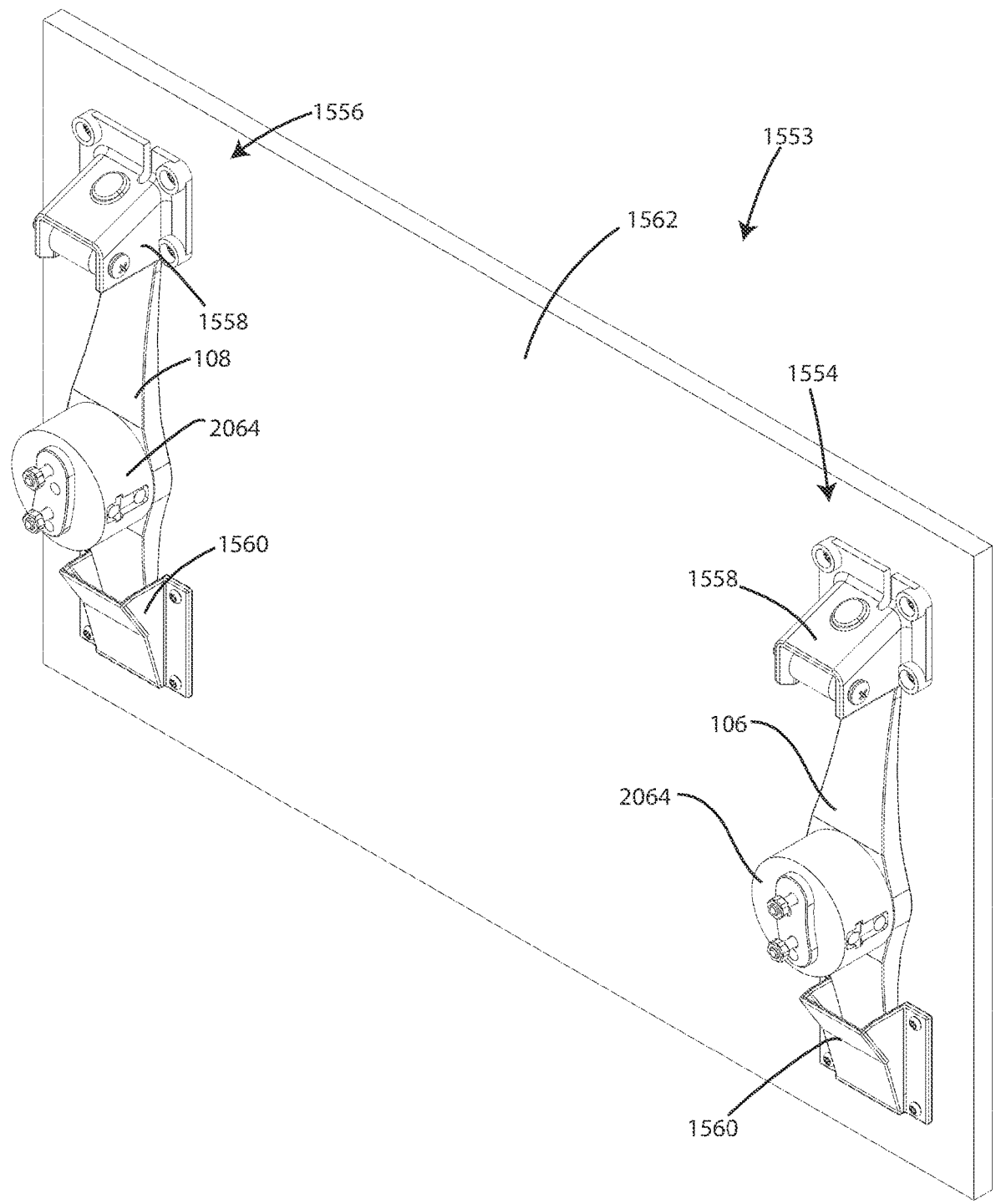
FIG. 32 is a perspective view of a wall mount configuration without the display screen in accordance with various embodiments herein.
Figure 33:
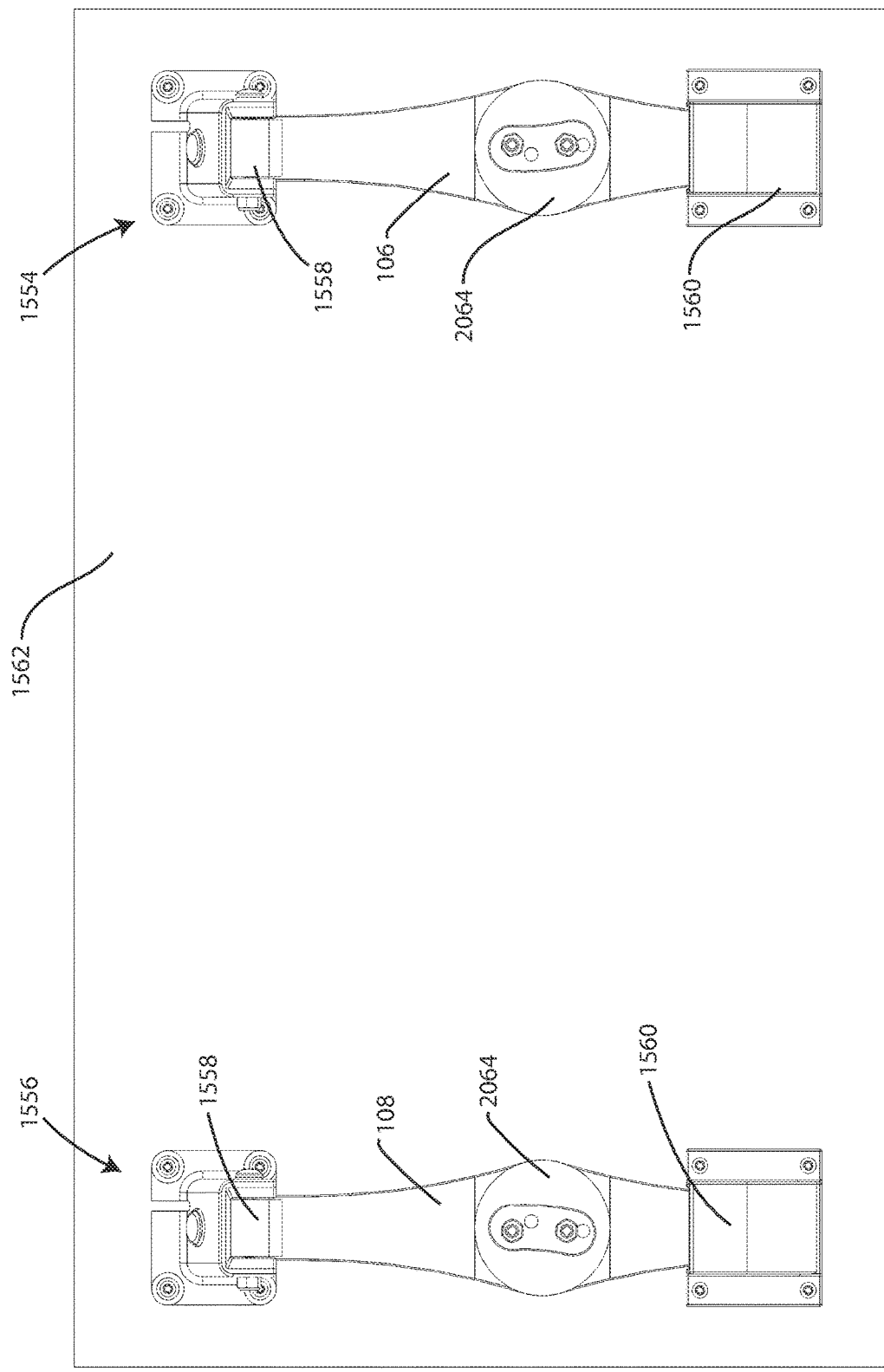
FIG. 33 is a front view of the wall mount configuration shown in FIG. 32 in accordance with various embodiments herein.
Figure 34:
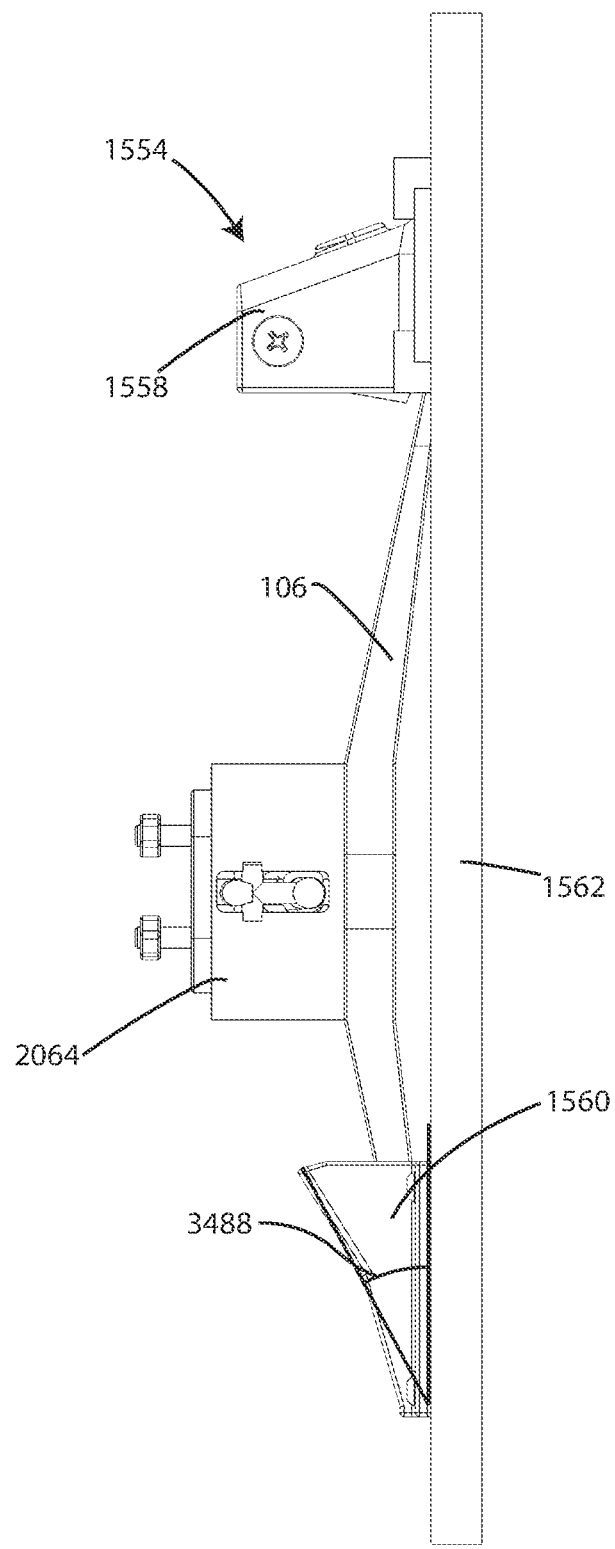
FIG. 34 is a side view of the wall mount configuration shown in FIG. 32 in accordance with various embodiments herein.

Referring now to FIG. 32, a perspective view of the wall mount configuration (without the display screen 102 for clarity) is shown in accordance with various embodiments herein. FIG. 33 shows a front view of the wall mount configuration in accordance with various embodiments herein. FIG. 34 shows a side view of the wall mount configuration in accordance with various embodiments herein. A display screen system 100 includes a display screen (not shown in these views), a first stand element 106, and a second stand element 108. The display screen system 100 can also include an adapter 2064 for each stand element 106, 108. In some embodiments, the adapters 2064 can be directly coupled to the display screen 102. In other embodiments, the adapters 2064 can be coupled to a wall mount bracket 2066 (not shown in these views for clarity) as discussed in FIGS. 30-31.

The display screen system 100 can include a wall mount 1553. The wall mount 1553 includes a first wall mount element 1554 and a second wall mount element 1556. The first wall mount element 1554 includes a top receiving clamp 1558 and a bottom receiving cup 1560. Similarly, the second wall mount element 1556 includes a top receiving clamp 1558 and a bottom receiving cup 1560.

In various embodiments, the bottom receiving cup 1560 configured to receive the second end 634 of a stand element and the top receiving clamp 1558 is configured to receive and hold/retain the first end 632 of the stand element. FIG. 32 shows a wall or surface 1562 which the first and second wall mount elements 1554, 1556 can be coupled to.

In various embodiments, to couple the display screen 102 to the wall or surface 1562, the second end 634 of each of the stand elements 106, 108 can be inserted into one of the bottom receiving cups 1560. The bottom receiving cups 1560 can be configured to support the display screen 102. The display screen 102 can then be rotated relative to the wall or surface 1562 to move the first ends 632 of the stand elements 106, 108 into the top receiving clamps 1558. In some embodiments, the top receiving clamps 1558 can be spring-loaded clamps. The clamps can retain or hold the first ends 632 of the stand elements 106, 108, such as to prevent the display screen 102 from moving away from the wall or surface 1562. In various embodiments, the clamp of the first wall mount element 1554 can include a pull release configured to release the clamp, and the clamp of the second wall mount element 1556 can include a pull release configured to release the clamp.

Referring now to FIG. 34, an angle 3488 is shown. The angle 3488 can represent an angle of the display screen 102 relative to the wall 1562. In some embodiments, the display screen 102 having the second ends 634 of the stand elements 106, 108 inserted into the bottom receiving cups 1560 can be supported at an angle 3488 prior to the first ends 632 being retained by the top receiving clamps 1558. In some embodiments, the angle 3488 can be at least 1° and not more than 45°, or at least 20° and not more than 40°, such as 30°.

In some embodiments, in the final mounted position, with the first ends 632 being held by the top receiving clamps 1558, the display screen 102 can be parallel with the wall 156. In other embodiments, in the final mounted position, the display screen 102 can form an angle 3488 between the display screen 102 and the wall 1562, such as to accommodate the display screen 102 being mounted in a position in which it is above most users. When the display screen 102 is mounted above most users, the display screen 102 can be rotated downwards such that the users have a better view of the front display surface 104. In such embodiments, the angle 3488 can be at least 1° and not more than 55°. In some embodiments, a spacer can be inserted between the top receiving clamps 1558 and the wall 1562 to allow for the display screen 102 to be angled relative to the wall 1562. In some embodiments, the clamping element within the top receiving clamps 1558 can be adjusted to allow for the display screen 102 to be angled relative to the wall 1562.

Various embodiments disclosed herein include a display screen system 100 which can include two stand elements 106, 108. The stand elements 106, 108 can be easily coupled to recesses defined by the display screen or to adapters 2064 positioned on the display screen 102 to arrange the display screen in the desired configuration, such as the table top configuration or the wall mount configuration. The stand elements 106, 108 can be coupled to the bottom surface 222 of the display screen 102 in the table top configuration. The stand elements 106, 108 can be coupled to the back surface 220 of the display screen 102 in the wall mount configuration. The stand elements 106, 108 can be coupled to a wall mount to hang the display screen 102 on a wall.

Figure 35:
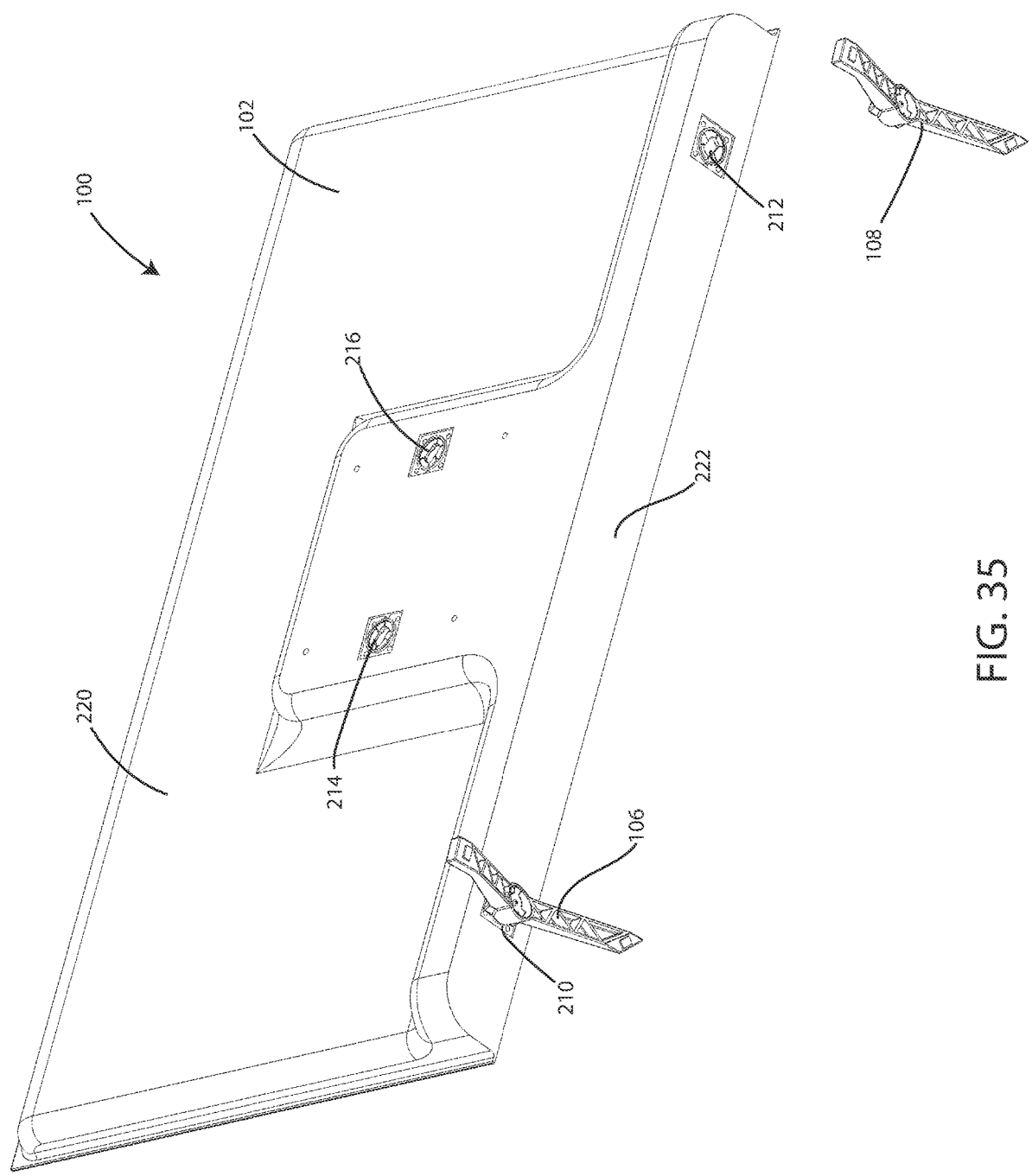
FIG. 35 is a perspective view of a display screen with two stand elements in accordance with various embodiments herein.

In reference now to FIG. 35, a perspective view of the display screen system 100 is shown in accordance with various embodiments herein. The display screen system 100 can include a display screen 102 and one or more stand elements 106, 108. The display screen 102 can include a front display surface 104, a back surface 220, and a bottom surface 222. In various embodiments, the display screen 102 can define one or more recesses on the back surface or the bottom surface. In various embodiments, the display screen 102 can include one or more adapter connection locations on the back surface or the bottom surface.

In some embodiments, the display screen 102 can include two recesses or two adapter connection locations on the back surface 220 and two recesses or two adapter connection locations on the bottom surface 222, such as shown in FIG. 35. In some embodiments, the display screen 102 can include twice as many recesses or adapter connection locations as stand elements 106, 108.

In various embodiments, each of the adapters 2064 can each define a recess 210, 212, 214, 216 configured for at least a portion of a connection element 218 of the stand element 106, 108. In various embodiments, the connection element 218 can include a projection 3690 extending from the stand element 106, 108, which can be configured to be inserted into a recess of an adapter 2064. In various embodiments, the projection 3690 can be "T" shaped. In other embodiments, the projection 3690 can have a star shape, a square shape, a rectangular shape, or another shape with radial symmetry. The stand element 106, 108 can be rotated with the projection within the recess to couple the stand element 106, 108 to the adapter 2064. In some embodiments, the projection 3690 can be rotated at least 30 degrees inside the receiving cavity 3692. In some embodiments, the projection 3690 can be rotated at least 45 degrees, 60 degrees, 90 degrees, or 120 degrees.

Figure 36:
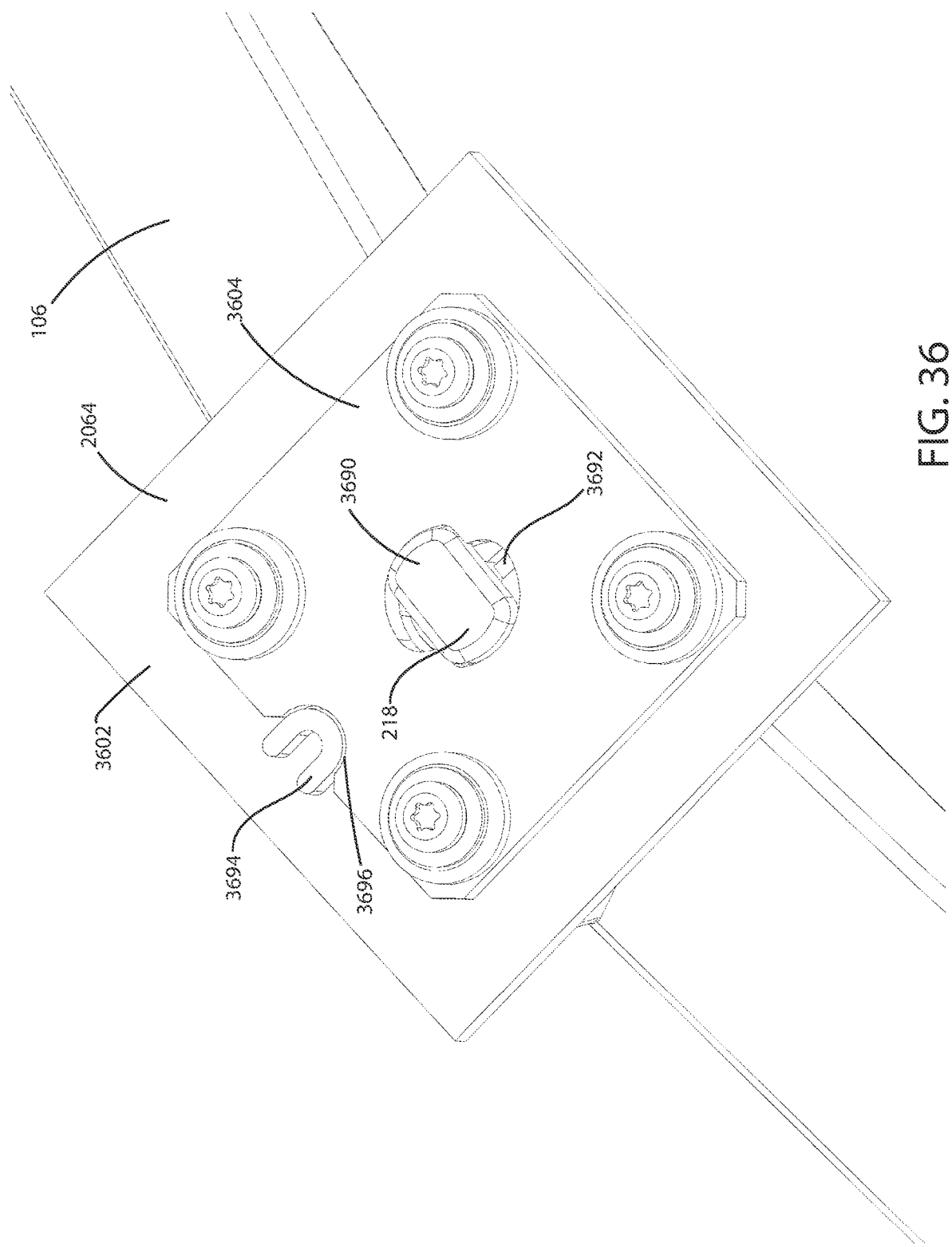
FIG. 36 is a perspective view of a stand element coupled with an adapter in accordance with various embodiments herein.
Figure 37:
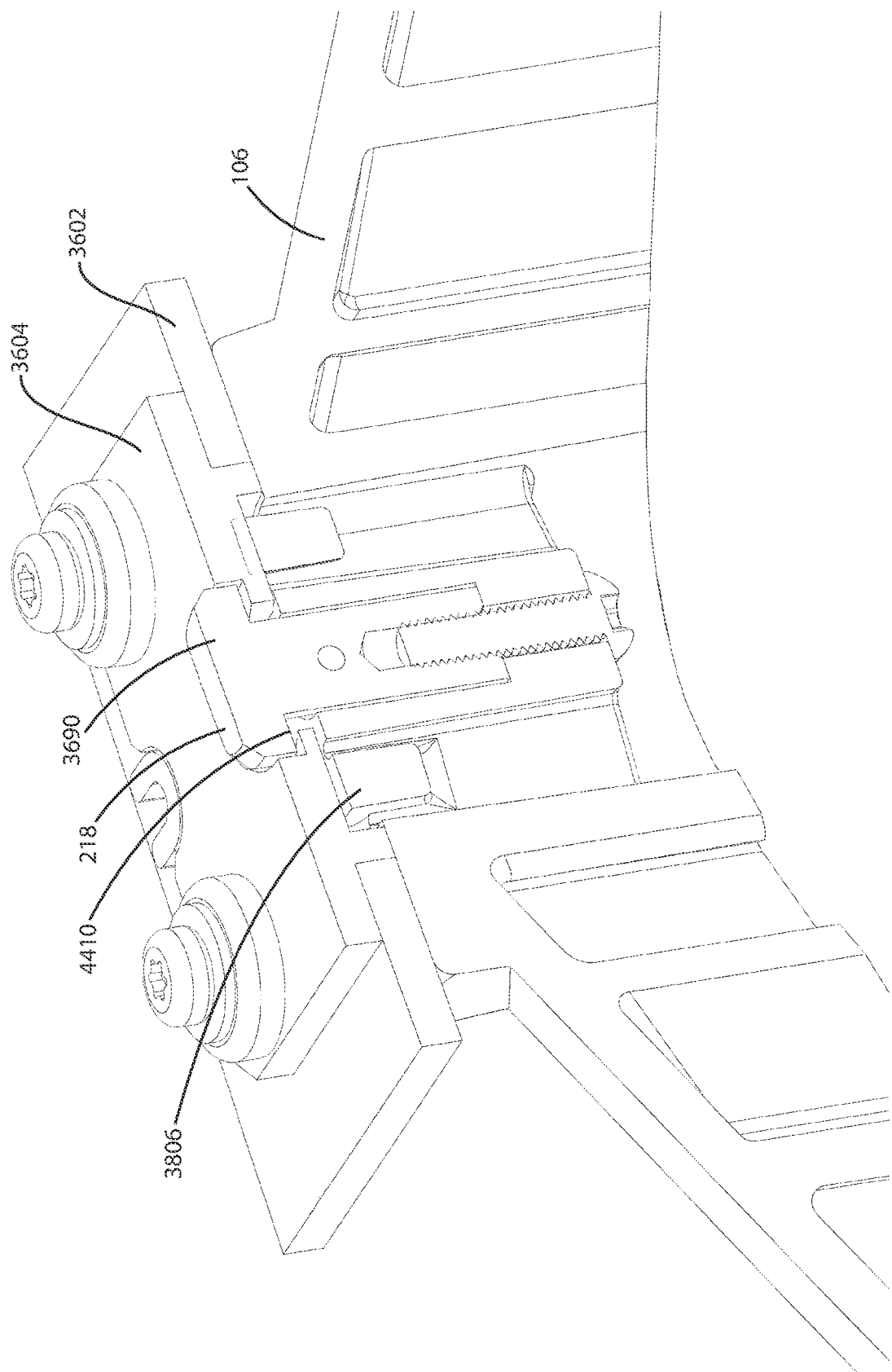
FIG. 37 is a cross-sectional view of the stand element coupled with the adapter shown in FIG. 36 in accordance with various embodiments herein.

FIG. 36 shows a perspective view of a connection between and adapter 2064 and a stand element 106 in accordance with various embodiments. FIG. 37 shows a cross-sectional view of the connection between the adapter 2064 and the stand element 106 shown in FIG. 36. It should be understood that the adapter 2064 is coupled to a display screen 102, such as shown in FIG. 35. However, the display screen 102 is not shown in FIGS. 36 and 37 for clarity.

In various embodiments, the connection element 218 can include a projection 3690. The projection 3690 can be at least partially disposed within a receiving cavity 3692 of the adapter 2064. In various embodiments, the projection 3690 can be inserted into the receiving cavity 3692 and rotated into a locked position, such that the stand element 106 cannot be separated from the adapter 2064 without first rotating the projection 3690 in the opposite direction to an unlocked position.

In various embodiments, the adapter 2064 can include an inner portion 3604 and an outer portion 3602. The inner portion 3604 can face or be located towards the display screen. The outer portion 3602 can be located towards the stand element 106, 108. In some embodiments, the outer portion 3602 can include an alignment projection 3694 and the inner portion 3604 can define an alignment recess 3696. In some embodiments, the alignment projection 3694 and the alignment recess 3696 can be U-shaped, such as shown in FIG. 36. The alignment projection 3694 and the alignment recess 3696 can ensure that the inner portion 3604 and the outer portion 3602 are aligned properly with each other.

Figure 38:
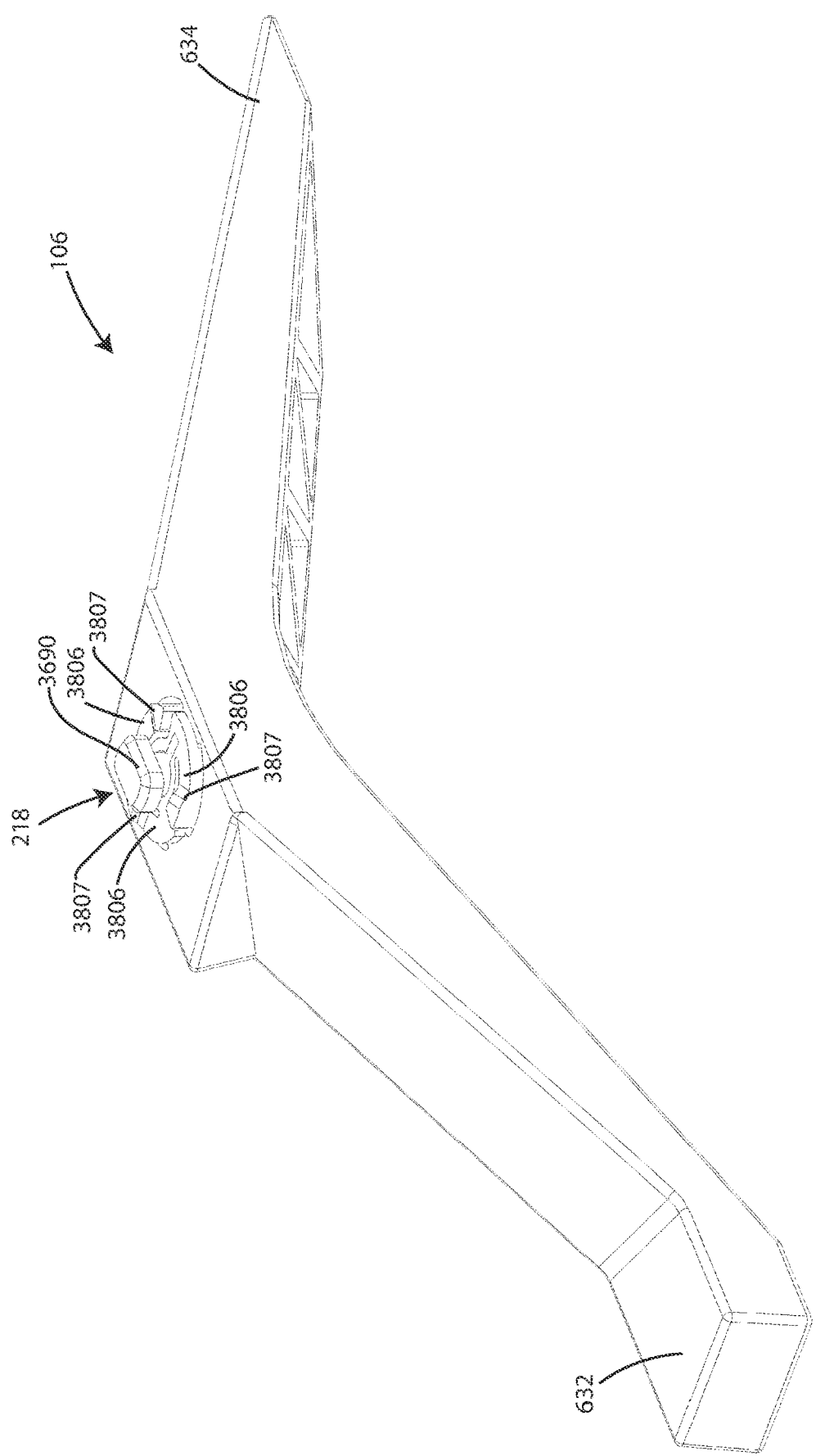
FIG. 38 is a perspective view of a stand element in accordance with various embodiments herein.
Figure 39:
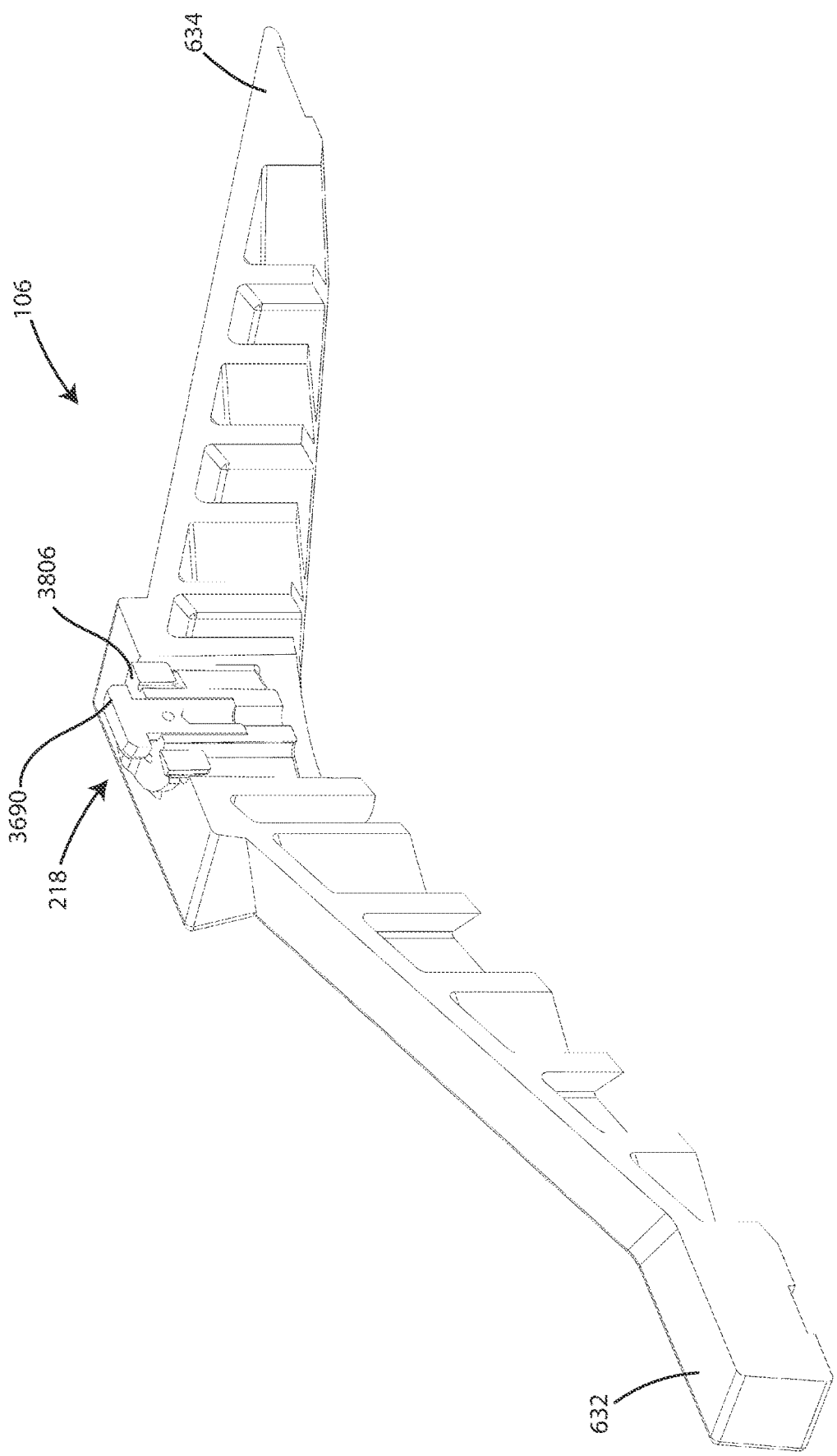
FIG. 39 is a cross-sectional view of the stand element shown in FIG. 38 in accordance with various embodiments herein.

FIG. 38 shows a perspective view of a stand element 106 in accordance with various embodiments herein. FIG. 39 shows a cross-sectional view of the stand element 106 shown in FIG. 38. FIGS. 38 and 39 show the stand element 106 can include one or more ramp arms 3806 that can each include a sloped boss feature 3807. The ramp arms 3806 can be configured to align with the sloped portions 4410 on the inner portion 3604 as the stand element 106, 108 is rotated relative to the adapter 2064. The ramp arms 3806 can be configured to pull the stand element 106, 108 closer to the adapter 2064 as the stand element 106, 108 is rotated. The connection between the stand element 106, 108 and the adapter 2064 can include a compression fit, such that as the stand element 106, 108 is rotated, the ramp arms 3806 are compressed and the connection is tightened.

The stand element 106, 108 can include a first end 632 and a second end 634. The connection element 218 can be disposed between the first end 632 and the second end 634.

Figure 40:
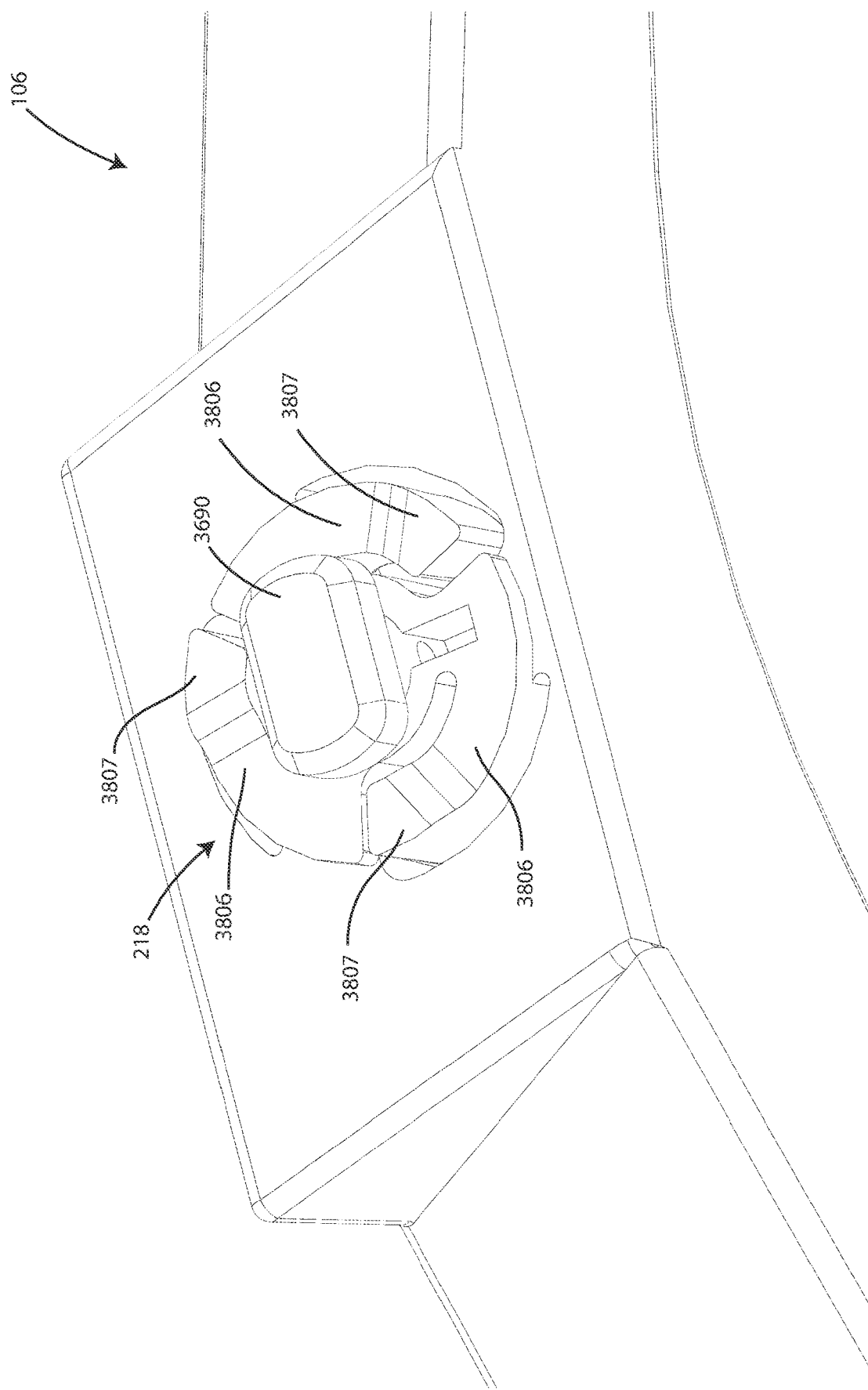
FIG. 40 is a perspective view of a connection element of a stand element in accordance with various embodiments herein.

FIG. 40 shows a portion of a stand element 106 in accordance with various embodiments. The connection element 218 can include one or more spiral arms 3806 that are ramped or sloped. The arms 3806 can ramp up onto bosses in the sloped portions 4410 on the inner portion 3604. In some embodiments, the connection element 218 can include one arm, two arms, three arms, four arms, five arms, or six arms. In various embodiments, the distal end of each arm 3806 can include a sloped boss feature 3807.

Figure 41:
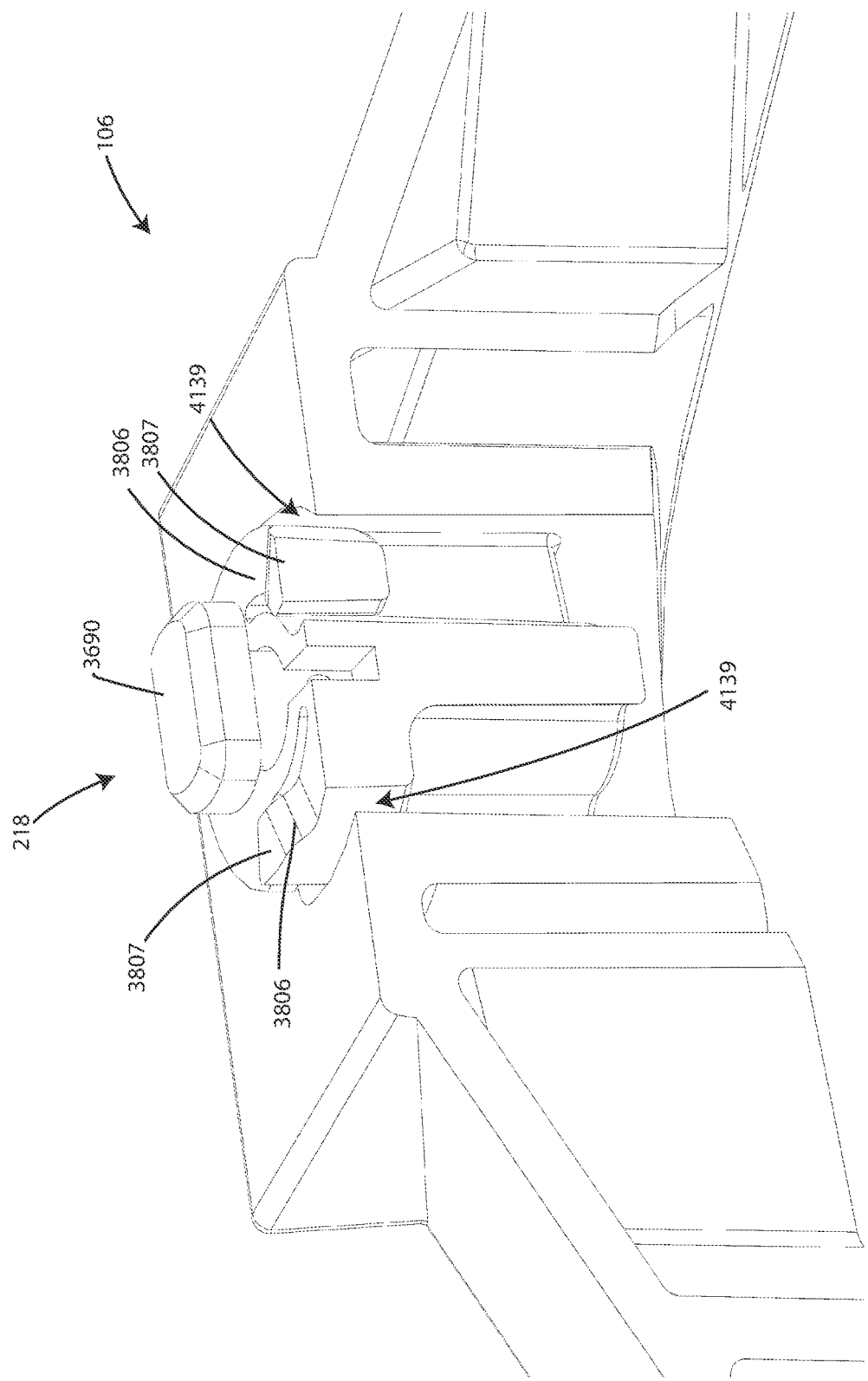
FIG. 41 is a cross-sectional view of the connection element shown in FIG. 40 in accordance with various embodiments herein.

FIG. 41 shows a cross-sectional view of the portion of the stand element 106 shown in FIG. 40. The spiral arms 3806 can be thin, such that gaps 4139 can be defined between the arms 3806 and other portions of the stand element. The arms 3806 can flex downward as the stand element 106 is rotated into place as the arms 3806 ride on the sloped portions 4410 of the inner portion 3604. Spring force of the arms 3806 can provide tension and allow for tolerances in assembly but the connection between the stand element 106 and the adapter 2064 can remain tight and secure.

Figure 42:
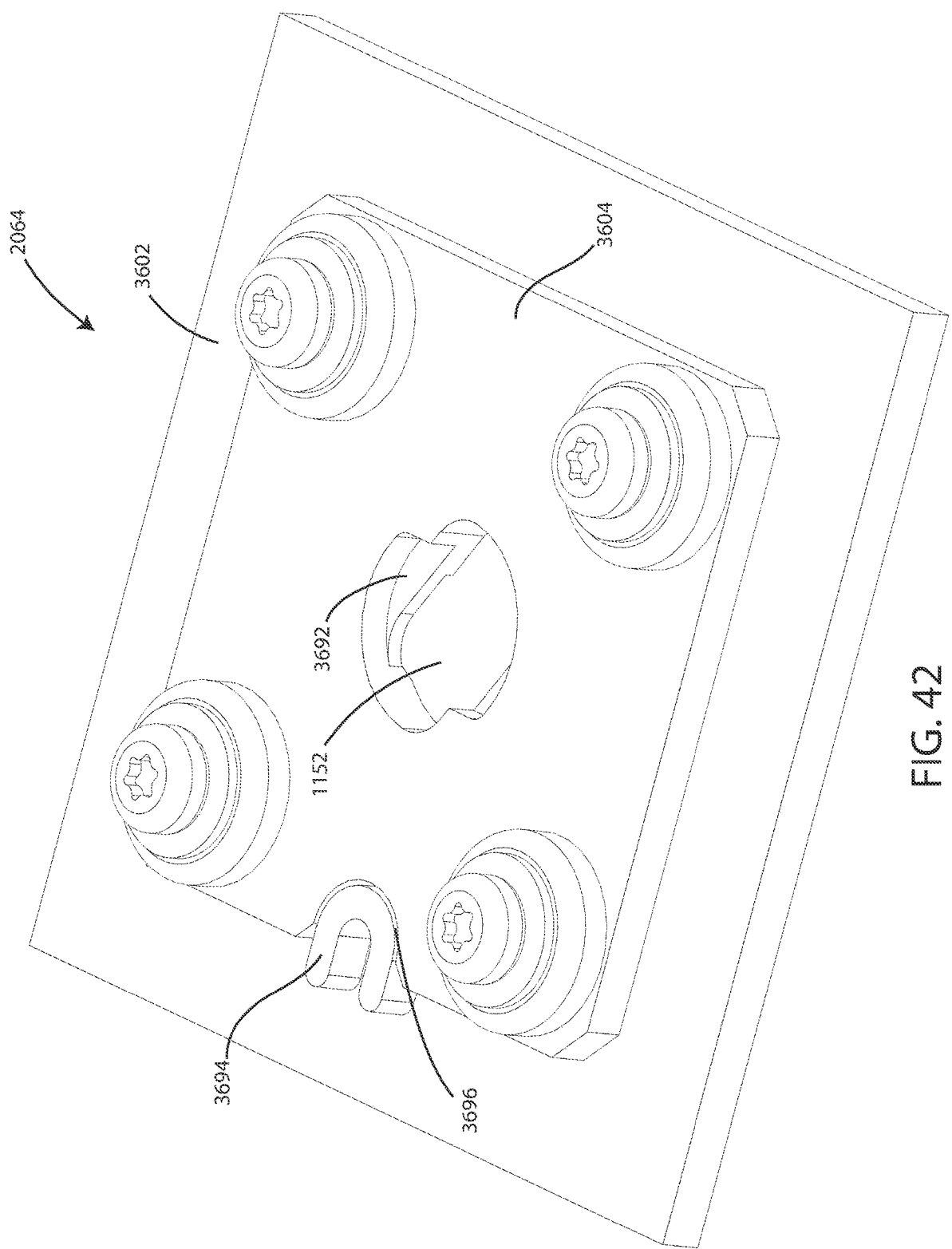
FIG. 42 is a perspective view of an adapter in accordance with various embodiments herein.

FIG. 42 shows a perspective view of the adapter 2064 in accordance with various embodiments herein. In some embodiments, the inner portion 3604 and the outer portion 3602 can be a plate like elements. In some embodiments, the inner portion 3604 and the outer portion 3602 can be coupled together by one or more coupling elements 4308, such as screws or bolts.

The outer portion 3602 can include an alignment projection 3694 on the inside surface of the outer portion 3602. The inner portion 3604 can define an alignment recess 3696. The alignment projection 3694 can be inserted in the alignment recess 3696, such as to ensure the inner portion 3604 and the outer portion 3602 are aligned properly during assembly.

The recess 1152 can further define a receiving cavity 3692 configured to receive the projection 3690 from the connection element 218. The receiving cavity 3692 can have a cross-sectional area that is larger than the area of the opening to the recess 1152, such that the projection 3690 can be inserted into the cavity 3692 through the opening and the projection 3690 can be rotated within the cavity 3692 to couple the stand element 106 to the adapter 2064.

FIG. 43 shows an exploded view of an adapter 2064 in accordance with various embodiments herein. In some embodiments, the inner portion 3604 can be coupled to the outer portion 3602 by a plurality of coupling elements 4308, such as two, three, four, five, or six coupling elements 4308. In some embodiments, the alignment recess 3696 can have a different shape, size, or shape and size from the recesses for the coupling elements 4308 to ensure that an assembler does not insert a coupling element 4308 into the alignment recess 3696.

Figure 44:
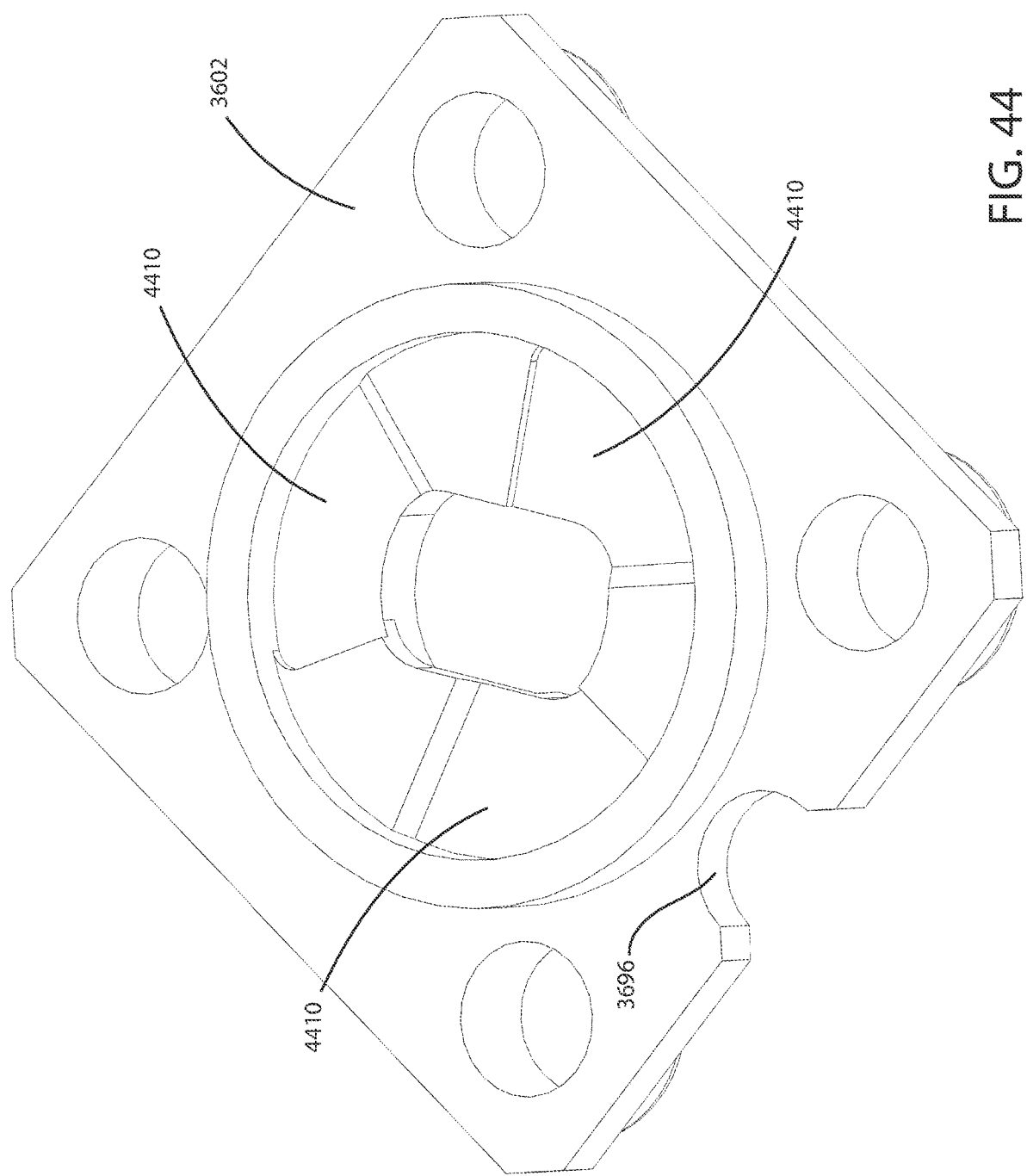
FIG. 44 is a perspective view of a portion of an adapter in accordance with various embodiments herein.

FIG. 44 shows a perspective view of an outer surface of the inner portion 3604 of an adapter 2064 in accordance with various embodiments herein. FIG. 44 shows the sloped portions 4410. The sloped portions 4410 can be aligned with the arms 3806 of the connection element 218. The sloped portions 4410 can create compression as the stand element 106 is rotated.

Figure 45:
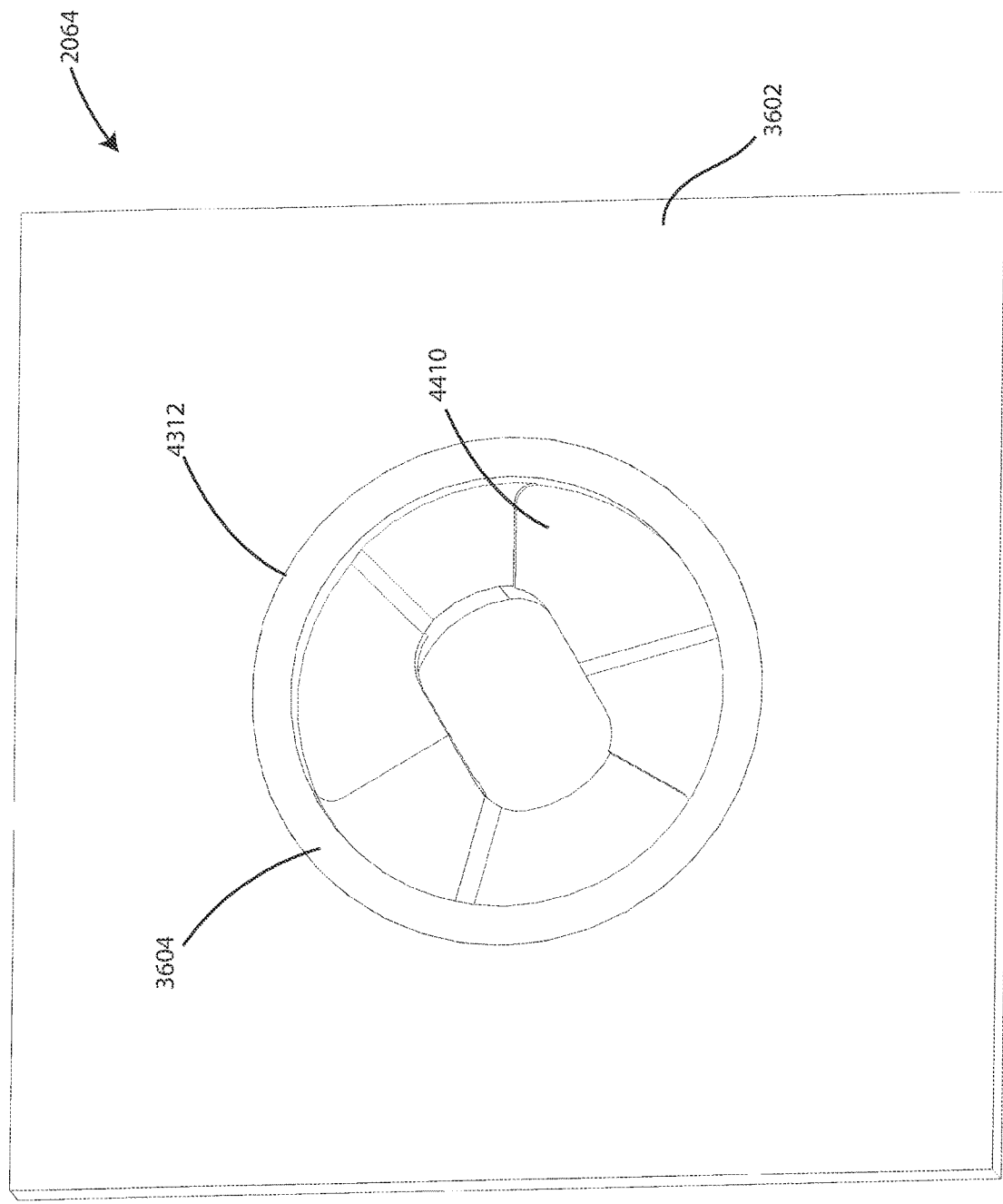
FIG. 45 is a perspective view of a portion of the adapter shown in FIG. 44 in accordance with various embodiments herein.

FIG. 45 shows a perspective view of an adapter 2064 in accordance with various embodiments herein. The outer portion 3602 can define an opening 4312, which the arms 3806 or the sloped portions 4410 can extend at least partially through such that the arms 3806 can contact the sloped portions 4410.

In some embodiments, the inner portion 3604 and the outer portion 3602 can be casted, a metal, machined metal, casted metal, or a polymer. The outer portion 3602 can define an opening 4312 exposing the sloped portions 4410. The sloped portions 4410 can include sloped or ramped sections that can be configured to tighten the connection between the stand element 106 and the adapter 2064 as the stand element 106 is rotated with the projection 3690 in the cavity 3692.

Figure 46:
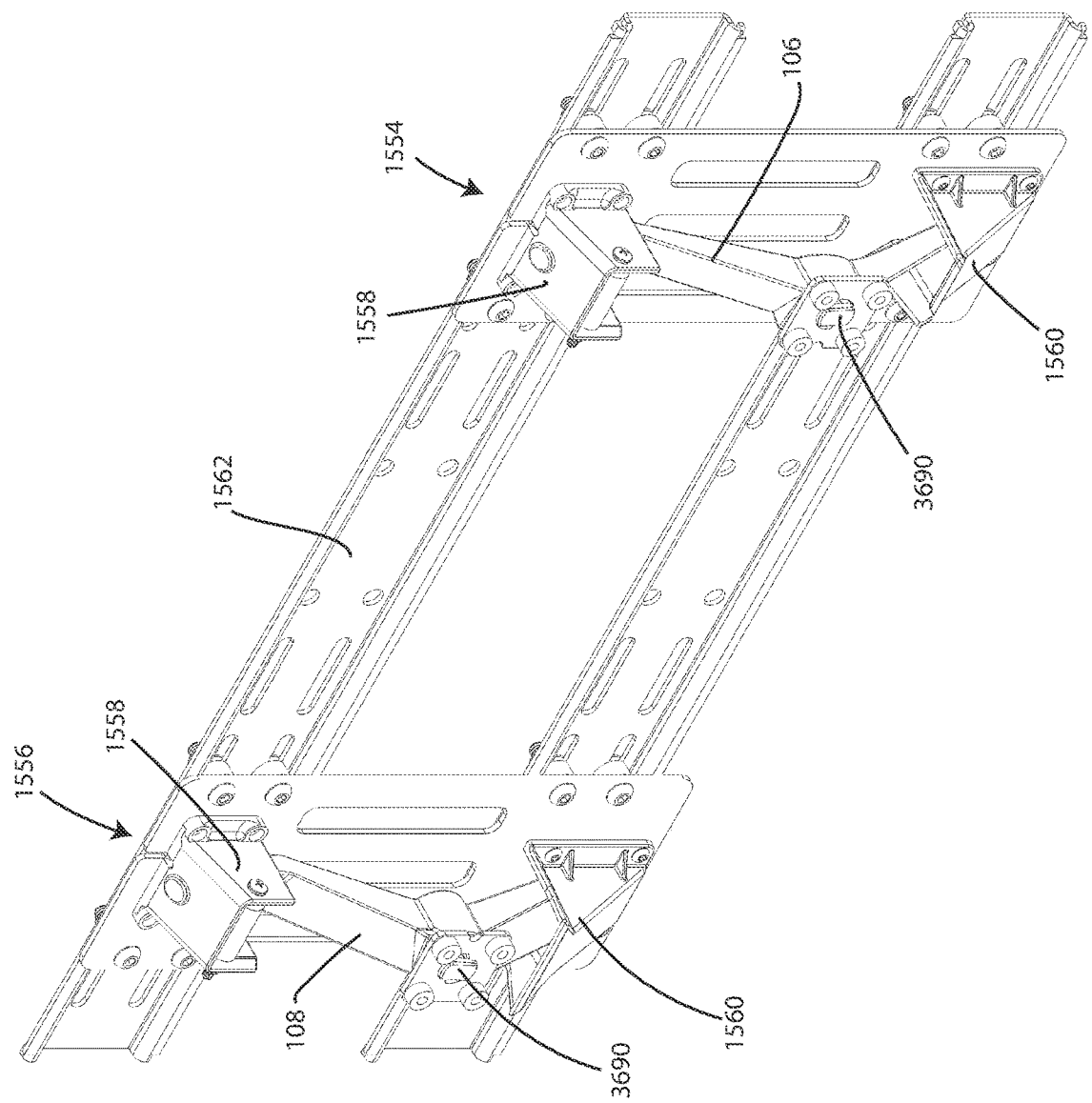
FIG. 46 is a perspective view of a wall mount configuration without the display screen in accordance with various embodiments herein.
Figure 47:
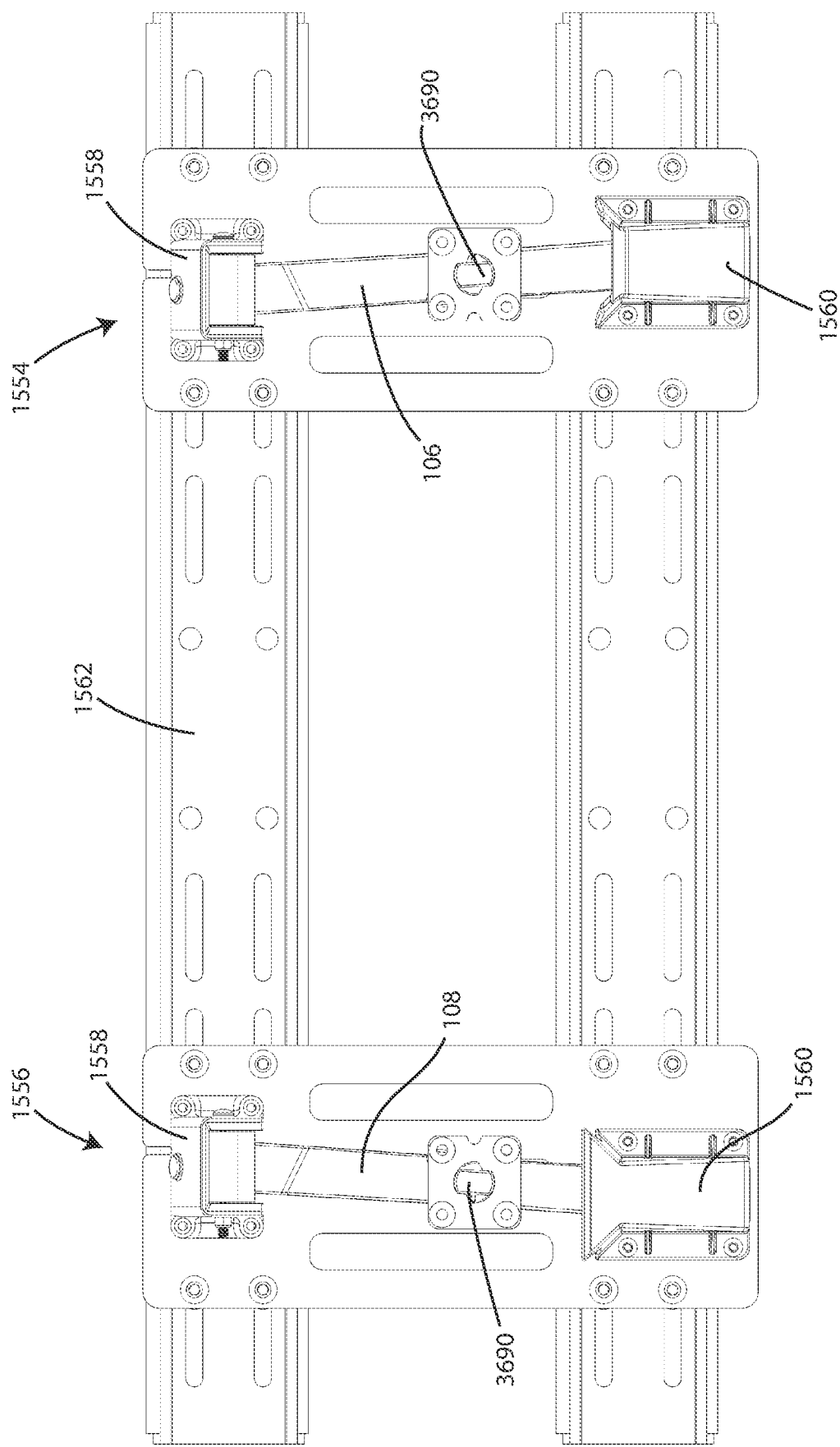
FIG. 47 is a front view of the wall mount configuration shown in FIG. 46 in accordance with various embodiments herein.
Figure 48:
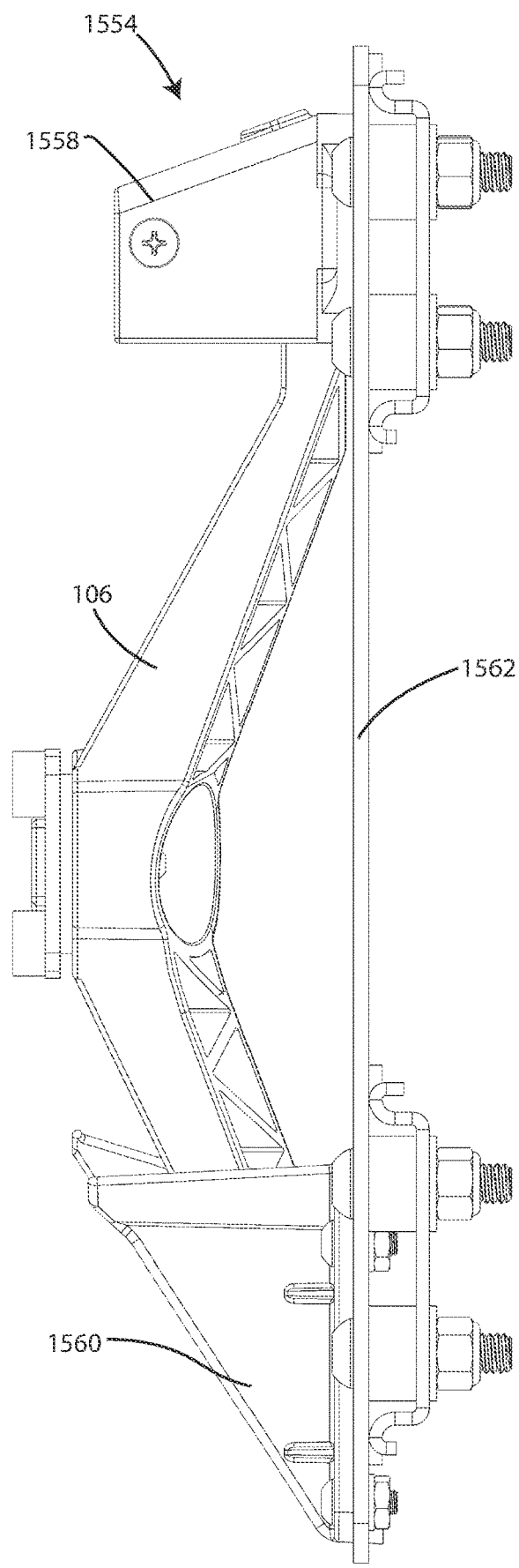
FIG. 48 is a side view of the wall mount configuration shown in FIG. 46 in accordance with various embodiments herein.

Referring now to FIG. 46, a perspective view of the wall mount configuration (without the display screen 102 for clarity) is shown in accordance with various embodiments herein. FIG. 47 shows a front view of the wall mount configuration in accordance with various embodiments herein. FIG. 48 shows a side view of the wall mount configuration in accordance with various embodiments herein. A display screen system 100 includes a display screen (not shown in these views), a first stand element 106, and a second stand element 108. The display screen system 100 can also include an adapter 2064 for each stand element 106, 108. In some embodiments, the adapters 2064 can be directly coupled to the display screen 102.

The display screen system 100 can include a wall mount 1553. The wall mount 1553 includes a first wall mount element 1554 and a second wall mount element 1556. The first wall mount element 1554 includes a top receiving clamp 1558 and a bottom receiving cup 1560. Similarly, the second wall mount element 1556 includes a top receiving clamp 1558 and a bottom receiving cup 1560.

In various embodiments, the bottom receiving cup 1560 configured to receive the second end 634 of a stand element and the top receiving clamp 1558 is configured to receive and hold/retain the first end 632 of the stand element. FIG. 46 shows a wall, surface, or bracket 1562 which the first and second wall mount elements 1554, 1556 can be coupled to.

In various embodiments, to couple the display screen 102 to the wall, surface, or bracket 1562, the second end 634 of each of the stand elements 106, 108 can be inserted into one of the bottom receiving cups 1560. The bottom receiving cups 1560 can be configured to support the display screen 102. The display screen 102 can then be rotated relative to the wall or surface 1562 to move the first ends 632 of the stand elements 106, 108 into the top receiving clamps 1558. In some embodiments, the top receiving clamps 1558 can be spring-loaded clamps. The clamps can retain or hold the first ends 632 of the stand elements 106, 108, such as to prevent the display screen 102 from moving away from the wall or surface 1562. In various embodiments, the clamp of the first wall mount element 1554 can include a pull release configured to release the clamp, and the clamp of the second wall mount element 1556 can include a pull release configured to release the clamp.

Methods

Figure 49:
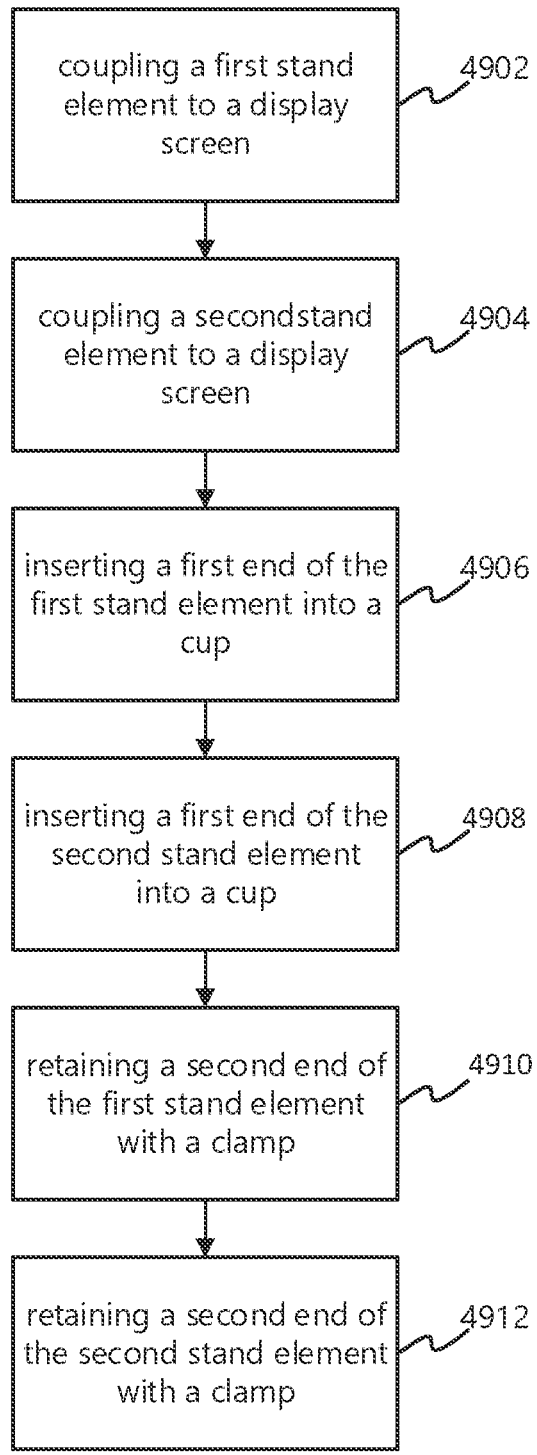
FIG. 49 is a flowchart of a method in accordance with various embodiments herein.

FIG. 49 is a flowchart of a method in accordance with various embodiments herein. In some embodiments, the method of mounting a display screen can include coupling a first stand element to the display screen by rotating a first connection element of the first stand element within a first recess on a back portion of the display screen 4902. The method can further include coupling a second stand element to the display screen by rotating a second connection element of the second stand element within a second recess on the back portion of the display screen 4904. The method can further include inserting a first end of the first stand element into a cup of a first wall mount element 4906. The method can further include inserting a first end of the second stand element into a cup of a second wall mount element 4908. The method can further include retaining a second end of the first stand element with a clamp of the first wall mount element 4910. The method can further include retaining a second end of the second stand element with a clamp of the second wall mount element 4912.

In some embodiments, the method can include releasing the second end of the first stand element from the clamp of the first wall mount; and releasing the second end of the second stand element from the clamp of the second wall mount. In some embodiments, the method can include uncoupling the first stand element and the second stand element from the display screen.

In some embodiments, the method can include coupling the first stand element to the display screen by rotating the first connection element of the first stand element within a third recess on a bottom portion of the display screen; and coupling the second stand element to the display screen by rotating the second connection element of the second stand element within a fourth recess on the bottom portion of the display screen.

Figure 50:
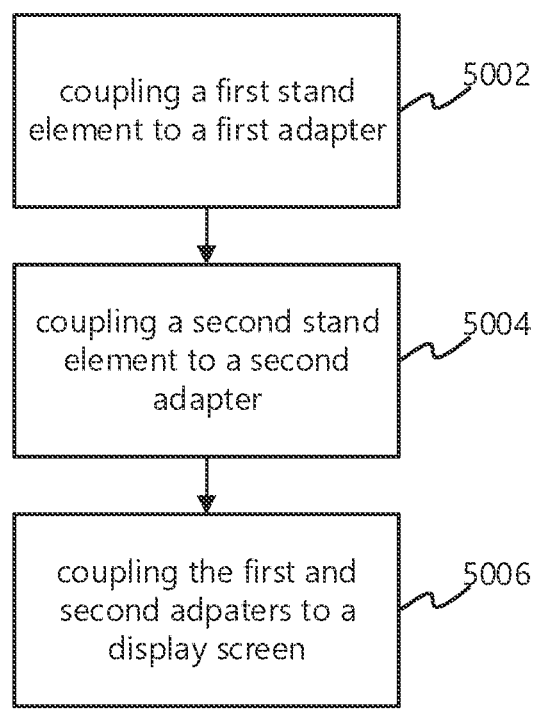
FIG. 50 is a flowchart of a method in accordance with various embodiments herein.

FIG. 50 is a flowchart of a method in accordance with various embodiments herein. In some embodiments, a method of mounting a display screen can include coupling a first stand element to a first adapter by rotating a first connection element of the first stand element within a portion of the first adapter 5002. The method can further include coupling a second stand element to second adapter by rotating a second connection element of the second stand element within a portion of the second adapter 5004. The method can further include coupling the first adapter and the second adapter to the display screen in a first configuration 5006.

In some embodiments, with the first adapter and second adapter are coupled to a back surface of the display screen in the first configuration, the method can include inserting a first end of the first stand element into a cup of a first wall mount element, inserting a first end of the second stand element into a cup of a second wall mount element, retaining a second end of the first stand element with a clamp of the first wall mount element, and retaining a second end of the second stand element with a clamp of the second wall mount element. In some embodiments, the method can include releasing the second end of the first stand element from the clamp of the first wall mount and releasing the second end of the second stand element from the clamp of the second wall mount. In some embodiments, the method can include uncoupling the first adapter and the second adapter from the display screen; and coupling the first adapter and the second adapter to the display screen in a second configuration.

Figure 51:
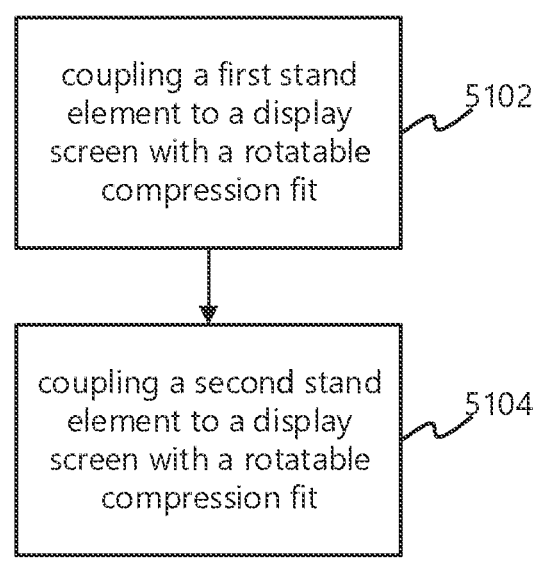
FIG. 51 is a flowchart of a method in accordance with various embodiments herein.

FIG. 51 is a flowchart of a method in accordance with various embodiments herein. In some embodiments, the method of mounting a display screen can include coupling a first stand element to a display screen with a rotatable compression fit 5102. The method can further include coupling a second stand element to the display screen with a rotatable compression fit 5104.

In some embodiments, with the first stand element and the second stand elements attached to the back surface of the display screen (a first configuration), the method can include inserting a first end of the first stand element into a cup of a first wall mount element, inserting a first end of the second stand element into a cup of a second wall mount element, retaining a second end of the first stand element with a clamp of the first wall mount element, and retaining a second end of the second stand element with a clamp of the second wall mount element. In some embodiments, the method can further include releasing the second end of the first stand element from the clamp of the first wall mount; and releasing the second end of the second stand element from the clamp of the second wall mount. In some embodiments, the method can further include uncoupling the first stand element and the second stand element from the display screen and coupling the first stand element and the second stand element to the display screen in a second configuration.

In some embodiments, in the first configuration where the first stand element and second stand element are attached to the display screen so that a first end and a second end of the first stand element are disposed below the display screen and so that a first end and a second end of the second stand element are disposed below the display screen, the method can further include standing the display screen in an upright configuration such that the first stand element and the second stand element are configured to support the display screen on a surface.

It should be understood that the method steps can take place in various orders, such as a different order than they are described and shown with reference to FIGS. 49-51. For example, the second end of the first stand element could be inserted into the first top retaining clamp prior to the first end of the second stand element being inserted into a bottom retaining cup. In another example, the adapters can be coupled to the display screen prior to the stand elements being coupled to the adapters. It should also be understood that certain steps can occur simultaneously, such as at the same time. For example, the first end of each of the stand elements can be inserted into the bottom retaining cups at the same time. In another example, the second end of each of the stand elements can be retained by the top retaining clamps at the same time.

It should be noted that, as used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

It should also be noted that, as used in this specification and the appended claims, the phrase "configured" describes a system, apparatus, or other structure that is constructed or configured to perform a particular task or adopt a particular configuration. The phrase "configured" can be used interchangeably with other similar phrases such as arranged and configured, constructed and arranged, constructed, manufactured and arranged, and the like.

All publications and patent applications in this specification are indicative of the level of ordinary skill in the art to which this invention pertains. All publications and patent applications are herein incorporated by reference to the same extent as if each individual publication or patent application was specifically and individually indicated by reference.

As used herein, the recitation of numerical ranges by endpoints shall include all numbers subsumed within that range (e.g., 2 to 8 includes 2.1, 2.8, 5.3, 7, etc.).

The headings used herein are provided for consistency with suggestions under 37 CFR 1.77 or otherwise to provide organizational cues. These headings shall not be viewed to limit or characterize the invention(s) set out in any claims that may issue from this disclosure. As an example, although the headings refer to a "Field," such claims should not be limited by the language chosen under this heading to describe the so-called technical field. Further, a description of a technology in the "Background" is not an admission that technology is prior art to any invention(s) in this disclosure. Neither is the "Summary" to be considered as a characterization of the invention(s) set forth in issued claims.

The embodiments described herein are not intended to be exhaustive or to limit the invention to the precise forms disclosed in the following detailed description. Rather, the embodiments are chosen and described so that others skilled in the art can appreciate and understand the principles and practices. As such, aspects have been described with reference to various specific and preferred embodiments and techniques. However, it should be understood that many variations and modifications may be made while remaining within the spirit and scope herein.

The invention claimed is:

1. A display screen stand system, comprising:
    a first stand element comprising a first connection element disposed between a first end of the first stand element and a second end of the first stand element; and
    a second stand element comprising a second connection element disposed between a first end of the second stand element and a second end of the second stand element;
    wherein the first connection element and the second connection element each comprise a rotatable compression fit element;
    wherein the display screen stand system is configured to be assembled in a table top configuration or a wall mount configuration;
    wherein in the table top configuration, the first stand element and the second stand element are configured to attach to a display screen so that the first and second ends of the first stand element and the first and second ends of the second stand element are disposed below a display screen to support the display screen on a surface;
    wherein in the wall mount configuration, the first stand element and the second stand element are configured to attach to the display screen such that the first and second ends of the first stand element and the first and second ends of the second stand element are disposed behind the display screen.

2. The display screen stand system of claim 1, wherein the rotatable compression fit elements of the first stand element and the second stand element are each configured to rotate at least 60 degrees.

3. The display screen stand system of claim 1, wherein the rotatable compression fit elements of the first stand element and the second stand element each comprise at least two ramp arms.

4. The display screen stand system of claim 1, wherein a longitudinal axis of the first stand element and a longitudinal axis of the second stand element are substantially parallel in the table top configuration.

5. The display screen stand system of claim 1, wherein a longitudinal axis of the first stand element and a longitudinal axis of the second stand element are not parallel in the wall mount configuration.

6. The display screen stand system of claim 1, wherein a longitudinal axis the first stand element and a longitudinal axis of the second stand element define a first plane in the table top configuration and define a second plane in the wall mount configuration; wherein the first plane is perpendicular to the second plane.

7. The display screen stand system of claim 1, further comprising a first wall mount element and a second wall mount element, wherein the first wall mount element and the second wall mount element each comprise a cup and a clamp;
    wherein the cup of the first wall mount element is configured to receive the first end of the first stand element and the clamp of the first wall mount element is configured to receive the second end of the first stand element;
    wherein the cup of the second wall mount element is configured to receive the first end of the second stand element and the clamp of the second wall mount element is configured to receive the second end of the second stand element.

8. The display screen stand system of claim 7, wherein the clamp of the first wall mount is a spring loaded clamp, and the clamp of the second wall mount is a spring loaded clamp.

9. The display screen stand system of claim 7, wherein the clamp of the first wall mount comprises a pull release, and the clamp of the second wall mount comprises a pull release.

10. A display screen stand system, comprising:
a display screen comprising a front display surface, a back surface opposite from the front display surface, a bottom surface between the back surface and the front display surface;
a first stand element comprising a first end and a second end; and
a second stand element comprising a first end and a second end;
wherein the display screen, a first stand element, and a second stand element are configured to be assembled in a table top configuration or in a wall mount configuration,
wherein in the table top configuration, the first stand element and the second stand element are configured to attach to a display screen so that the first and second ends of the first stand element and the first and second ends of the second stand element are disposed below a display screen to support the display screen on a surface;
wherein in the wall mount configuration, the first stand element and the second stand element are configured to attach to the display screen such that the first and second ends of the first stand element and the first and second ends of the second stand element are disposed behind the display screen;
wherein the first stand element and the second stand element are configured to be coupled to the display screen with a first rotatable compression fit element and a second rotatable compression fit element.

11. The display screen stand system of claim 10, wherein the first stand element and the second stand element are coupled to the bottom surface of the display screen in the table top configuration.

12. The display screen stand system of claim 10, wherein the first stand element and the second stand element are coupled to the back surface of the display screen in the wall mount configuration.

13. The display screen stand system of claim 10, wherein the first compression fit element is configured to couple the first stand element to the display screen with a rotation of at least 60 degrees, wherein the second compression fit element is configured to couple the second stand element to the display screen with a rotation of at least 60 degrees.

14. The display screen stand system of claim 10, wherein the first rotatable compression fit element comprises at least two ramped surfaces on the first stand element and the second rotatable compression fit element comprises at least two ramped surfaces on the second stand element.

15. The display screen stand system of claim 14, wherein the first rotatable compression fit element comprises at least two boss structures on the display screen and the second rotatable compression fit element comprises at least two boss structures on the display screen.

16. A method of mounting a display screen, comprising:
coupling a first stand element and a second stand element to a display screen with a rotatable compression fit element in a first configuration.

17. The method of mounting a display screen of claim 16 wherein the first stand element and second stand element are attached to a back surface of the display screen in the first configuration, further comprising:
inserting a first end of the first stand element into a cup of a first wall mount element;
inserting a first end of the second stand element into a cup of a second wall mount element;
retaining a second end of the first stand element with a clamp of the first wall mount element; and
retaining a second end of the second stand element with a clamp of the second wall mount element.

18. The method of mounting a display screen of claim 17, further comprising:
releasing the second end of the first stand element from the clamp of the first wall mount; and
releasing the second end of the second stand element from the clamp of the second wall mount.

19. The method of mounting a display screen of claim 18, further comprising:
uncoupling the first stand element and the second stand element from the display screen; and
coupling the first stand element and the second stand element to the display screen in a second configuration.

20. The method of mounting a display screen of claim 16, wherein in the first configuration, the first stand element and second stand element are attached to the display screen so that a first end and a second end of the first stand element are disposed below the display screen and so that a first end and a second end of the second stand element are disposed below the display screen, further comprising:
standing the display screen in an upright configuration such that the first stand element and the second stand element are configured to support the display screen on a surface.

* * * * *